US012585046B2

(12) United States Patent
Ma et al.

(10) Patent No.: US 12,585,046 B2
(45) Date of Patent: Mar. 24, 2026

(54) HEATABLE WINDSHIELD

(71) Applicant: Vitro Flat Glass LLC, Cheswick, PA (US)

(72) Inventors: Zhixun Ma, Richmond, CA (US); Adam D. Polcyn, Pittsburgh, PA (US); Andrew Wagner, Pittsburgh, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 0 days.

(21) Appl. No.: 18/669,912

(22) Filed: May 21, 2024

(65) Prior Publication Data

US 2024/0302574 A1 Sep. 12, 2024

Related U.S. Application Data

(63) Continuation of application No. 18/121,660, filed on Mar. 15, 2023, which is a continuation of application
(Continued)

(51) Int. Cl.
*B32B 15/04* (2006.01)
*B32B 7/025* (2019.01)
(Continued)

(52) U.S. Cl.
CPC .............. *G02B 1/116* (2013.01); *B32B 7/025* (2019.01); *B32B 17/10036* (2013.01); *B32B 17/10201* (2013.01); *B32B 17/10229* (2013.01); *B60J 3/007* (2013.01); *B60K 35/00* (2013.01); *B60K 35/60* (2024.01); *C03C 17/3639* (2013.01); *C03C 17/3649* (2013.01);
(Continued)

(58) Field of Classification Search
CPC ..................................................... C03C 17/366
USPC ........................................ 428/434, 428, 432
See application file for complete search history.

(56) References Cited

U.S. PATENT DOCUMENTS

| | | |
|---|---|---|
| 3,762,988 A | 10/1973 | Clock et al. |
| 4,287,107 A | 9/1981 | Hermann et al. |

(Continued)

FOREIGN PATENT DOCUMENTS

| | | |
|---|---|---|
| CH | 339575 A | 6/1959 |
| CN | 1944545 A | 4/2007 |

(Continued)

OTHER PUBLICATIONS

Gu et al., "Ultrasmooth and Thermally Stable Silver-Based Thin Films with Subnanometer Roughness by Aluminum Doping", ACSNANO, 2014, pp. 10343-10351, vol. 8:10.
(Continued)

*Primary Examiner* — Lauren R Colgan
(74) *Attorney, Agent, or Firm* — The Webb Law Firm

(57) ABSTRACT

A coated article includes a substrate, a first dielectric layer, a first metallic layer, a first primer layer, a second dielectric layer, a second metallic layer, a second primer layer, a third dielectric layer, a third primer layer, a third metallic layer, and a fourth dielectric layer. The total combined thickness of the metallic layers is at least 30 nanometers and no more than 60 nanometers. The article can have a sheet resistance of less than 0.85Ω/□, a visible light reflectance of not more than 10%, and a visible light transmittance of at least 70%.

13 Claims, 26 Drawing Sheets

Related U.S. Application Data

No. 16/830,829, filed on Mar. 26, 2020, now abandoned.

(60) Provisional application No. 62/976,645, filed on Feb. 14, 2020, provisional application No. 62/825,326, filed on Mar. 28, 2019.

(51) Int. Cl.

| | |
|---|---|
| *B32B 17/06* | (2006.01) |
| *B32B 17/10* | (2006.01) |
| *B60J 3/00* | (2006.01) |
| *B60K 35/00* | (2006.01) |
| *B60K 35/60* | (2024.01) |
| *C03C 17/36* | (2006.01) |
| *C23C 14/00* | (2006.01) |
| *G02B 1/116* | (2015.01) |
| *G02B 5/28* | (2006.01) |
| *G02B 27/01* | (2006.01) |
| *H05B 3/84* | (2006.01) |
| *H05B 3/86* | (2006.01) |
| *B60K 35/23* | (2024.01) |
| *B60K 35/40* | (2024.01) |

(52) U.S. Cl.

CPC ........ *C03C 17/366* (2013.01); *C23C 14/0036* (2013.01); *G02B 5/285* (2013.01); *G02B 27/0101* (2013.01); *H05B 3/84* (2013.01); *H05B 3/86* (2013.01); *B32B 2250/05* (2013.01); *B60K 35/23* (2024.01); *B60K 35/425* (2024.01); *C03C 2218/155* (2013.01); *G02B 2027/012* (2013.01); *H05B 2203/013* (2013.01)

(56) References Cited

U.S. PATENT DOCUMENTS

| | | | |
|---|---|---|---|
| 4,379,040 A | 4/1983 | Gillery | |
| 4,466,562 A | 8/1984 | DeTorre | |
| 4,606,800 A | 8/1986 | Hart et al. | |
| 4,610,771 A | 9/1986 | Gillery | |
| 4,671,155 A | 6/1987 | Goldinger | |
| 4,716,086 A | 12/1987 | Gillery et al. | |
| 4,746,347 A | 5/1988 | Sensi | |
| 4,792,536 A | 12/1988 | Pecoraro et al. | |
| 4,806,220 A | 2/1989 | Finley | |
| 4,834,857 A | 5/1989 | Gillery | |
| 4,861,669 A | 8/1989 | Gillery | |
| 4,898,789 A | 2/1990 | Finley | |
| 4,898,790 A | 2/1990 | Finley | |
| 4,900,633 A | 2/1990 | Gillery | |
| 4,902,580 A | 2/1990 | Gillery | |
| 4,902,581 A | 2/1990 | Criss | |
| 4,920,006 A | 4/1990 | Gillery | |
| 4,938,857 A | 7/1990 | Gillery | |
| 4,948,677 A | 8/1990 | Gillery | |
| 5,028,759 A | 7/1991 | Finley | |
| 5,030,593 A | 7/1991 | Heithoff | |
| 5,030,594 A | 7/1991 | Heithoff | |
| 5,059,295 A | 10/1991 | Finley | |
| 5,112,693 A | 5/1992 | Gillery | |
| 5,240,886 A | 8/1993 | Gulotta et al. | |
| 5,328,768 A | 7/1994 | Goodwin | |
| 5,385,872 A | 1/1995 | Gulotta et al. | |
| 5,393,593 A | 2/1995 | Gulotta et al. | |
| 5,492,750 A | 2/1996 | Shumaker, Jr. et al. | |
| 5,619,059 A | 4/1997 | Li et al. | |
| 5,653,903 A | 8/1997 | Pinchok, Jr. et al. | |
| 5,792,559 A | 8/1998 | Heithoff et al. | |
| 5,796,055 A | 8/1998 | Benson, Jr. et al. | |
| 5,821,001 A | 10/1998 | Arbab et al. | |
| 5,923,471 A | 7/1999 | Wood, II et al. | |

| | | | |
|---|---|---|---|
| 6,164,777 A | 12/2000 | Li et al. | |
| 6,495,251 B1 | 12/2002 | Arbab et al. | |
| 6,838,181 B1 | 1/2005 | Degand | |
| 7,537,677 B2 | 5/2009 | Lu et al. | |
| 7,588,829 B2 | 9/2009 | Finley et al. | |
| 7,972,713 B2* | 7/2011 | Fleury | B32B 17/10174 |
| | | | 427/419.7 |
| 8,003,235 B2 | 8/2011 | Gagliardi et al. | |
| 8,025,957 B2* | 9/2011 | Thiel | C03C 17/36 |
| | | | 359/360 |
| 8,203,073 B2 | 6/2012 | Lu et al. | |
| 8,221,833 B2 | 7/2012 | Veerasamy et al. | |
| 8,420,162 B2 | 4/2013 | Blacker et al. | |
| 8,440,037 B2 | 5/2013 | Dietrich et al. | |
| 8,440,310 B2 | 5/2013 | Ferreira et al. | |
| 8,497,014 B2 | 7/2013 | Unquera et al. | |
| 8,686,319 B2 | 4/2014 | Thiel | |
| 8,722,210 B2 | 5/2014 | Jun et al. | |
| 8,974,864 B2 | 3/2015 | Finley et al. | |
| 9,003,697 B2 | 4/2015 | Giesen et al. | |
| 9,012,044 B2 | 4/2015 | Bright | |
| 9,028,930 B2 | 5/2015 | Reymond et al. | |
| 9,034,459 B2 | 5/2015 | Condo et al. | |
| 9,062,366 B2 | 6/2015 | An et al. | |
| 9,067,822 B2 | 6/2015 | Maschwitz et al. | |
| 9,126,861 B2 | 9/2015 | Hashizume et al. | |
| 9,140,832 B2 | 9/2015 | Medwick et al. | |
| 9,199,874 B2 | 12/2015 | Peter et al. | |
| 9,296,649 B2 | 3/2016 | Okawa et al. | |
| 9,449,899 B2 | 9/2016 | Briere et al. | |
| 9,556,068 B2 | 1/2017 | Buhay et al. | |
| 9,599,752 B2* | 3/2017 | Laurent | C03C 17/3644 |
| 9,606,272 B2 | 3/2017 | Sandre-Chardonnal | |
| 9,630,875 B2 | 4/2017 | McSporran et al. | |
| 9,709,717 B2 | 7/2017 | Hevesi et al. | |
| 9,738,561 B2 | 8/2017 | Butz et al. | |
| 9,758,426 B2 | 9/2017 | Kabagambe et al. | |
| 9,776,915 B2 | 10/2017 | Wuillaume et al. | |
| 9,822,033 B2 | 11/2017 | Imran et al. | |
| 9,919,960 B2 | 3/2018 | Mahieu | |
| 9,932,267 B2* | 4/2018 | Polcyn | C03C 17/3618 |
| 9,950,951 B2 | 4/2018 | Sternchuss et al. | |
| 9,971,194 B2 | 5/2018 | Brecht et al. | |
| 10,040,719 B2* | 8/2018 | Eby | G02B 1/11 |
| 10,078,409 B2 | 9/2018 | Veerasamy et al. | |
| 10,099,958 B2 | 10/2018 | Brossard et al. | |
| 10,294,149 B2 | 5/2019 | Wagner et al. | |
| 10,345,499 B2* | 7/2019 | Medwick | C03C 17/36 |
| 10,358,384 B2 | 7/2019 | Polcyn et al. | |
| 10,453,580 B1 | 10/2019 | Wilson et al. | |
| 10,472,881 B2 | 11/2019 | Kuhn et al. | |
| 10,479,724 B2 | 11/2019 | Ganjoo et al. | |
| 10,502,878 B2 | 12/2019 | Ding et al. | |
| 10,539,726 B2* | 1/2020 | Wagner | C03C 17/3644 |
| 10,562,813 B2 | 2/2020 | Roquiny et al. | |
| 10,597,324 B2 | 3/2020 | Miki Yoshida et al. | |
| 10,618,252 B2 | 4/2020 | Wagner et al. | |
| 10,654,747 B2 | 5/2020 | Polcyn et al. | |
| 10,654,749 B2 | 5/2020 | Polcyn et al. | |
| 11,078,718 B2* | 8/2021 | Fisher | C03C 17/3689 |
| 11,402,557 B2* | 8/2022 | Wagner | G02B 1/14 |
| 12,060,751 B2* | 8/2024 | Paul | C03C 17/3649 |
| 2002/0119337 A1 | 8/2002 | Maze et al. | |
| 2002/0172775 A1 | 11/2002 | Buhay et al. | |
| 2003/0031842 A1 | 2/2003 | Marietti et al. | |
| 2003/0180547 A1 | 9/2003 | Buhay et al. | |
| 2003/0228476 A1 | 12/2003 | Buhay et al. | |
| 2003/0228484 A1 | 12/2003 | Finley et al. | |
| 2004/0023038 A1 | 2/2004 | Buhay et al. | |
| 2004/0023080 A1 | 2/2004 | Buhay et al. | |
| 2004/0106017 A1 | 6/2004 | Buhay et al. | |
| 2005/0095449 A1 | 5/2005 | Yanagisawa et al. | |
| 2005/0123772 A1 | 6/2005 | Coustet | |
| 2005/0258030 A1 | 11/2005 | Finley et al. | |
| 2006/0029754 A1 | 2/2006 | Medwick et al. | |
| 2007/0020465 A1* | 1/2007 | Thiel | C03C 17/3673 |
| | | | 428/428 |
| 2007/0082219 A1 | 4/2007 | Fleury et al. | |
| 2007/0224432 A1 | 9/2007 | Morimoto et al. | |

(56) References Cited

U.S. PATENT DOCUMENTS

| | | | |
|---|---|---|---|
| 2008/0174872 A1 | 7/2008 | Morimoto et al. | |
| 2008/0187692 A1 | 8/2008 | Roquiny et al. | |
| 2008/0311389 A1 | 12/2008 | Roquiny et al. | |
| 2009/0015909 A1* | 1/2009 | Fleury | C03C 17/36 359/360 |
| 2009/0047466 A1 | 2/2009 | German et al. | |
| 2009/0176086 A1 | 7/2009 | Martin et al. | |
| 2011/0236663 A1* | 9/2011 | Fleury | C03C 17/3676 428/428 |
| 2011/0236715 A1* | 9/2011 | Polcyn | C03C 17/36 428/209 |
| 2011/0262726 A1 | 10/2011 | Knoll et al. | |
| 2011/0268941 A1* | 11/2011 | Fischer | G02B 5/282 204/192.1 |
| 2012/0087005 A1 | 4/2012 | Reymond et al. | |
| 2012/0177900 A1* | 7/2012 | Laurent | C03C 17/3639 428/213 |
| 2013/0057951 A1 | 3/2013 | Hevesi et al. | |
| 2013/0059137 A1 | 3/2013 | Hevesi et al. | |
| 2014/0072784 A1 | 3/2014 | Dietrich et al. | |
| 2014/0193616 A1 | 7/2014 | Polcyn et al. | |
| 2014/0272353 A1 | 9/2014 | Ding et al. | |
| 2014/0272453 A1 | 9/2014 | Polcyn et al. | |
| 2015/0004383 A1 | 1/2015 | Sandre-Chardonnal | |
| 2015/0125635 A1 | 5/2015 | O'Connor et al. | |
| 2016/0031750 A1 | 2/2016 | Ridealgh et al. | |
| 2016/0077320 A1 | 3/2016 | Okada et al. | |
| 2016/0122236 A1 | 5/2016 | Mahieu et al. | |
| 2016/0223729 A1* | 8/2016 | Medwick | C03C 17/3681 |
| 2016/0244361 A1 | 8/2016 | Rondeau et al. | |
| 2017/0059753 A1* | 3/2017 | Wagner | G02B 5/22 |
| 2017/0144927 A1 | 5/2017 | Caillet et al. | |
| 2017/0144928 A1 | 5/2017 | Caillet et al. | |
| 2017/0183255 A1 | 6/2017 | Walther et al. | |
| 2017/0198518 A1 | 7/2017 | Caillet et al. | |
| 2017/0341977 A1 | 11/2017 | Polcyn et al. | |
| 2018/0029930 A1 | 2/2018 | Lorenzzi et al. | |
| 2018/0194677 A1 | 7/2018 | Lorenzzi et al. | |
| 2018/0208503 A1 | 7/2018 | Hagen et al. | |
| 2018/0244567 A1 | 8/2018 | Singh et al. | |
| 2018/0291499 A1 | 10/2018 | Koch | |
| 2018/0323401 A1 | 11/2018 | Sato et al. | |
| 2019/0039947 A1 | 2/2019 | Fisher et al. | |
| 2019/0055157 A1 | 2/2019 | Hagen et al. | |
| 2019/0064516 A1 | 2/2019 | Wagner et al. | |
| 2019/0242178 A1 | 8/2019 | Fisher et al. | |
| 2019/0330101 A1 | 10/2019 | Cid Aguilar et al. | |
| 2019/0352224 A1 | 11/2019 | You et al. | |
| 2020/0009836 A1 | 1/2020 | Braley | |
| 2020/0055285 A1 | 2/2020 | Compoint et al. | |
| 2020/0085170 A1 | 3/2020 | Yang et al. | |
| 2020/0096687 A1 | 3/2020 | Ma et al. | |
| 2020/0101700 A1 | 4/2020 | Lee et al. | |
| 2020/0165163 A1 | 5/2020 | Mizutani et al. | |
| 2020/0307167 A1* | 10/2020 | Ma | C03C 17/3644 |
| 2020/0310014 A1 | 10/2020 | Bard et al. | |
| 2020/0359467 A1 | 11/2020 | Farreyrol et al. | |
| 2021/0017811 A1 | 1/2021 | Han | |
| 2021/0053869 A1 | 2/2021 | Dehner et al. | |
| 2021/0122670 A1 | 4/2021 | Misra et al. | |
| 2022/0119305 A1 | 4/2022 | Fisher et al. | |

FOREIGN PATENT DOCUMENTS

| | | |
|---|---|---|
| DE | 102014002965 A1 | 2/2015 |
| JP | H10182192 A1 | 7/1998 |
| JP | 2016540723 A | 12/2016 |
| WO | 0037384 A1 | 6/2000 |
| WO | 2015101744 A1 | 7/2015 |
| WO | 20180480038 A1 | 3/2018 |
| WO | 2018117801 A1 | 6/2018 |
| WO | 2018160616 A2 | 9/2018 |
| WO | 2019004199 A1 | 1/2019 |
| WO | 2019053741 A1 | 3/2019 |
| WO | 2019074901 A1 | 4/2019 |
| WO | 2019120849 A1 | 6/2019 |
| WO | 2019120850 A1 | 6/2019 |
| WO | 2019143597 A1 | 7/2019 |
| WO | 2019145256 A1 | 8/2019 |
| WO | 2019151431 A1 | 8/2019 |
| WO | 2019190419 A2 | 10/2019 |
| WO | 2019190420 A2 | 10/2019 |
| WO | 2019207241 A1 | 10/2019 |
| WO | 2019216661 A1 | 11/2019 |
| WO | 2020058061 A1 | 3/2020 |

OTHER PUBLICATIONS

Kawamura et al., "Thermally stable very thin Ag films for electrodes", J. Vac. Sci. Technol. A., 2009, pp. 975-978, vol. 27:4.

Han et al., "Improved conductivity and mechanism of carrier transport in zinc oxide with embedded silver layer" J. of Appl. Phys. 2008, pp. 1-9 , vol. 103, No. 013708.

Liu et al., "A new method for fabricating ultrathin metal films as scratch-resistant flexible transparent electrodes". Journal of Materiomics, 2015, pp. 52-59, vol. 1, No. (1).

Sharma et al., "High-performance radiation stable ZnO/Ag/ZnO multilayer transparent conductive electrode" Solar Energy Materials and Solar Cells, 2017, pp. 122-131, vol. 169.

Zhang et al., "Effects of Nb Surface and Ti Interface Layers on Thermal Stability and Electrical Resistivity of Ag Thin Films", Jpn. J. Appl. Phys., 2012, pp. 1-7, vol. 51.

Zhang et al., "Optimization of Surface Layers for Suppression of Agglomeration in Ag Films" Jpn. J. Appl. Phys., 2013, pp. 1-13, vol. 52, No. 7.

Ries, "Silver thin films: Improving the efficiency of low-E coatings by employing different seed layers", 2015, pp. 1-199.

"Technical Information: What you need to know to Build With Light®", Guardian Glass LLC, 2019, pp. 1-36.

"Types of Glass", Guardian.com.

\* cited by examiner

10

84

32

30

28

20

12

10

84

44

32

28

46

42

30

20

12

| | Substrate | 2.1 Solarphire | 2.1 clear |
|---|---|---|---|
| | Cover | 1.6 clear | 1.6 clear |
| Coating | | (Å) | (Å) |
| | Base | 472.02 | 471.26 |
| | Ag | 121.02 | 136.60 |
| | BC | 724.68 | 776.70 |
| | Ag | 133.32 | 138.55 |
| | TC | 789.41 | 760.69 |
| | Ag | 142.10 | 129.20 |
| | Top | 365.98 | 378.77 |
| | Al60 | 200.00 | 160.00 |
| | Si85 | 350.00 | 220.00 |
| | Ag total nm | 39.64 | 40.44 |
| T | LTA | 71.22 | 70.82 |
| | a | -0.85 | -2.49 |
| | b | 2.79 | 3.45 |
| Rg | L | 40.89 | 40.60 |
| | a | -6.21 | -2.20 |
| | b | 0.57 | -4.20 |
| Rf | L | 42.59 | 40.56 |
| | a | -8.49 | -2.46 |
| | b | 1.52 | -1.86 |
| Rg (44) | L | 41.93 | 41.89 |
| | a | -3.82 | -1.99 |
| | b | 3.50 | 1.49 |
| Rf(44) | L | 43.36 | 41.96 |
| | a | -5.72 | -3.36 |
| | b | 2.80 | 4.18 |
| Rg (60) | L | 49.27 | 49.30 |
| | a | -0.34 | 0.59 |
| | b | 4.23 | 3.01 |
| Rf (60) | L | 50.28 | 49.37 |
| | a | -1.57 | -0.89 |
| | b | 3.12 | 5.08 |
| 8deg | Rg SOS | 2.03 | 2.81 |
| 8deg | Rf SOS | 1.75 | 3.02 |
| 60deg | Rg SOS | 1.47 | 1.52 |
| 60deg | Rf SOS | 1.62 | 1.30 |
| | Tsolar | 31.59 | 30.99 |
| | R1solar | 41.82 | 41.32 |
| | R2solar | 49.87 | 44.58 |
| | Rs (Ω/□) | 0.808 | 0.789 |
| Solar Factor | TTs (<0.4) | 0.357 | 0.362 |

FIG. 16

|  | PVB | 0.7mm |
|  | Substrate | |
|  | Cover | |
|  | | (Å) |
|  | Base | 307.57 |
|  | | 85.12 |
|  | BC | 757.95 |
|  | | 85.32 |
|  | TC | 717.07 |
|  | | 76.42 |
|  | Top | 274.35 |
|  | Al60 | 200.00 |
|  | Si85 | 350.00 |
|  | Total Ag (nm) | 24.69 |
| T | L* | 91.12 |
|  | a | -2.39 |
|  | b | 3.55 |
| Rg | L | 32.77 |
|  | a | -0.48 |
|  | b | -0.09 |
| Rf | L | 32.47 |
|  | a | 0.66 |
|  | b | -0.50 |
|  | LTA | 78.75 |
| Rg (44) | L | 35.33 |
|  | a | -1.10 |
|  | b | 0.33 |
| Rf (44) | L | 35.19 |
|  | a | -0.63 |
|  | b | 0.78 |
| Rg (60) | L | 44.51 |
|  | a | -1.67 |
|  | b | 0.91 |
| Rf (60) | L | 44.46 |
|  | a | -1.67 |
|  | b | 1.50 |
| 8deg | Rf 400 | 4.87 |
| 8deg | Rf 700 | 7.30 |
| 60deg | Rf 400 | 9.69 |
| 60deg | Rf 700 | 16.82 |
|  | Tsolar | 44.02 |
|  | R1solar | 28.54 |
|  | R2solar | 30.96 |
|  | Rs (Ω/□) | 1.45 |

FIG. 17

|  |  | Glass only | Glass only | Glass only | Glass only | Glass only |
|---|---|---|---|---|---|---|
|  | Substrate | 2.1 clear | 2.1 clear | 2.1 clear | 2.1 clear | 2.1 clear |
| 3 Ag | Cover | 2.1 Solex | Atlantica SGN-C4 | Caribia | Azuria | Tintex-P-L |
| Unit |  | (Å) | (Å) | (Å) | (Å) | (Å) |
| Structure | Base | 186.49 | 186.42 | 186.49 | 186.49 | 218.18 |
|  | Ag | 84.25 | 84.25 | 84.25 | 84.25 | 87.64 |
|  | BC | 672.34 | 670.47 | 671.68 | 671.68 | 681.11 |
|  | Ag | 88.87 | 88.90 | 88.90 | 88.90 | 88.30 |
|  | C | 747.61 | 746.34 | 747.61 | 747.61 | 739.45 |
|  | Ag | 80.90 | 80.92 | 80.93 | 80.93 | 76.21 |
|  | Top | 312.59 | 312.59 | 312.79 | 312.79 | 297.75 |
|  | Al60 | 200.00 | 200 | 200 | 200 | 200 |
|  | Si85 | 350.00 | 350 | 350 | 350 | 350 |
|  | Ag total nm | 254.0 | 254.1 | 254.1 | 254.1 | 252.2 |
|  | LTA | 72.36 | 70.86 | 70.29 | 70.60 | 71.45 |
| T | L | 88.42 | 87.68 | 87.56 | 87.86 | 87.99 |
|  | a | -4.78 | -5.27 | -5.53 | -5.72 | -5.18 |
|  | b | 3.88 | 4.80 | 3.25 | 1.77 | 4.34 |
| Rg | L | 34.34 | 34.26 | 34.73 | 34.42 | 34.02 |
|  | a | 0.30 | 0.10 | -0.06 | -0.01 | 0.43 |
|  | b | -1.30 | -1.12 | -1.41 | -2.10 | -1.25 |
| Rf | L | 33.47 | 33.46 | 34.23 | 33.69 | 33.71 |
|  | a | 0.61 | 0.29 | 0.25 | 0.30 | 0.49 |
|  | b | -0.70 | -0.55 | -1.02 | -1.98 | -0.75 |
| Rg (45) | L | 36.62 | 36.52 | 36.93 | 36.67 | 36.45 |
|  | a | -0.57 | -0.69 | -0.90 | -0.87 | 0.38 |
|  | b | 0.15 | 0.32 | 0.00 | -0.68 | -0.01 |
| Rf(45) | L | 35.89 | 35.84 | 36.55 | 36.06 | 36.19 |
|  | a | -1.07 | -1.28 | -1.34 | -1.39 | -0.60 |
|  | b | 0.97 | 1.00 | 0.54 | -0.34 | 0.57 |
| Rg (60) | L | 45.01 | 44.84 | 45.11 | 44.97 | 44.90 |
|  | a | -1.12 | -1.20 | -1.41 | -1.41 | -0.40 |
|  | b | 0.95 | 1.15 | 0.76 | 0.11 | 0.98 |
| Rf (60) | L | 44.46 | 44.34 | 44.86 | 44.53 | 44.66 |
|  | A | -2.26 | -2.38 | -2.47 | -2.59 | -1.85 |
|  | b | 1.59 | 1.65 | 1.17 | 0.38 | 1.32 |
| 8deg | Rf 400 | 5.26 | 5.50 | 5.83 | 5.75 | 5.65 |
|  | Rf 700 | 7.93 | 7.77 | 7.82 | 7.42 | 8.18 |
| 60deg | Rf 400 | 10.06 | 10.35 | 10.68 | 10.57 | 10.61 |
|  | Rf 700 | 16.52 | 15.96 | 15.66 | 15.09 | 16.17 |
|  | Tsolar | 36.59 | 35.27 | 34.82 | 34.96 | 35.95 |
|  | R1solar | 16.28 | 15.08 | 13.81 | 13.01 | 15.77 |
|  | R2solar | 34.38 | 34.40 | 34.45 | 34.39 | 34.08 |
|  | Rs (Ω/□) | 1.401 | 1.40 | 1.40 | 1.40 | 1.41 |
| Solar Factor | TTs | 0.4247 | 0.4139 | 0.4105 | 0.4121 | 0.4201 |

FIG. 18

| Name | | |
|---|---|---|
| | | SiCeO₃ absorber |
| 3Ag | Substrate | 2.1 clear |
| | Cover | 1.6 index |
| Unit | | (Å) |
| Structure | Base | 300.86 |
| | Ag | 97.36 |
| | SiC | 760.83 |
| | Ag | 92.74 |
| | C | 728.59 |
| | Ag | 79.53 |
| | Top | 273.87 |
| | | |
| | | |
| | AlSb | 300.00 |
| | SiBS | 350.00 |
| | Ag total nm | 269.8 |
| | LTA | 71.92 |
| T | L | 88.05 |
| | a | -3.77 |
| | b | 4.27 |
| Rg | L | 36.31 |
| | a | -0.87 |
| | b | 0.33 |
| Rf | L | 33.23 |
| | a | 0.29 |
| | b | -0.66 |
| Rg(45) | L | 36.42 |
| | a | -2.19 |
| | b | 1.29 |
| Rf(45) | L | 35.61 |
| | a | -1.23 |
| | b | 0.91 |
| Rg(60) | L | 44.86 |
| | a | -2.86 |
| | b | 1.88 |
| Rf(60) | L | 44.32 |
| | a | -2.29 |
| | b | 1.75 |
| 8 deg | Rf 400 | 5.31 |
| | Rf 700 | 7.62 |
| 60 deg | Rf 400 | 10.09 |
| | Rf 700 | 16.66 |
| | Tsolar | 36.88 |
| | R1solar | 18.80 |
| | R2solar | 34.22 |
| | Rs (Ω/□) | 1.300 |
| Solar factor | TTS | 0.427 |

FIG. 19

| 3Ag Se-Ag | 2.1mm Substrate 1.6mm Cover | Clear Solex |
|---|---|---|
| Unit | | (Å) |
| structure | Base | 342.41 |
| | | 91.52 |
| | BC | 711.66 |
| | | 96.59 |
| | C | 734.80 |
| | | 82.57 |
| | TC | 285.22 |
| | | |
| | top | 297.88 |
| | Abot | 160.00 |
| | Sbot | 220.00 |
| | Ag total nm | 297.88 |
| | LTA | 71.80 |
| T | L | 88.14 |
| | a | -4.11 |
| | b | 3.02 |
| Rg | L | 33.27 |
| | a | -0.48 |
| | b | -1.56 |
| Rf | L | 32.61 |
| | a | -0.24 |
| | b | -1.70 |
| Rg(45) | L | 35.66 |
| | a | -0.85 |
| | b | -0.38 |
| Rf(45) | L | 35.18 |
| | a | -0.73 |
| | b | -0.03 |
| Rg(60) | L | 44.35 |
| | a | -1.23 |
| | b | 0.48 |
| Rf(60) | L | 43.99 |
| | a | -1.66 |
| | b | 0.75 |
| 8 deg | Rf 400 | 5.14 |
| | Rf 700 | 8.41 |
| 60 deg | Rf 400 | 10.04 |
| | Rf 700 | 17.22 |
| | Tsolar | 36.58 |
| | R1solar | 18.86 |
| | R2solar | 33.85 |
| | Rs (Ω/□) | 1.150 |
| Solar factor | TTs | 0.426 |

FIG. 20

| Parameters | 2.1 mm Substrate | Clear |
|---|---|---|
| | 1.6 mm Cover | Clear |
| | Quad-Ag | Quad Ag |
| Unit | | (Å) |
| Structure | Base | 374.10 |
| | Ag | 98.58 |
| | BC | 767.15 |
| | Ag | 108.20 |
| | C | 722.00 |
| | Ag | 96.83 |
| | TC | 624.01 |
| | Ag | 79.11 |
| | Top | 254.62 |
| | Al60 | 160.00 |
| | Si85 | 220.00 |
| | Ag total nm | 382.72 |
| | LTA | 72.36 |
| T | L | 88.13 |
| | a | -3.00 |
| | b | 4.66 |
| Rg | L | 34.37 |
| | a | -0.13 |
| | b | -3.57 |
| Rf | L | 33.93 |
| | a | -0.88 |
| | b | -0.84 |
| Rg (45) | L | 36.36 |
| | a | -0.32 |
| | b | -1.72 |
| Rf(45) | L | 36.11 |
| | a | -0.68 |
| | b | 0.45 |
| Rg (60) | L | 44.70 |
| | a | 0.15 |
| | b | -0.82 |
| Rf (60) | L | 44.58 |
| | a | -0.03 |
| | b | 0.46 |
| 8deg | Rf 400 | 6.24 |
| | Rf 700 | 6.56 |
| 60deg | Rf 400 | 10.46 |
| | Rf 700 | 17.42 |
| | Tsolar | 36.08 |
| | R1solar | 32.22 |
| | R2solar | 35.67 |
| | Rs (Ω/□) | 0.86 |
| Solar Factor | TTs | 0.419 |

FIG. 21

| | | | | |
|---|---|---|---|---|
| Glass (ext) | | | | |
| Coating | | | | |
| PVB | 0.76 mm RB41 Clear | 0.76 mm RB41 Clear | 0.76 mm RB41 Clear | 0.76 mm RB41 Clear | 0.76 mm Sekisul Vision SCF2 |
| Glass (int) | 1.6 mm TSANX-SGG | 1.6 mm SGN-C5 | 1.6 mm SGN-C4 | 1.6 mm TSA3+-SGG | 1.6 mm CLEAR_EP05 |
| LTA | 72.37 | 71.51 | 70.45 | 70.14 | 72.51 |
| R(ext) | 7.21 | 7.17 | 7.09 | 7.07 | 7.30 |
| a*(ext) | -0.97 | -1.11 | -1.18 | -1.19 | -1.57 |
| b*(ext) | 0.99 | 0.95 | 1.11 | 1.09 | 2.48 |
| R(int) | 7.06 | 7.01 | 6.93 | 6.91 | 7.19 |
| a*(int) | -0.72 | -0.88 | -0.98 | -0.99 | -1.37 |
| b*(int) | 0.78 | 0.73 | 0.92 | 0.89 | 2.39 |
| TTS | 46.85 | 46.08 | 45.44 | 45.33 | 44.21 |
| R(ext)-400 | 7.02 | 7.02 | 7.00 | 7.00 | 6.75 |
| R(ext)-700 | 7.24 | 7.10 | 7.02 | 7.01 | 6.69 |
| R(int)-400 | 4.90 | 4.89 | 4.86 | 4.86 | 4.61 |
| R(int)-400 | 6.65 | 6.43 | 6.30 | 6.28 | 5.85 |

FIG. 22

| | | | | | |
|---|---|---|---|---|---|
| | Substrate | 2.1 mm clear | 2.1 mm clear | 2.1 mm clear | 2.1 mm clear |
| | Cover | 2.1 mm clear | 2.1 mm clear | 2.1 mm clear | 2.1 mm clear |
| Angstrom (Å) | Base | 371.2 | 296.7 | 325.8 | 472.0 |
| | Ag | 133.1 | 105.5 | 97.2 | 99.6 |
| | Center | 996.2 | 928.9 | 930.6 | 947.5 |
| | Ag | 79.2 | 75.8 | 75.1 | 102.8 |
| | Top | 395.8 | 402.2 | 389.7 | 368.0 |
| | Si40Al60Ox | 270.0 | 270.0 | 270.0 | 270.0 |
| | Si85Al15Ox | 240.0 | 240.0 | 240.0 | 240.0 |
| | Total Ag | 212.3 | 181.3 | 172.3 | 202.4 |
| Rf | L | 51.5 | 22.5 | 41.4 | 42.6 |
| | a | -4.0 | -3.8 | -3.3 | -4.5 |
| | b | -5.8 | -4.8 | -4.6 | -16.1 |
| Rg | L | 51.9 | 45.2 | 41.9 | 42.4 |
| | a | -2.3 | -2.3 | -1.9 | -3.3 |
| | b | -7.9 | -8.0 | -7.5 | -18.0 |
| T | L | 87.5 | 90.1 | 91.1 | 90.7 |
| | a | -2.2 | -2.1 | -2.2 | -2.2 |
| | b | 7.5 | 5.8 | 5.1 | 9.6 |
| | LTA | 71.8 | 77.0 | 79.1 | 79.0 |
| 8 deg | Rg SOS | 0.9 | 0.8 | 0.7 | 0.8 |
| 60 deg | Rg SOS | 0.7 | 0.6 | 0.5 | 0.7 |
| | Tsolar | 41.0 | 45.9 | 47.9 | 44.6 |
| | R1solar | 31.3 | 26.9 | 25.1 | 28.9 |
| | R2solar | 37.9 | 32.5 | 30.3 | 33.2 |
| | Resistance (Ω/□) | 1.7 | 2.8 | 2.9 | 2.4 |

FIG. 23

LTA = 77%, Rg:
- Zero degree: L* = 45.2, a* = -2.34, b* = -7.95
- 45 degree:   L* = 45.3, a* = -1.17, b* = -7.36
- 60 degree:   L* = 51.3, a* = -1.00, b* = -5.77

HEATABLE WINDSHIELD

CROSS REFERENCE TO RELATED APPLICATIONS

This application is a continuation application of U.S. patent application Ser. No. 18/121,660, filed on Mar. 15, 2023, which is a continuation application of U.S. patent application Ser. No. 16/830,829 filed on Mar. 26, 2020 which is entitled to and claims priority to U.S. Provisional Application No. 62/976,645 filed Feb. 14, 2020 and U.S. Provisional Application No. 62/825,326 filed Mar. 28, 2019, the disclosures of which are incorporated by reference.

BACKGROUND OF THE INVENTION

Field of the Invention

The invention relates generally to vehicle transparencies, such as vehicle windshields, and in one particular embodiment, to a heatable vehicle windshield.

Technical Considerations

Passing electric current through a conductor on a laminated vehicle windshield will raise the temperature of the windshield. This is particularly useful in colder climates for defogging and melting ice and/or snow on the windshield. In wire-heated windshields, fine electrically-conductive wires are placed between the windshield plies. The wires are connected to a power source, such as a conventional 14 volt vehicle alternator. The wires have sufficiently low resistance to provide a windshield with a power density of 5 to 7 watts per decimeter squared (W/dm$^2$).

A problem with wire-heated windshields is that the wires can be seen by the vehicle's occupants, which is aesthetically undesirable and can interfere with visibility through the windshield. If the diameter of the wires is decreased to try to reduce the visibility of the wires, the number of wires must be increased to maintained the desired power density, which adversely decreases the total solar energy transmitted (TSET) by the windshield. If the height of the windshield increases, the wires must be longer to maintain the desired power density. Longer wires are also undesirable with respect to aesthetics and/or transmittance.

Some heated windshields use transparent conductive coatings rather than wires. These coatings, however, have their own drawback. For example, conventional heated windshield coatings typically have a sheet resistance of 2 ohms per square ($\Omega/\square$) or greater. A conventional 14v (80 ampere, 1,120 watt) alternator does not provide enough voltage to power a conventional heated windshield coating to a temperature sufficient for de-icing. Therefore, for vehicles with these coatings, the vehicles must be altered to increase the available voltage. For example, the alternator can be replaced with a 42v alternator, or a DC to DC converter can be added to step-up the voltage from a 14v alternator. These solutions, however, increase the cost and complexity of the vehicle electrical system.

Therefore, it would be desired to provide a transparency that reduces or eliminates at least some of the problems associated with conventional heatable transparencies.

SUMMARY OF THE INVENTION

The invention is directed to lower the sheet resistance of a coated transparency by adding metallic silver layers in a coating stack. Specifically, the total amount of silver within the coating stack is between 30 nm and 60 nm; between 35 and 47 nm; between 35 and 43 nm or between 40 and 47 nm. As the silver thickness increases, the sheet resistance lowers. However, if the total thickness of the silver layers in a coating is too thick, the transmittance is reduced to below 70%, which is unacceptable. Additionally, if the total silver thickness is too thick, the color of the glass will appear red, which is undesirable. Thus, the invention is directed to a coating stack that has an adequately thick total silver to provide a sheet resistance to allow for de-icing with a 14v alternator, and having a light transmittance above 70%, preferably above 70.5%, more preferably above 71%.

The invention relates to a coated article comprising a substrate. The coated article is coated with at least one dielectric layer positioned over the substrate, and at least one metallic layer(s). The at least one metallic layer has a combined thickness of at least 30 nm and no more than 60 nm; at least 35 nm and no more than 47 nm; at least 35 nm and no more than 43 nm or at least 40 and no more than 47 nm.

The invention relates to a coated article. The coated article comprises a substrate. A first dielectric layer is positioned over at least a portion of the substrate. A first metallic layer is positioned over at least a portion of the first dielectric layer. A second dielectric layer is positioned over at least a portion of the first primer layer. A second metallic layer is positioned over at least a portion of the second dielectric layer. A third dielectric layer is positioned over at least a portion of the second primer layer. A third metallic layer is positioned over at least a portion of the third dielectric layer. A fourth dielectric layer is positioned over at least a portion of the third primer layer. A total combined thickness of the metallic layers is at least 30 nm, and no more than 60 nm. The invention may optionally further comprise a fourth metallic layer positioned over the fourth dielectric layer, and a fifth dielectric layer positioned over at least a portion of the fourth metallic layer.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer. A total combined thickness of the metallic layers is at least 30 nm, and no more than 60 nm. The invention may optionally further comprise a fourth metallic layer positioned over the fourth dielectric layer, a fourth primer layer positioned over the fourth metallic layer; and a fifth dielectric layer positioned over at least a portion of the fourth primer layer.

In another embodiment, the invention relates to a coated article. The coated article comprises a substrate. A first dielectric layer is positioned over at least a portion of the substrate. A first metallic layer is positioned over at least a portion of the first dielectric layer. A second dielectric layer is positioned over at least a portion of the first primer layer.

A second metallic layer is positioned over at least a portion of the second dielectric layer. A third dielectric layer is positioned over at least a portion of the second primer layer. A third metallic layer is positioned over at least a portion of the third dielectric layer. A fourth dielectric layer is positioned over at least a portion of the third primer layer. The article has a sheet resistance of not more than 0.850 ohms per square. The invention may optionally further comprise a fourth metallic layer positioned over the fourth dielectric layer, and a fifth dielectric layer positioned over at least a portion of the fourth metallic layer.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer. The article has a sheet resistance of not more than 0.850 ohms per square. The invention may optionally further comprise a fourth metallic layer positioned over the fourth dielectric layer, a fourth primer layer positioned over the fourth metallic layer; and a fifth dielectric layer positioned over at least a portion of the fourth primer layer.

In another embodiment, the invention relates to a coated article. The coated article comprises a first substrate having a first surface and a second surface. A second substrate is positioned over at least a portion of the first substrate, comprising a third surface and a fourth surface. A coating is disposed over either the second surface or the third surface. The coating has a first dielectric layer positioned over at least a portion of the second surface or the third surface. A first metallic layer is positioned over at least a portion of the first dielectric layer. A second dielectric layer is positioned over at least a portion of the first metallic layer. A second metallic layer is positioned over at least a portion of the second dielectric layer. A third dielectric layer is positioned over at least a portion of the second metallic layer. A third metallic layer is positioned over at least a portion of the third dielectric layer. The coated substrate has a visible light reflectance of not more than 10%. The invention may optionally further comprise a fourth metallic layer positioned over the fourth dielectric layer, and a fifth dielectric layer positioned over at least a portion of the fourth metallic layer.

In another embodiment, the invention relates to a coated article. The coated article comprises a first substrate having a first surface and a second surface. A second substrate is positioned over at least a portion of the first substrate, comprising a third surface and a fourth surface. A coating is disposed over either the second surface or the third surface. The coating has a first dielectric layer positioned over at least a portion of the second surface or the third surface. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer. The coated substrate has a visible light reflectance of not more than 10%. The invention may optionally further comprise a fourth metallic layer positioned over the fourth dielectric layer, a fourth primer layer positioned over the fourth metallic layer; and a fifth dielectric layer positioned over at least a portion of the fourth primer layer.

In another embodiment, the invention relates to a coated article. The coated article comprises a substrate. A first dielectric layer is positioned over at least a portion of the substrate. A first metallic layer is positioned over at least a portion of the first dielectric layer. A second dielectric layer is positioned over at least a portion of the first metallic layer. A second metallic layer is positioned over at least a portion of the second dielectric layer. A total combined thickness of the metallic layers is at least 38 nanometers, and no more than 60 nanometers.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A total combined thickness of the metallic layers is at least 30 nm, and no more than 60 nm.

BRIEF DESCRIPTION OF THE DRAWINGS

The invention will be described with reference to the following drawing figures wherein like reference numbers identify like parts throughout.

FIG. 16 shows an example of a coating according to the invention useful for a heads-up display.

FIG. 17 is a cross-sectional view (not to scale) of a non-limited coating according to the invention.

FIG. 18 shows an example of a coating according to the invention useful for a heads-up display.

FIG. 19 shows examples of a coating according to the invention useful for a heads-up display.

FIG. 20 shows an example of a coating according to the invention useful for a heads-up display.

FIG. 21 shows an example of a coating according to the invention useful for a heads-up display.

FIG. 22 shows an example of a coating according to the invention useful for a heads-up display.

FIG. 23 shows examples of a coating according to the invention having certain color and transmittance qualities.

DESCRIPTION OF THE PREFERRED EMBODIMENTS

Figure 1A:
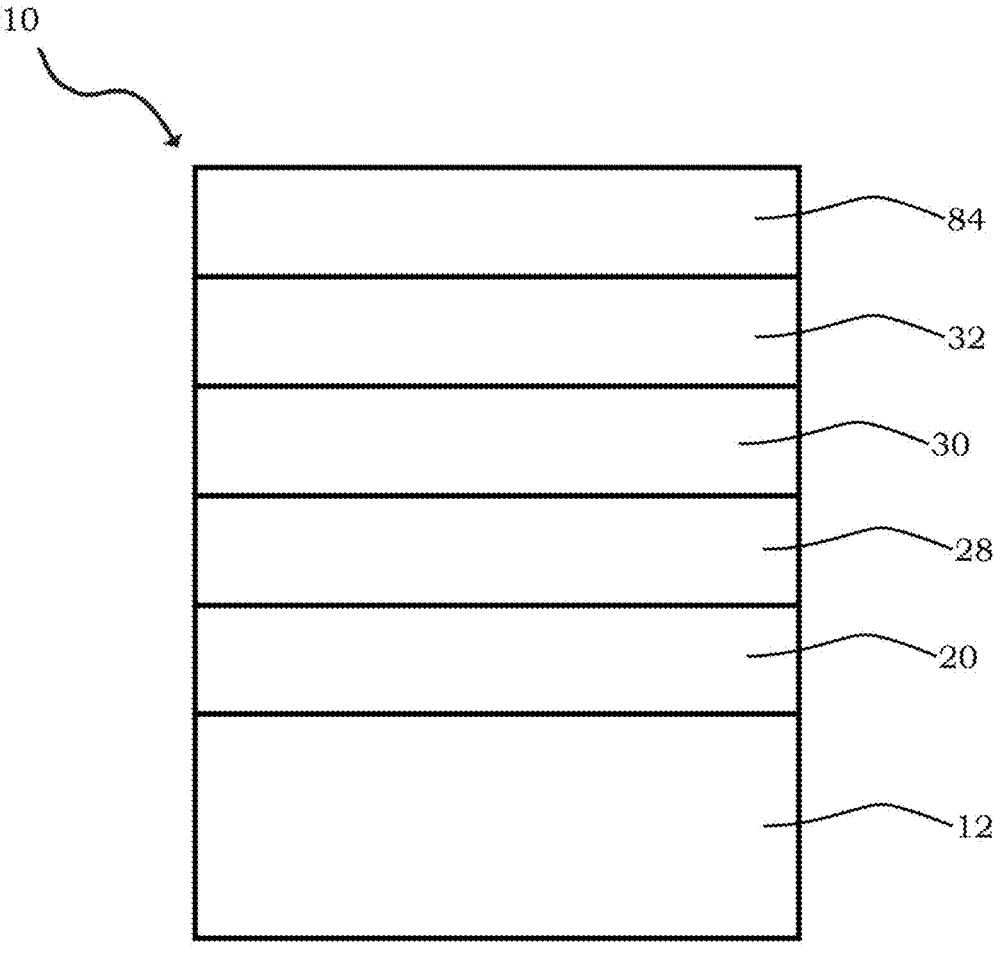
FIG. 1a is a cross-sectional view (not to scale) of a non-limiting coating according to the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm. Additionally, all documents, such as, but not limited to, issued patents and patent applications, referred to herein are to be considered to be "incorporated by reference" in their entirety. As used herein, the term "film" refers to a coating region of a desired or selected coating composition. A "layer" can comprise one or more "films", and a "coating" or "coating stack" can comprise one or more "layers". The terms "metal" and "metal oxide" include silicon and silica, respectively, as well as traditionally recognized metals and metal oxides, even though silicon conventionally may not be considered a metal. Thickness values, unless indicated to the contrary, are geometric thickness values.

The discussion of the invention may describe certain features as being "particularly" or "preferably" within certain limitations (e.g., "preferably", "more preferably", or "most preferably", within certain limitations). It is to be understood that the invention is not limited to these particular or preferred limitations but encompasses the entire scope of the disclosure.

Figure 10:
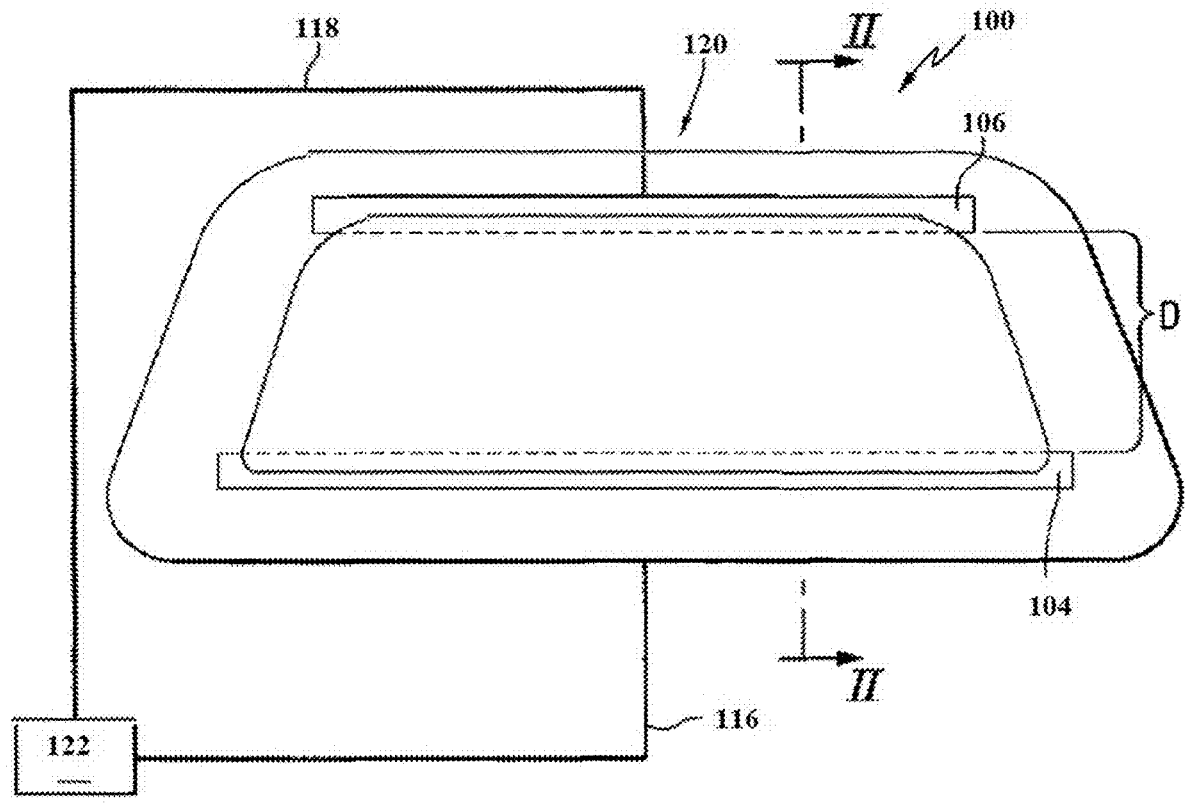
FIG. 10 is a schematic view (not to scale) of a windshield incorporating features of the invention.
Figure 11:
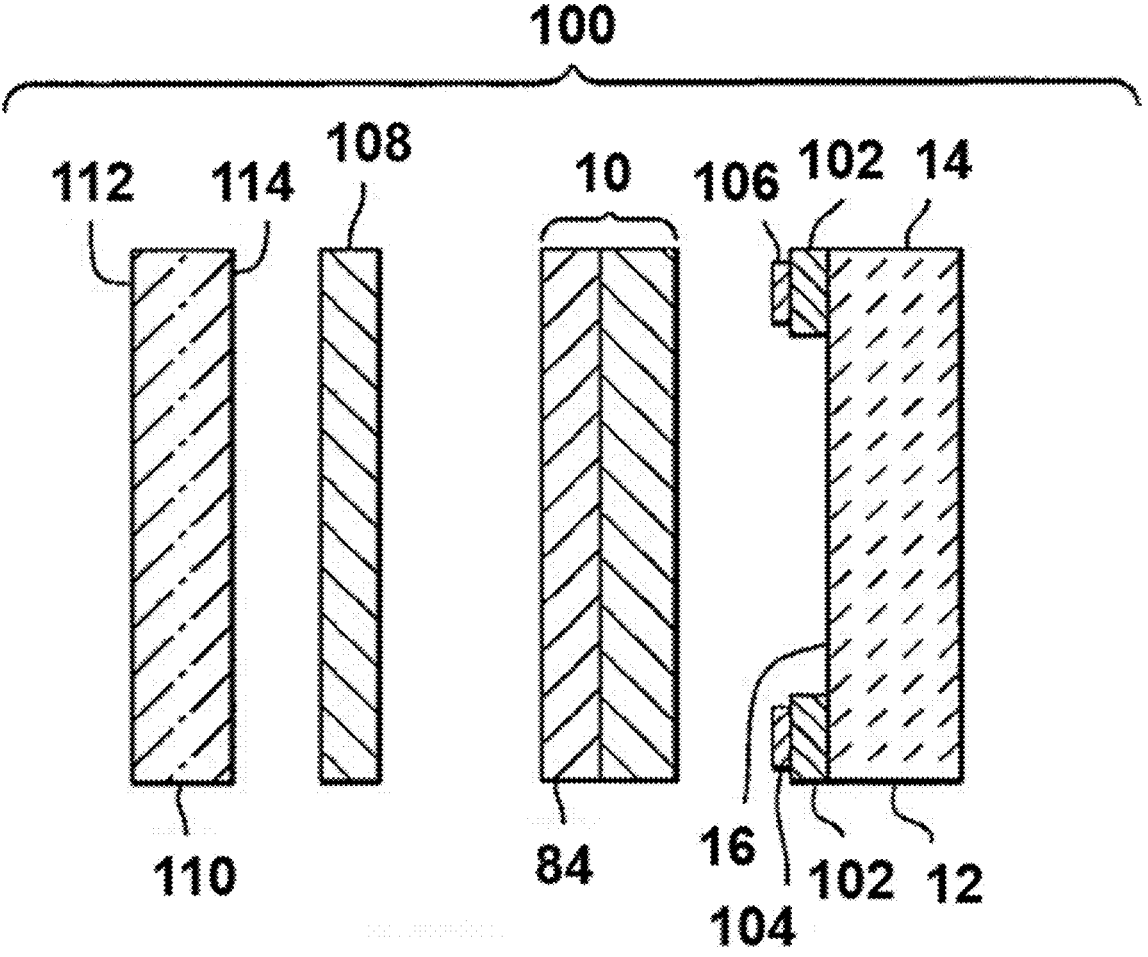
FIG. 11 is an expanded view (not to scale) of the windshield taken along the line II-II of FIG. 11.

A non-limiting heatable transparency 100 (e.g., automotive windshield) incorporating features of the invention is illustrated in FIGS. 10 and 11. The transparency 10 can have any desired visible light, infrared radiation, or ultraviolet radiation transmission and reflection. For example, the transparency 100 can have a visible light transmission of any desired amount, e.g., greater than 0% to 100%, e.g., greater than 70%. For windshield and front sidelight areas in the United States, the visible light transmission is typically greater than or equal to 70%. For privacy areas, such as rear seat sidelights and rear windows, the visible light transmission can be less than that for windshields, such as less than 70%.

As seen in FIG. 11, the transparency 100 includes a first ply or first substrate 12 with a first major surface facing the vehicle exterior, i.e., an outer major surface 14 (No. 1 surface) and an opposed second or inner major surface 16 (No. 2 surface). The transparency 100 also includes a second ply or second substrate 110 having an outer (first) major surface 112 (No. 4 surface) and an inner (second) major surface 114 (No. 3 surface). This numbering of the ply surfaces is in keeping with conventional practice in the automotive art. The first and second plies 12, 110 can be bonded together in any suitable manner, such as by a conventional interlayer 108. Although not required, a conventional edge sealant can be applied to the perimeter of the laminated transparency 10 during and/or after lamination in any desired manner. A decorative band, e.g., an opaque, translucent or colored shade band 102 (shown in FIG. 11), such as a ceramic band, can be provided on a surface of at least one of the plies 12, 110, for example around the perimeter of the inner major surface 16 of the first ply 12. An electrically conductive coating 10 is formed over at least a portion of one of the plies 12, 110, such as over the No. 2 surface 16 or No. 3 surface 114. A bus bar assembly 120 (FIG. 10) is in electrical contact with the conductive coating 10. The bus bar assembly 120 is also connected to an electrical power source 122 (FIG. 10) and will be discussed in more detail below. In one non-limiting aspect of the invention, the power source 122 can be a conventional vehicle alternator, e.g., configured to supply approximately 14 volts. Thus, in the practice of one non-limiting embodiment of the invention, no DC to DC power converter is present. In one non-limiting embodiment, the power source 38 can be a 42 volt DC alternator or a DC to DC converter can be added to step-up the voltage from a 14 volt alternator to a sufficient level, e.g., 42 volts DC.

In the broad practice of the invention, the plies 12, 110 of the transparency 100 can be of the same or different materials. The plies 12, 110 can include any desired material having any desired characteristics. For example, one or more of the plies 12, 110 can be transparent or translucent to visible light. By "transparent" is meant having visible light transmittance of greater than 0% to 100%. Alternatively, one or more of the plies 12, 110 can be translucent. By "translucent" is meant allowing electromagnetic energy (e.g., visible light) to pass through but diffusing this energy such that objects on the side opposite the viewer are not clearly visible. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations of any of the above. For example, one or more of the plies 12, 110 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. The ribbon is then cut and/or shaped and/or heat treated as desired. Examples of float glass processes are disclosed in U.S. Pat. Nos. 4,466,562 and 4,671,155. The first and second plies 12, 110 can each be, for example, clear float glass or can be tinted or colored glass or one ply 12, 110 can be clear glass and the other ply 12, 110 colored glass. Although not limiting to the invention, examples of glass suitable for the first ply 12 and/or second ply 110 are described in U.S. Pat. Nos. 4,746,347; 4,792,536; 5,030,593; 5,030,594; 5,240,886; 5,385,872; and 5,393,593. The first and second plies 12, 18 can be of any desired dimensions, e.g., length, width, shape, or thickness. In one exemplary automotive transparency, the first and second plies can each be 1 mm to 10 mm thick, e.g., 1 mm to 5 mm thick, or 1.5 mm to 2.5 mm, or 1.8 mm to 2.3 mm. In one non-limiting embodiment, the first ply 12 and/or second ply 110 can have a visible light transmittance of greater than 90%, such as greater than 91%, at a reference wavelength of 550 nm. The glass composition for the first ply 12 and/or second ply 110 can have a total iron content in the range of greater than 0 wt. % to 0.2 wt. % and/or a redox ratio in the range of 0.3 to 0.6.

In one non-limiting embodiment, one or both of the plies 12, 110 may have a high visible light transmittance at a reference wavelength of 550 nanometers (nm). By "high visible light transmittance" is meant visible light transmittance at 550 nm greater than or equal to 85%, such as greater than or equal to 87%, such as greater than or equal to 90%, such as greater than or equal to 91%, such as greater than or equal to 92%, at 5.5 mm equivalent thickness for glass from 2 mm to 25 mm sheet thickness. Particularly useful glass for the practice of the invention is disclosed in U.S. Pat. Nos. 5,030,593 and 5,030,594.

The interlayer 108 can be of any desired material and can include one or more layers or plies. The interlayer 108 can be a polymeric or plastic material, such as, for example, polyvinylbutyral, plasticized polyvinyl chloride, or multi-layered thermoplastic materials including polyethyleneterephthalate, etc. Suitable interlayer materials are disclosed, for example but not to be considered as limiting, in U.S. Pat. Nos. 4,287,107 and 3,762,988. The interlayer 108 secures the first and second plies 12, 1101 together, provides energy absorption, reduces noise, and increases the strength of the laminated structure. The interlayer 108 can also be a sound absorbing or attenuating material as described, for example, in U.S. Pat. No. 5,796,055. The interlayer 108 can have a solar control coating provided thereon or incorporated therein or can include a colored material to reduce solar energy transmission.

The coating 10 is an electrically conductive coating deposited over at least a portion of a major surface of one of the glass plies 12, 110, such as on the inner surface 16 of the outboard glass ply 12 (FIG. 11) or the outer surface 112 of the inner glass ply 110. The conductive coating 10 can include three or four metallic films positioned between dielectric layers applied sequentially over at least a portion of one of the glass plies 12, 110. The conductive coating 10 can be a heat and/or radiation reflecting coating and can have one or more coating layers or films of the same or different composition and/or functionality. As used herein, the term "film" refers to a coating region of a desired or selected coating composition. A "layer" can comprise one or more "films" and a "coating" or "coating stack" can comprise one or more "layers". The conductive coating 30 can be a multi-layer coating include three or four metallic layers.

Non-limiting examples of suitable conductive coatings typically include one or more antireflective coating films comprising dielectric or anti-reflective materials, such as metal oxides or oxides of metal alloys, which are transparent to visible light. The conductive coating 10 can also include three or four metallic layers comprising a reflective metal, e.g., a noble metal such as gold, copper or silver, or combinations or alloys thereof, and can further comprise a primer layer or barrier film, such as titanium or a titanium aluminum alloy, as is known in the art, located over and/or optionally under the metal reflective layer. The conductive coating 10 can have three or four metallic layers; or can have at least three metallic layers; or can have no more than four metallic layers. For example, the conductive coating 10 consist of four metallic layers; or can consist of three metallic layers. In one non-limiting embodiment, one or more of the metallic layers can comprise silver.

The conductive coating 10 can be deposited by any conventional method, such as but not limited to conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as but not limited to sol-gel deposition. In one non-limiting embodiment, the conductive coating 10 can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750.

Figure 1B:
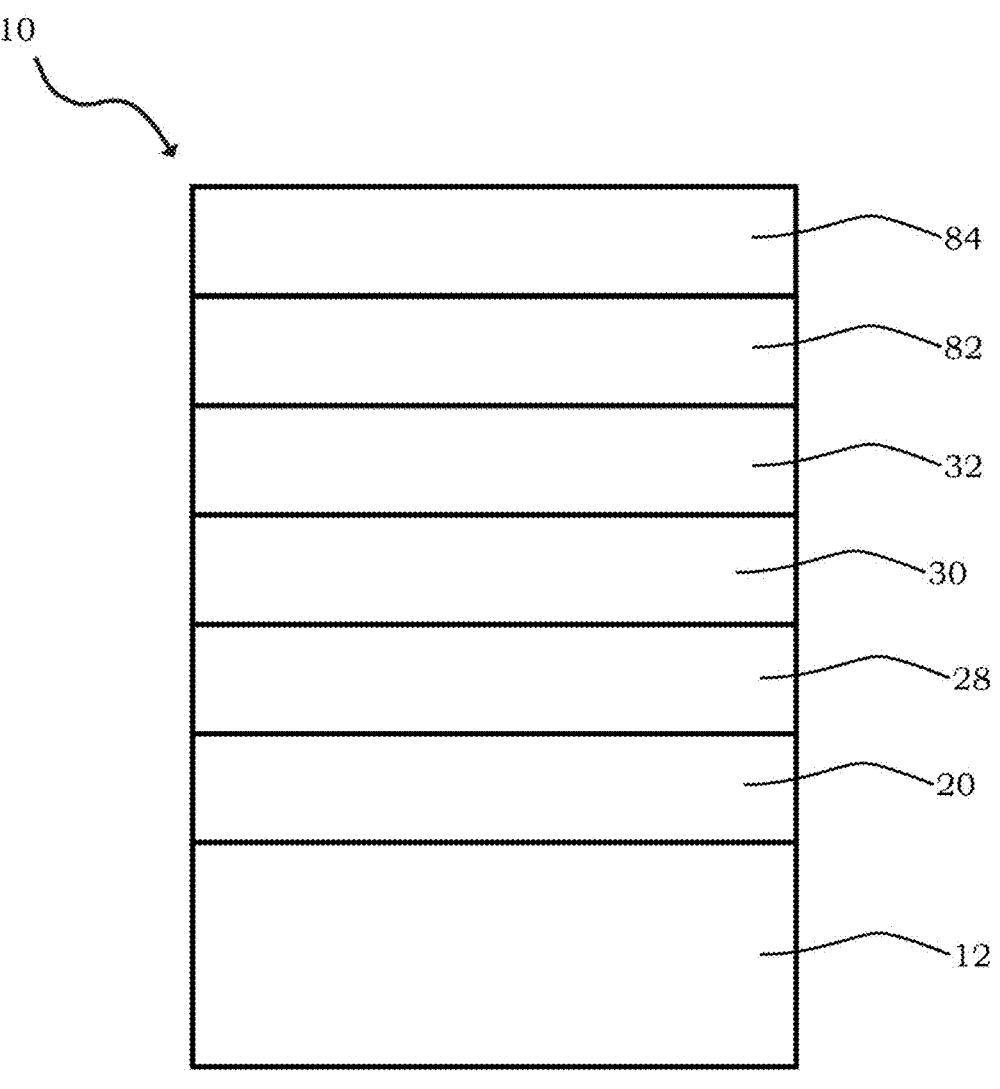
FIG. 1b is a cross-sectional view (not to scale) of a non-limiting coating according to the invention.

A non-limiting coating suitable for the invention is shown in FIGS. 1a and 1b. This coating includes one metallic layer and one primer layer positioned in between two dielectric layers. It includes a base layer or first dielectric layer 20 positioned over or in direct contact with at least a portion of a major surface of a substrate (e.g., the No. 2 surface 16 of the first ply 12, or the No. 3 surface 114 of the second ply 110). A first metallic layer 28 is positioned over or in direct contact with at least a portion of the first dielectric layer 20. A first primer layer 30 may be positioned over or in direct contact with at least a portion of the first metallic layer 28. A second dielectric layer 32 is positioned over or in direct contact with the first primer layer 30. A protective layer 84 may be positioned over or in direct contact with the second dielectric layer 32. An optional stress layer 82 may be positioned between the second dielectric layer 32 and the protective layer 84.

Figure 2A:
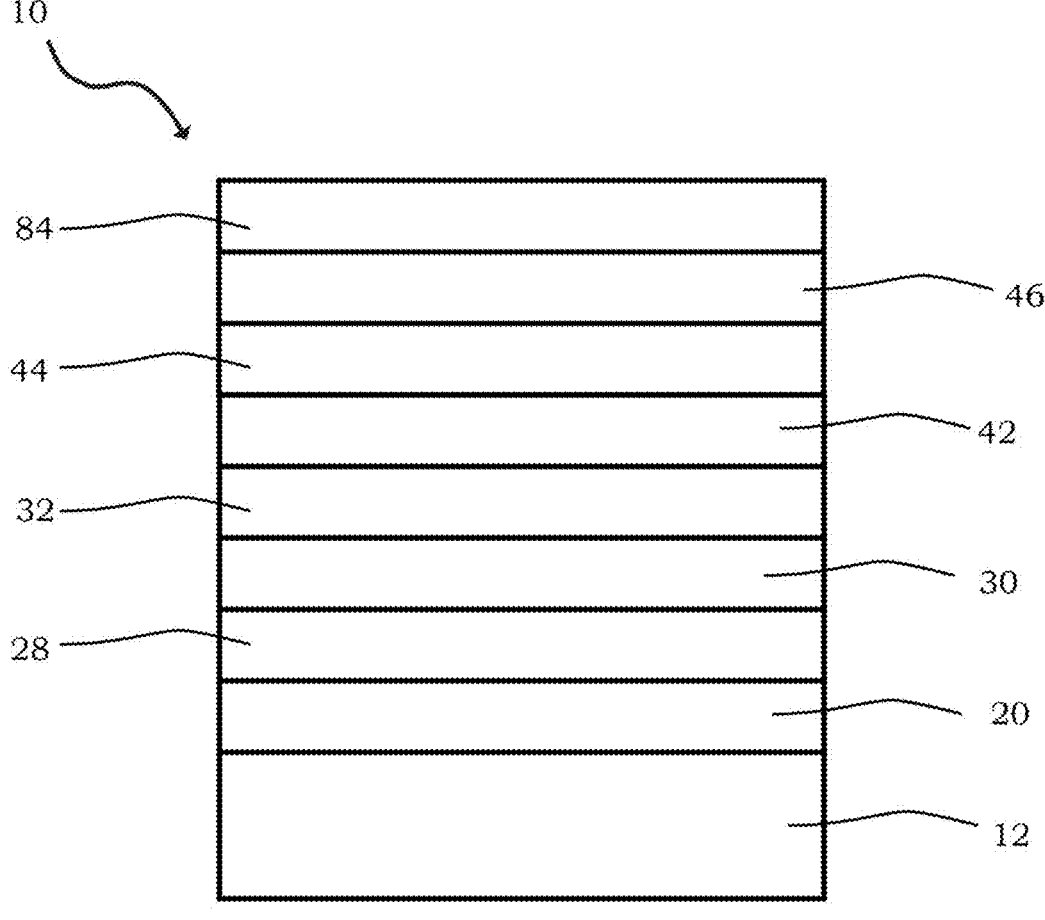
FIG. 2a is a cross-sectional view (not to scale) of a non-limiting coating according to the invention.
Figure 2B:
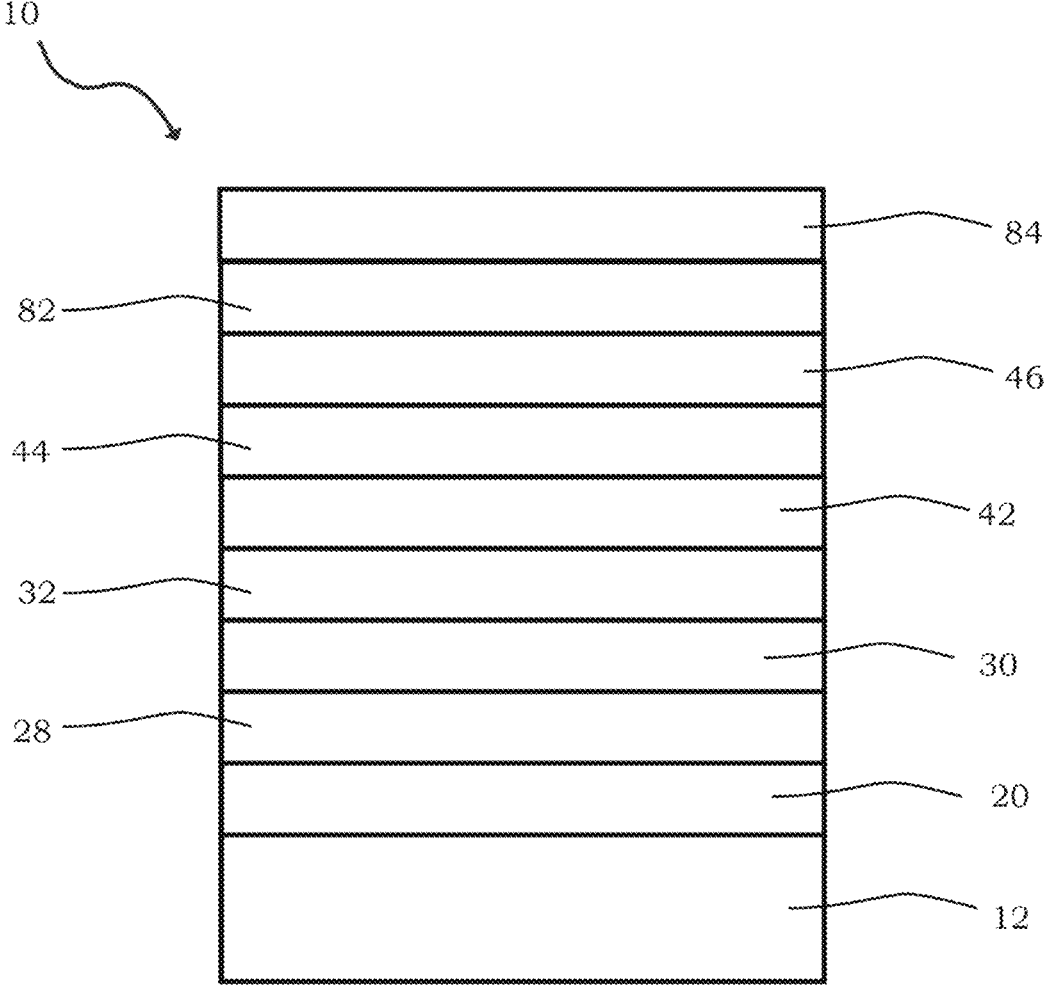
FIG. 2b is a cross-sectional view (not to scale) of a non-limiting coating according to the invention.

Another non-limiting coating suitable for the invention is shown in FIGS. 2a and 2b. This coating includes two metallic layers and two primer layers positioned in between dielectric layers. It includes a base layer or first dielectric layer 20 positioned over or in direct contact with at least a portion of a major surface of a substrate (e.g., the No. 2 surface 16 of the first ply 12, or the No. 3 surface 114 of the second ply 110). A first metallic layer 28 is positioned over or in direct contact with at least a portion of the first dielectric layer 20. A first primer layer 30 may be positioned over or in direct contact with at least a portion of the first metallic layer 28. A second dielectric layer 32 is positioned over or in direct contact with the first primer layer 30. A second metallic layer 42 is positioned over or in direct contact with at least a portion of the second dielectric layer 32. A second primer layer 44 may be positioned over or in direct contact with the second metallic layer 42. A third dielectric layer 46 is positioned over or in direct contact with the second primer layer 44. A protective layer 84 may be positioned over or in direct contact with the third dielectric layer 46. An optional stress layer 82 may be positioned between the third dielectric layer 46 and the protective layer 84.

Figure 3A:
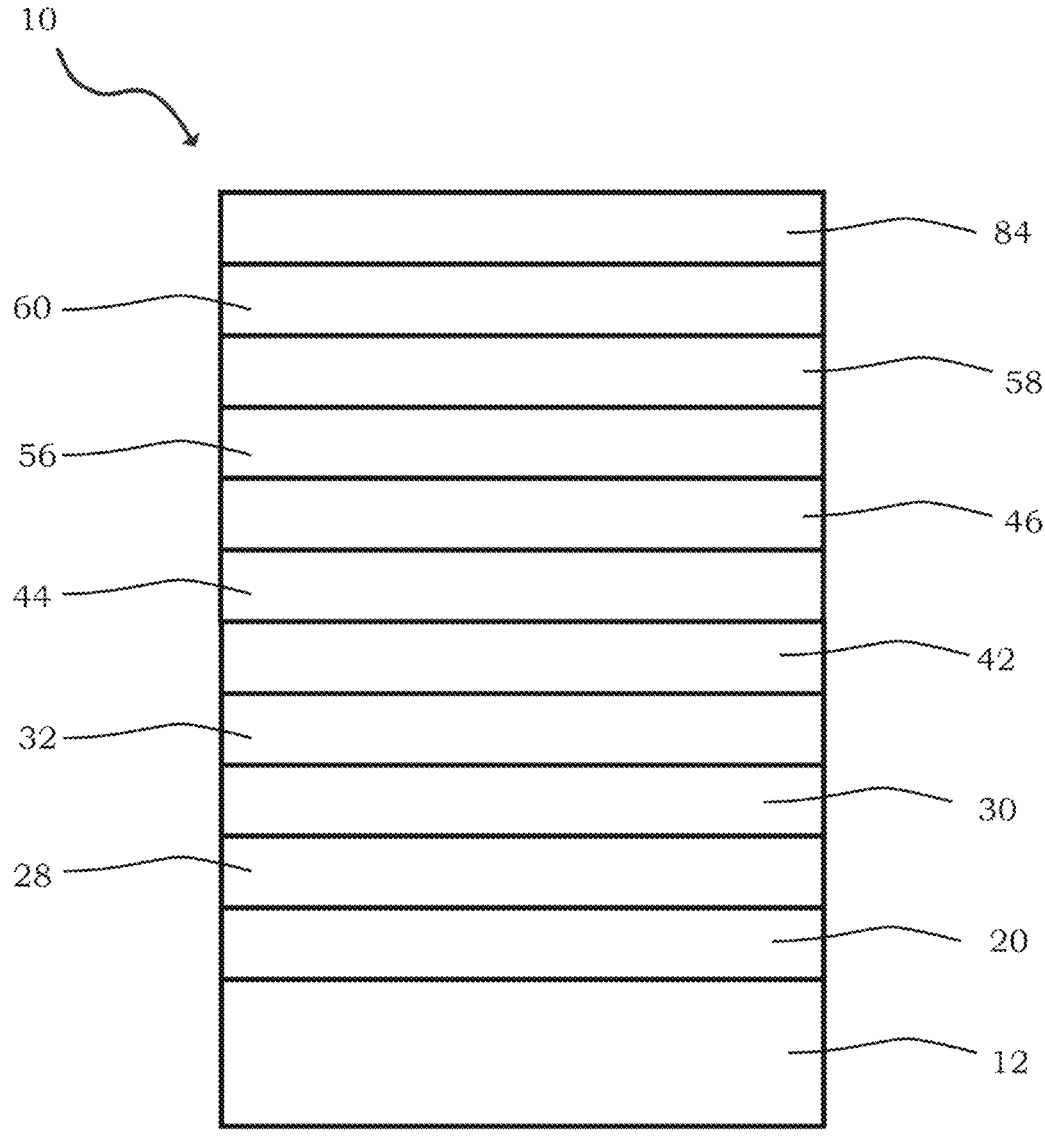
FIG. 3a is a cross-sectional view (not to scale) of a non-limiting coating according to the invention.
Figure 3B:
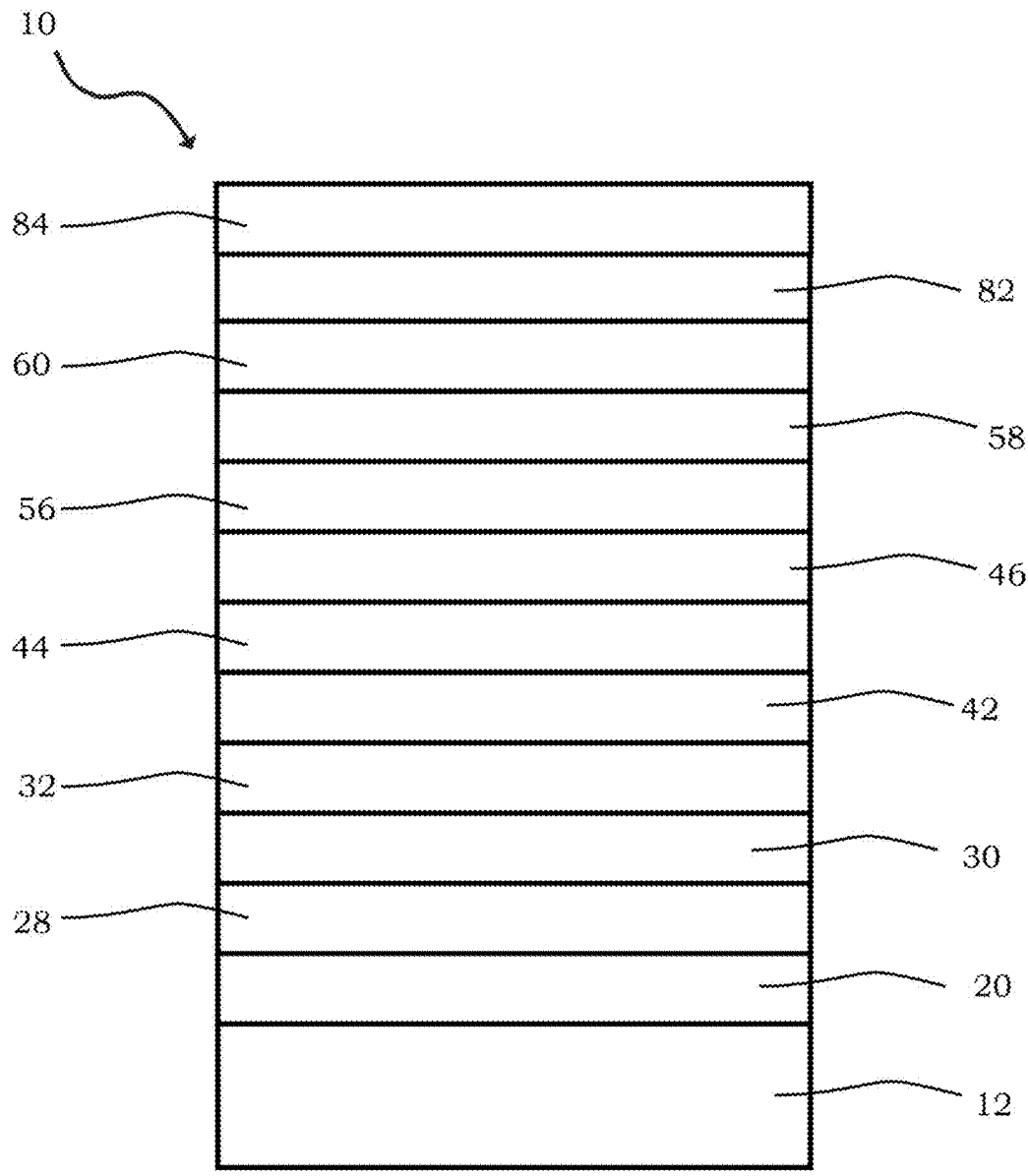
FIG. 3b is a cross-sectional view (not to scale) of a non-limiting coating according to the invention.

An exemplary non-limiting coating suitable for the invention is shown in FIG. 3a and FIG. 3b. This exemplary coating includes three metallic layers positioned in between dielectric layers. It includes a base layer or first dielectric layer 20 positioned over or in direct contact with at least a portion of a major surface of a substrate (e.g., the No. 2 surface 16 of the first ply 12, or the No. 3 surface 114 of the second ply 110). A first metallic layer 28 is positioned over or in direct contact with at least a portion of the first dielectric layer 20. An optional first primer layer 30 may be positioned over or indirect contact with at least a portion of the first metallic layer 28. A second dielectric layer 32 is positioned over or in direct contact with the first primer layer 44 or the first metallic layer 28. A second metallic layer 42 is positioned over or in direct contact with at least a portion of the second dielectric layer 32. An optional second primer layer 44 may be positioned over or in direct contact with the second metallic layer 42. A third dielectric layer 46 is positioned over or in direct contact with the second primer layer 44 or the second metallic layer 42. A third metallic layer 56 is positioned over the third dielectric layer 46. An optional third primer layer 58 may be positioned over or in direct contact with the third metallic layer 56. A fourth dielectric layer 60 is positioned over or in direct contact with the third primer layer or the third metallic layer. A protective layer 84 may be positioned over or in direct contact with the fourth dielectric layer 60. An optional stress layer 82 may be positioned between the fourth dielectric layer 60 and the protective layer 84.

The first dielectric layer 20 can comprise one or more films of antireflective materials and/or dielectric materials, such as but not limited to metal oxides, oxides of metal alloys, nitrides, oxynitrides, or mixtures thereof. The first dielectric layer 20 can be transparent to visible light. Examples of suitable metal oxides for the first dielectric layer 20 include oxides of titanium, hafnium, zirconium, niobium, zinc, bismuth, lead, indium, tin, silicon, gallium, vanadium, and mixtures thereof. These metal oxides can have small amounts of other materials, such as manganese in bismuth oxide, tin in indium oxide, etc. Alternatively, oxides of metal alloys or metal mixtures, such as oxides containing zinc and tin (e.g., zinc stannate); oxides of indium-tin alloys; silicon nitrides; silicon aluminum nitrides; or aluminum nitrides can be used. Further, doped metal oxides, such as antimony or indium doped tin oxides or nickel or boron doped silicon oxides, can be used. In one non-limiting embodiment, the first film 22 can be a zinc/tin alloy oxide. The zinc/tin alloy oxide can be obtained from magnetron sputtering vacuum deposition from a cathode of zinc and tin that can comprise zinc and tin in proportions of 10 wt. % to 90 wt. % zinc and 90 wt. % to 10 wt. % tin. One suitable metal alloy oxide that can be present in the first film 42 is zinc stannate. By "zinc stannate" is meant a composition of $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. For example where x=⅔, Formula 1 is $Zn_{2/3}Sn_{1/3}O_{4/3}$, which is more commonly described as $Zn_2SnO_4$. A zinc stannate containing film has one or more of the forms of Formula 1 in a predominant amount in the film.

The second film 24 can be a zinc-containing film, such as zinc oxide. The zinc oxide film can be deposited from a zinc cathode that includes other materials to improve the sputtering characteristics of the cathode. For example, the zinc cathode can include a small amount (e.g., less than 10 wt. %, such as greater than 0 to 5 wt. %) of tin to improve sputtering. In which case, the resultant zinc oxide film would include a small percentage of tin oxide, e.g., 0 to less than 10 wt. % tin oxide, e.g., 0 to 5 wt. % tin oxide. An oxide layer sputtered from a zinc/tin cathode having ninety-five percent zinc and five percent tin is written as $Zn_{0.95}S0_{.5}O_{1.05}$ herein and is referred to as a zinc oxide film. The small amount of tin in the cathode (e.g., less than 10 wt. %) is believed to form a small amount of tin oxide in the predominantly zinc oxide-containing second film 44. In one non-limiting embodiment in which the first film 42 is zinc stannate and the second film 44 is zinc oxide ($Zn_{0.95}Sn_{0.5}O_{1.05}$).

In an exemplary non-limiting embodiment, the second film 24 is a film consisting of at least one of the following: aluminum zinc oxide, gallium zinc oxide, indium zinc oxide, indium tin oxide, or vanadium zinc oxide. The aluminum zinc oxide, gallium zinc oxide, indium zinc oxide, indium tin oxide, or vanadium zinc oxide film is deposited from a zinc cathode that includes other material to improve the sputtering characteristics of the cathode. For example, the aluminum zinc oxide, gallium zinc oxide, indium zinc oxide, indium tin oxide, or vanadium zinc oxide film can include an additional small amount (e.g., less than 10 wt. %, such as greater than 0 to 5 wt. %) of tin to improve sputtering. The small amount of tin in the cathode (e.g., less than 10 wt. %) is believed to form a small amount of tin oxide in the second film 24. In one non-limiting embodiment, the first film 22 comprises zinc stannate and the second film 24 comprises aluminum zinc oxide, gallium zinc oxide, indium zinc oxide, indium tin oxide, or vanadium zinc oxide. In one non-limiting embodiment, the first dielectric layer or the second dielectric layer comprises a silicon nitride film. In some embodiments, such as FIG. 5b, the first dielectric layer 20 only has a first film 22 and a second film 24.

The first dielectric layer 20 can have a total thickness of less than or equal to 1,000 Å, such as less than or equal to 800 Å, such as between 200 Å to 800 Å, 300 Å to 600 Å, such as 400 Å to 550 Å, such as 410 Å to 500 Å, or such as 420 Å to 470 Å, such as 422 Å and 463 Å.

Figure 5A:
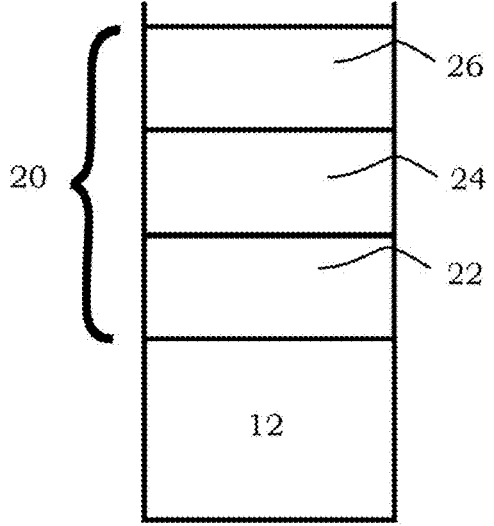
FIGS. 5a-b are cross-sectional views (not to scale) of non-limiting first dielectric layer embodiments according to the invention.
Figure 5B:
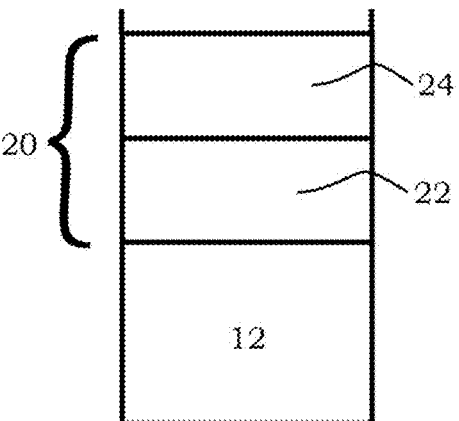
Figure 6A:
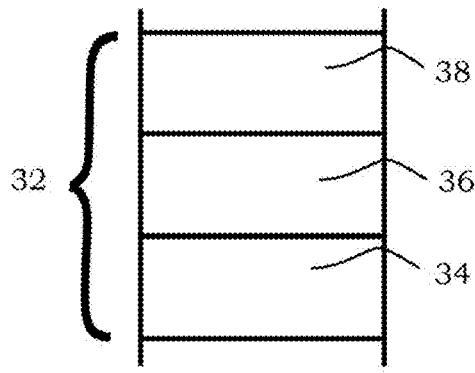
FIGS. 6a-d are cross-sectional views (not to scale) of non-limiting second dielectric layer embodiments according to the invention.
Figure 6B:
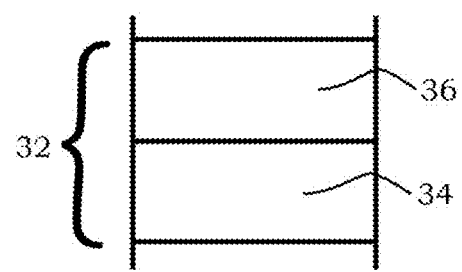
Figure 6C:
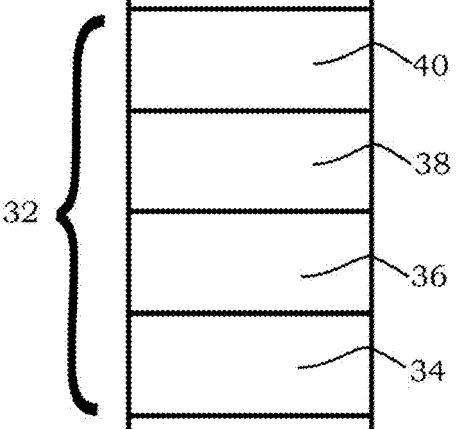
Figure 6D:
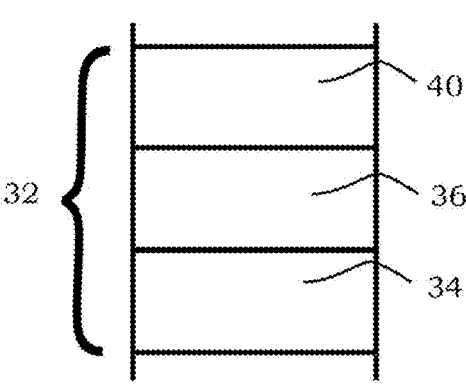

As shown in FIG. 5a, a first seed film 26 may be positioned over or in direct contact with at least a portion of the second film of the first dielectric layer 20. The first seed film 26 may be adjacent to or in direct contact with the first metallic layer 28 and between the first dielectric layer 20 and the first metallic layer 28. The first seed film 26 is a film comprised of at least one of the following: aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, alloys thereof, oxides thereof, sub-oxides thereof, nitrides thereof, and sub-nitrides thereof. In one embodiment, the first seed film 26 comprises aluminum zinc, vanadium zinc, zinc, silver zinc, metals thereof, alloys thereof, oxides thereof, or sub-oxides thereof. In another embodiment, the first seed film 26 comprises gallium zinc, indium zinc, indium tin, metals thereof, alloys thereof, oxides thereof, nitrides thereof, sub-nitrides thereof, or sub-oxides thereof.

Compositions of non-limiting examples of the seed layer can be found in Table 1. In certain embodiments, a portion of the seed layer is formed in an $O_2$ atmosphere that has a specific flow rate as to form an atmosphere of 1% to 70% $O_2$, with the remainder argon. The flow rate is an approximation to the amount of $O_2$ in the atmosphere, but that one of ordinary skill in the art would recognize that additional $O_2$ may leak into the coating chamber as the coating chamber is not hermetically sealed from the outside environment. In one embodiment, the seed layer comprises vanadium zinc ($V_xZn_{1-x}$) oxide. In another embodiment, the seed layer comprises silver oxide. In another embodiment, the seed layer comprises aluminum silver ($Al_xAg_{1-x}$). In one non-limiting embodiment, the second film of the first dielectric layer 44 is the seed layer. In some embodiments, the first dielectric layer 40 comprises a first film 42, a second film 44, and a seed layer. The seed layer can have a total thickness in the range of 0.5 nm to 10 nm, preferably 0.75 nm to 8 nm, more preferably 0.9 nm to 6 nm.

TABLE 1

Compositions of Metals for Metal Alloys Used as Seed Layers

| Material | Range (wt. %) | Preferred Range (wt. %) | More Preferred Range (wt. %) | Most Preferred Range (wt. %) |
|---|---|---|---|---|
| Ag deposited in $O_2$ gas environment | x = 1 to 70% gas flow | x = 1 to 50% gas flow | x = 10 to 40% gas flow | x = 20 to 40% gas flow |
| $Al_xAg_{1-x}$ oxide | x = 1 to 35 (BH and AH) | x = 1 to 20 (BH and AH) | x = 1 to 18 (BH and AH) | x = 1 to 15 (BH and AH) |
| $Al_xZn_{1-x}$ oxide | x = 1 to 25 | x = 1 to 15 | x = 1 to 12 | x = 1 to 10 |
| $Ga_xZn_{1-x}$ oxide | x = 1 to 20 | x = 1 to 15 | x = 1 to 10 | x = 1 to 5 |
| $Sn_xIn_{1-x}$ oxide | x = 1 to 20 | x = 2 to 18 | x = 4 to 15 | x = 5 to 12 |
| $V_xZn_{1-x}$ oxide | x = 1 to 25 | x = 1 to 15 | x = 1 to 10 | x = 1 to 8 |

A first metallic layer 28 can be deposited over the first dielectric layer 20. The first metallic layer 28 can include a reflective metal, such as but not limited to metallic gold, copper, silver, aluminum, or mixtures, alloys, or combinations thereof. In one embodiment, the first metallic layer 28 comprises a metallic silver layer. The first metallic layer 28 can have a thickness in the range of 50 Å to 200 Å, preferably 75 Å to 150 Å, more preferably 80 Å to 120 Å, most preferably 90 Å to 110 Å.

An optional first primer layer 30 may be deposited over the first metallic layer 28. The first primer layer 30 can be an oxygen-capturing material, such as titanium, that can be sacrificial during the deposition process to prevent degradation or oxidation of the first metallic layer 28 during the sputtering process or subsequent heating processes. The oxygen-capturing material can be chosen to oxidize before the material of the first metallic layer 28. Non-limiting examples of suitable materials for the primer layer include titanium, cobalt, copper, silicon, zinc, aluminum, vanadium, tungsten, tantalum, niobium, zirconium, manganese, chromium, tin, nickel, germanium, magnesium, molybdenum, silver, silicon carbide, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, and alloys thereof. The primer layer material may also take the form of a metal, oxide, sub-oxide, nitride, and/or sub-nitride of any of the materials that may be used as the primer layer, as listed above. At least a portion of the primer layer may be an oxide or a nitride. In certain embodiments, a portion of the primer layer is a nitride.

For certain material compositions, the lower limit of one of the materials may be "greater than 0". When the lower limit is "greater than 0" this means that the weight percent (wt %) of that material is not equal to zero, but may be any wt % greater than 0 up to the wt % of the upper limit. For some material compositions, the composition may change before and after the layer is heated. This is due to the material reacting with species in the atmosphere, which changes the wt % distributed between the present species. Therefore, certain material compositions may have a before heating ("BH") and an after heating ("AH") weight percentage measurement to account for this change. Compositions of non-limiting examples of primer layers can be found in Table 2. Some materials may only have before heating or may only have after heating measurements due to that measurement being of more importance.

A second film 36 can be deposited over the first film 34. The second film 36 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the

TABLE 2

| Compositions of Metals for Metal Alloys Used as Primer Layers | | | |
|---|---|---|---|
| Material | Range (wt. %) | Preferred Range (wt. %) | More Preferred Range (wt. %) | Most Preferred Range (wt. %) |
| $Al_xZn_{1-x}$ | x = >0 to 30 | x = >0 to 20 | x = >0 to 15 | x = 1 to 12 |
| $Ga_xZn_{1-x}$ | x = >0 to 20 | x = >0 to 15 | x = >0 to 10 | x = 1 to 5 |
| $In_xZn_{1-x}$ | x = >0 to 40 | x = >0 to 18 | x = >0 to 15 | x = 1 to 10 |
| $V_xZn_{1-x}$ | x = >0 to 20 | x = >0 to 15 | x = >0 to 10 | x = 1 to 5 |
| $Ag_xZn_{1-x}$ | x = >0 to 50 | x = >0 to 40 | x = >0 to 30 | x = 5 to 30 |
| $Al_xTi_{1-x}$ | x = 2 to 75 (BH) | x = 2 to 60 (BH) | x = 2 to 50 (BH) | x = 2 to 40 (BH) |
| | x = 1 to 100 (AH) | x = 1 to 98 (AH) | x = 2 to 95 (AH) | x = 2 to 15 (AH) |
| | | | | x = 20 to 95 (AH) |
| $Al_xNb_{1-x}$ | x = 2 to 40 (BH) | x = 2 to 30 (BH) | x = 2 to 19 (BH) | x = 2 to 13 (BH) |
| | x = 2 to 95 (AH) | x = 2 to 80 (AH) | x = 3 to 60 (AH) | x = 4 to 45 (AH) |
| $Al_xNb_{1-x}$ nitride | x = 1 to 100 (BH) | x = 1 to 98 (BH) | x = 1 to 95 (BH) | x = 2 to 93 (BH) |
| | x = 1 to 100 (AH) | x = 2 to 75 (AH) | x = 3 to 50 (AH) | x = 4 to 40 (AH) |
| $W_xTi_{1-x}$ Sub-oxide (7% $O_2$ deposition) | x = 55 to 100 (BH) | x = 65 to 100 (BH) | x = 75 to 100 (BH) | x = 80 to 100 (BH) |
| $W_xTi_{1-x}$ sub-oxide (3% $O_2$ deposition) | x = 30 to 95 (AH) | x = 40 to 95 (AH) | x = 50 to 95 (AH) | x = 55 to 95 (AH) |
| $Ti_xTa_{1-x}$ | x = 2 to 80 (BH) | x = 2 to 60 (BH) | x = 2 to 35 (BH) | x = 2 to 20 |
| | x = 2 to 40 (AH) | x = 2 to 30 (AH) | x = 2 to 25 (AH) | (BH and AH) |
| $Ti_xNb_{1-x}$ | x = 2 to 95 (AH) | x = 2 to 93 (AH) | x = 3 to 92 (AH) | x = 5 to 90 (AH) |
| $Ti_xNb_{1-x}$ nitride | x = 1 to 65 | x = 1 to 50 | x = 1 to 40 | x = 1 to 30 |
| $Nb_xZr_{1-x}$ | x = 1 to 80 (BH) | x = 1 to 70 (BH) | x = 1 to 60 (BH) | x = 1 to 50 (BH) |
| | x = 60 to 100 (AH) | x = 70 to 100 (AH) | x = 80 to 100 (AH) | x = 85 to 100 (AH) |
| $Ta_xW_{1-x}$ | x = 2 to 95 (BH) | x = 2 to 80 (BH) | x = 3 to 60 (BH) | x = 5 to 50 (BH) |
| $W_xNb_{1-x}$ | x = 5 to 100 (BH) | x = 6 to 90 (BH) | x = 8 to 80 (BH) | x = 10 to 70 (BH) |
| | x = 2 to 50 (AH) | x = 2 to 45 (AH) | x = 2 to 40 (AH) | x = 2 to 30 (AH) |
| $W_xNb_{1-x}$ nitride | x = 2 to 90 (BH) | x = 5 to 80 (BH) | x = 7 to 75 (BH) | x = 10 to 70 (BH) |
| | x = 2 to 70 (AH) | x = 10 to 70 (AH) | x = 20 to 70 (AH) | x = 30 to 70 (AH) |
| $Zn_xTi_{1-x}$ | x = 10 to 100 (BH) | x = 10 to 80 (BH) | x = 10 to 70 (BH) | x = 10 to 60 (BH) |
| | x = 20 to 100 (AH) | x = 40 to 97 (AH) | x = 50 to 94 (AH) | x = 60 to 90 (AH) |

If titanium is used as the first primer layer 28, the titanium would preferentially oxidize to titanium dioxide before oxidation of the underlying silver layer. In one embodiment, the first primer layer 28 has a thickness in the range of 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A second dielectric layer 32 can be deposited over the first metallic layer 28 or (if present) the first primer layer 30. In the illustrated non-limiting embodiment of FIGS. 6a-d, the second dielectric layer 32 includes a first film 34 deposited over first metallic layer 28 or the first primer layer 30. The first film 34 can comprise an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the first film 34 comprises zinc oxide. In another embodiment, the first film 34 comprises aluminum zinc oxide. In another embodiment, the first film 34 comprises indium zinc oxide. In another embodiment, the first film 34 comprises gallium zinc oxide. In another embodiment, the first film 34 comprises indium tin oxide. In another embodiment, the first film 34 comprises vanadium zinc oxide.

second film 36 comprises zinc stannate. In some embodiments, like that of FIG. 6b, the first film 34 and the second film 36 are the only films of the second dielectric layer 32.

An optional third film 38 can be deposited over the second film 36 to form a multi-film second dielectric layer 32. The third film 38 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the third film 38 comprises zinc oxide. In another embodiment, the third film 38 comprises indium zinc oxide. In another embodiment, the third film 38 comprises gallium zinc oxide. In another embodiment, the third film 38 comprises indium tin oxide. In another embodiment, the third film 38 comprises vanadium zinc oxide. In one non-limiting embodiment, the first dielectric layer 20 or the second dielectric layer 32 comprises a silicon nitride film. In some embodiments, such as the ones shown in FIGS. 6a and 6c, the second dielectric layer 32 comprises a first film 34, a second film 36, and a third film 38. In some embodiments, such as FIG. 6a, the second dielectric layer 32 only has a first film 34, a second film 36, and a third film 38.

The second dielectric layer 32 can have a thickness in the range of less than or equal to 1,500 Å, such as less than or equal to 1,200 Å, such as between 400 Å to 1,200 Å, 500 Å to 1,100 Å, such as 600 Å to 1,000 Å, such as 700 Å to 900 Å, or such as 775 Å to 850 Å.

A second seed film 40 may be adjacent to or in direct contact with the second metallic layer 42 and between the second dielectric layer 32 and the second metallic layer 42. The second seed film 40 is a film comprising at least one of the following: aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, alloys thereof, oxides thereof, sub-oxides thereof, nitrides thereof, and sub-nitrides thereof. In one embodiment the second seed film 40 comprises aluminum zinc, vanadium zinc, zinc, silver zinc, metals thereof, alloys thereof, oxides thereof, or sub-oxides thereof. The compositions of the seed film can be found in previously presented Table 1.

In one embodiment, the second seed film 40 comprises $V_xZn_{1-x}$ oxide. In another embodiment, the second seed film 40 comprises $Al_xZn_{1-x}$ oxide. In another embodiment, the second seed film 40 comprises $Ga_xZn_{1-x}$ oxide. In another embodiment, the second seed film 40 comprises $In_xZn_{1-x}$ oxide. In another embodiment, the second seed film 40 comprises $Sn_xIn_{1-x}$ oxide. In another embodiment, the second seed film 40 comprises Ag deposited in an oxygen/argon gas environment. In another embodiment, the second seed film 40 comprises $Al_xAg_{1-x}$. In some embodiments, such as FIGS. 6c and 6d, the second dielectric layer 32 comprises a first film 34, a second film 36, and a second seed film 40. In some embodiments, such as FIG. 6d, the second dielectric layer 32 only has a first film 34, a second film 36, and a second seed film 40. In some embodiments, such as FIG. 6c, the second dielectric layer 32 comprises a first film 34, a second film 36, a third film 38, and a second seed film 40.

A second metallic layer 42 can be deposited over the second dielectric layer 32. The second metallic layer 42 can include any one or more of the reflective materials described above with respect to the first metallic layer 28. In one non-limiting embodiment, the second metallic layer 42 comprises silver and/or copper. The second metallic layer 42 can have a thickness in the range of 75 Å to 175 Å, preferably 100 Å to 150 Å, more preferably 110 Å to 130 Å, most preferably 119 Å to 129 Å. In another non-limiting embodiment, this second metallic layer 42 can be thicker than the first and/or third metallic layers.

A second primer layer 44 can be deposited over the second metallic layer 42. The second primer layer 44 can be any of the materials described above with respect to the first primer layer 30 and as previously described in Table 2. Examples of materials suitable for the primer layer include titanium, silicon, cobalt, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized. At least a portion of the primer layer is a nitride or an oxide. If silver zinc, zinc, silver zinc oxide, aluminum zinc oxide, indium zinc oxide, gallium zinc oxide, or vanadium zinc oxide is used as the first primer layer 30, it would preferentially oxidize before oxidation of the underlying silver layer.

In one embodiment, the second primer layer 44 comprises zinc. In another embodiment, the second primer layer 44 comprises $Ag_xZn_{1-x}$ oxide. In another embodiment, the second primer layer 44 comprises $Ag_xZn_{1-x}$. In another embodiment, the second primer layer 44 is $Al_xZn_{1-x}$ oxide. In another embodiment, the second primer layer 44 comprises $In_xZn_{1-x}$ oxide. In another embodiment, the second primer layer 44 comprises $Ga_xZn_{1-x}$ oxide. In another embodiment, the second primer layer 44 comprises $V_xZn_{1-x}$ oxide. In another embodiment, the second primer layer 44 comprises $Al_xTi_{1-x}$ oxide. In another embodiment, the second primer layer 44 comprises $Al_xNb_{1-x}$ oxide. In another embodiment, the second primer layer 44 comprises $Al_xNb_{1-x}$ nitride. In another embodiment, the second primer layer 44 comprises $W_xNb_{1-x}$ nitride. In another embodiment, the second primer layer 44 comprises $W_xTi_{1-x}$ oxide. In another embodiment, the second primer layer 44 comprises $Ti_xTa_{1-x}$ oxide. In another embodiment, the second primer layer 44 comprises $Ti_xNb_{1-x}$ oxide. In another embodiment, the second primer layer 44 comprises $Ti_xNb_{1-x}$ nitride. In another embodiment, the second primer layer 44 comprises $Nb_xZr_{1-x}$ oxide. In another embodiment, the second primer layer 44 comprises $Ta_xW_{1-x}$ oxide. In another embodiment, the second primer layer 44 comprises $W_xNb_{1-x}$ oxide. In another embodiment, the second primer layer 44 comprises $Zn_xTi_{1-x}$ oxide. In another embodiment, the second primer layer comprises titanium. The second primer layer 44 can have a thickness in the range of about 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A third dielectric layer 46 can be deposited over the second metallic layer 42 or (if present) the second primer layer 44. The third dielectric layer 46 can also include one or more materials discussed above with respect to the first and second dielectric layers 20, 32. In one non-limiting embodiment, the third dielectric layer 46 can include a first film 48. The first film 48 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the first film 48 comprises zinc oxide. In another embodiment, the first film 48 comprises aluminum zinc oxide. In another embodiment, the first film 48 comprises indium zinc oxide. In another embodiment, the first film 48 comprises gallium zinc oxide. In another embodiment, the first film 48 comprises indium tin oxide. In another embodiment, the first film 48 comprises vanadium zinc oxide.

Figure 7A:
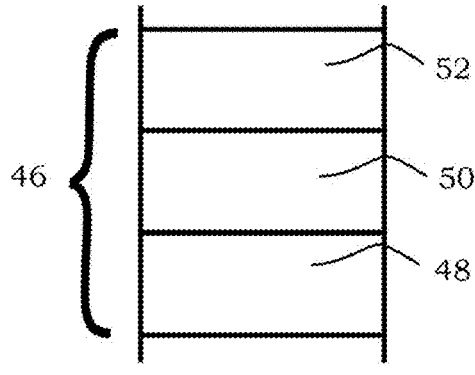
FIGS. 7a-d are cross-sectional views (not to scale) of non-limiting third dielectric layer embodiments according to the invention.
Figure 7B:
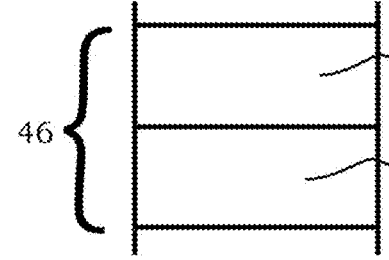

The third dielectric layer 46 can comprise a second film 50 deposited over the first film 48. In one embodiment, the second film 50 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the second film 50 comprises zinc stannate. In some embodiments, like that of FIG. 7b, the first film 48 and the second film 50 are the only films of the third dielectric layer 46.

Figure 7C:
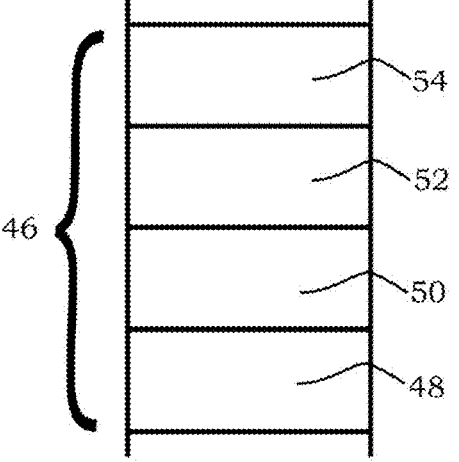

The third dielectric layer 46 can comprise an optional third film 52. The third film 52 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the third film 52 comprises zinc oxide. In another embodiment, the third film 52 comprises aluminum zinc oxide. In another embodiment, third film 52 comprises indium zinc oxide. In another embodiment, the third film 52 comprises gallium zinc oxide. In another embodiment, the third film 52 comprises indium tin oxide. In another embodiment, the third film 52 comprises vanadium zinc oxide. In some embodiments, such as the ones shown in FIGS. 7a and 7c, the third dielectric layer 46 comprises a first film 48, a second film 50, and a third film 52. In some embodiments, such as FIG. 7a, the third dielectric layer 46 only has a first film 48, a second film 50, and a third film 52.

In one non-limiting aspect of the invention, the second dielectric layer 32 and third dielectric layer 46 have thicknesses that are within 15% of each other, such as within 10%, such as within 5% of each other. The third dielectric layer 46 can have a thickness in the range of less than or equal to 1,500 Å, such as less than or equal to 1,200 Å, such as between 300 Å to 1,200 Å, 400 Å to 1,100 Å, such as 500 Å to 1,000 Å, such as 600 Å to 900 Å, such as 700 Å to 825 Å, or such as 730 to 760 Å.

A third seed film 54 may be adjacent to and/or in direct contact with the third metallic layer 56 and between the third dielectric layer 46 and the third metallic layer 56. The third seed film 54 is a film comprised of at least one of the following: aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, alloys thereof, oxides thereof, sub-oxides thereof, nitrides thereof, and sub-nitrides thereof. The compositions of the seed film can be found in previously presented Table 1. In one embodiment the third seed film 54 comprises aluminum zinc, vanadium zinc, zinc, silver zinc, metals thereof, alloys thereof, oxides thereof, or sub-oxides thereof. In another embodiment, the third seed film 54 is gallium zinc, indium zinc, indium tin, metals thereof, alloys thereof, oxides thereof, nitrides thereof, sub-nitrides thereof, or sub-oxides thereof.

Figure 7D:
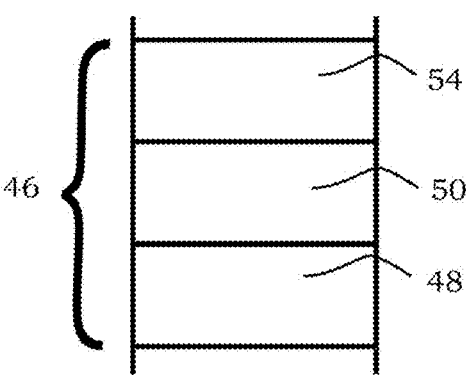

In another embodiment, the third seed film 54 comprises $V_xZn_{1-x}$ oxide. In another embodiment, the third seed film 54 comprises $Al_xZn_{1-x}$ oxide. In another embodiment, the third seed film 54 comprises $Ga_xZn_{1-x}$ oxide. In another embodiment, the third seed film 54 comprises $In_xZn_{1-x}$ oxide. In another embodiment, the third seed film 54 comprises $Sn_xIn_{1-x}$ oxide. In another embodiment, the third seed film 54 comprises Ag deposited in an oxygen/argon gas environment. In another embodiment, the third seed film 54 comprises $Al_xAg_{1-x}$. In some embodiments, such as FIGS. 7c and 7d, the third dielectric layer 46 has a first film 48, a second film 50, and a third seed film 54. In some embodiments, the second dielectric layer 46 has a first film 48, a second film 50, a third film 52, and a third seed film 54. The third seed film 54 can have a total thickness in the range of 0.5 nm to 10 nm, preferably 0.75 nm to 8 nm, more preferably 0.9 nm to 6 nm. The coating 10 can further include a third metallic layer 56 deposited over the third dielectric layer 46. The third metallic layer 56 can be any of the materials discussed above with respect to the first and second metallic layers. In another non-limiting embodiment, the third metallic layer 56 comprises aluminum doped silver. In one non-limiting embodiment, the third metallic layer 56 includes silver and/or copper. The third metallic layer 56 can have a thickness in the range of 75 Å to 175 Å, preferably 100 Å to 150 Å, more preferably 110 Å to 130 Å, most preferably 118 Å to 127 Å. In one non-limiting aspect of the invention, the first metallic layer 28 is thinner than the third metallic layer 56. In another non-limiting aspect of the invention, the second metallic layer 42 is thinner than the third metallic layer 56.

In one non-limiting embodiment, the coated article comprises only the first, second, and third metallic layers 28, 42, 56. There are no additional metallic layers in the coated article. The metallic layers may include only silver, or only silver and copper; or more than 80 wt. % silver or silver and copper.

A third primer layer 58 can be deposited over the third metallic layer 56. The third primer layer 58 can be of any of the primer materials described above with respect to the first or second primer layers 30, 44 and as previously described in Table 2. Examples of materials suitable for the primer layer include titanium, silicon, cobalt, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized. At least a portion of the primer layer is a nitride or an oxide. If silver zinc, zinc, silver zinc oxide, aluminum zinc oxide, indium zinc oxide, gallium zinc oxide, or vanadium zinc oxide is used as the first primer layer 30, it would preferentially oxidize before oxidation of the underlying silver layer.

In one embodiment, the third primer layer 58 comprises zinc. In another embodiment, the third primer layer 58 comprises $Ag_xZn_{1-x}$ oxide. In another embodiment, the third primer layer 58 comprises $Ag_xZn_{1-x}$. In another embodiment, the third primer layer 58 comprises $Al_xZn_{1-x}$ oxide. In another embodiment, the third primer layer 58 comprises $In_xZn_{1-x}$ oxide. In another embodiment, the third primer layer 58 comprises $Ga_xZn_{1-x}$ oxide. In another embodiment, the third primer layer 58 comprises $V_xZn_{1-x}$ oxide. In another embodiment, the third primer layer 58 comprises $Al_xTi_{1-x}$ oxide. In another embodiment, the third primer layer 58 comprises $Al_xNb_{1-x}$ oxide. In another embodiment, the third primer layer 58 comprises $Al_xNb_{1-x}$ nitride. In another embodiment, the third primer layer 58 comprises $W_xNb_{1-x}$ nitride. In another embodiment, the third primer layer 58 comprises $W_xTi_{1-x}$ oxide. In another embodiment, the third primer layer 58 comprises $Ti_xTa_{1-x}$ oxide. In another embodiment, the third primer layer 58 comprises $Ti_xNb_{1-x}$ oxide. In another embodiment, the third primer layer 58 comprises $Ti_xNb_{1-x}$ nitride. In another embodiment, the third primer layer 58 comprises $Nb_xZr_{1-x}$ oxide. In another embodiment, the third primer layer 58 comprises $Ta_xW_{1-x}$ oxide. In another embodiment, the third primer layer 58 comprises $W_xNb_{1-x}$ oxide. In another embodiment, the third primer layer 58 comprises $Zn_xTi_{1-x}$ oxide.

In one non-limiting embodiment, the third primer layer 58 has a thickness in the range of 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A fourth dielectric layer 60 can be deposited over the third metallic layer 56 (e.g., over the third primer layer 58). The fourth dielectric layer 60 can be comprised of one or more metal oxide or metal alloy oxide-containing layers, such as those discussed above with respect to the first, second, or third dielectric layers 20, 32, 46. Alternatively, the fourth dielectric layer can comprise silicon nitride or silicon oxynitride. In one non-limiting embodiment, the fourth dielectric layer 60 comprises a first film 62 deposited over the third metallic layer 56 or (if present) the third primer layer 58, a second film 64, deposited over the first film 62, and an optional third film 66 the second film 64. The first film 62 comprises an oxide, a nitride, an oxynitride or a mixture therefore of a metal selected from the group consisting of titanium, hafnium, zirconium, niobium, zinc, bismuth, lead, indium, tin, silicon, gallium, vanadium, and mixtures thereof. In one embodiment, the first film 62 comprises zinc oxide or zinc stannate. The first film 62 may be comprised of an oxide, a nitride, an oxynitride, or a mixture of a metal or metals selected from the group consisting of titanium, hafnium, zirconium, niobium, zinc, bismuth, lead, indium, tin, silicon, gallium, vanadium, and mixtures thereof. In one embodiment, the first film 62 comprises zinc oxide or zinc stannate. In another embodiment, the first film 62 comprises aluminum zinc oxide. In another embodiment, first film 62 comprises indium zinc oxide. In another embodiment, the first film 62 comprises gallium zinc oxide. In another embodiment, the first film 62 comprises indium tin oxide. In another embodiment, the first film 62 comprises vanadium zinc oxide.

Figure 8A:
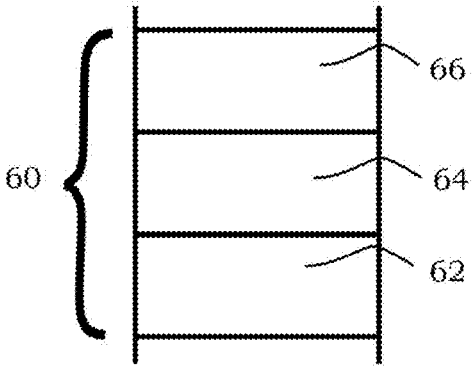
FIGS. 8*a-d* are cross-sectional views (not to scale) of non-limiting fourth dielectric layer embodiments according to the invention.
Figure 8B:
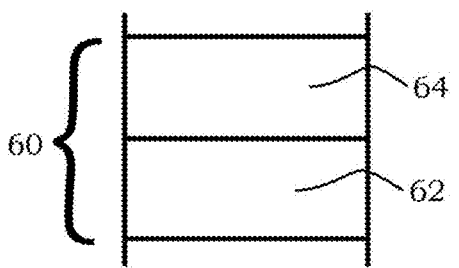
Figure 8C:
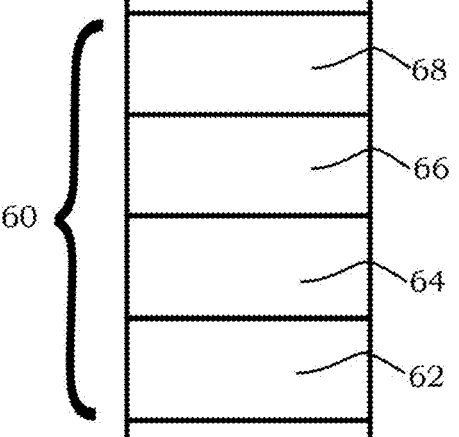

The fourth dielectric layer 60 can comprise a second film 64 deposited over the first film 62. In one embodiment, the second film 64 comprises an oxide, a nitride, an oxynitride or a mixture therefore of a metal selected from the group consisting of titanium, hafnium, zirconium, niobium, zinc, bismuth, lead, indium, tin, silicon, gallium, vanadium, and mixtures thereof. In one embodiment, the second film 64 comprises zinc stannate, silicon nitride or silicon oxynitride. In some embodiments, like that of FIG. 8b, the first film 62 and the second film 64 are the only films of the fourth dielectric layer 60. The fourth dielectric layer 60 can comprise an optional third film 66 deposited over the second film 64. The third film comprise an oxide, a nitride, an oxynitride or a mixture therefore of a metal selected from the group consisting of titanium, hafnium, zirconium, niobium, zinc, bismuth, lead, indium, tin, silicon, gallium, vanadium, and mixtures thereof. In one embodiment, the third film 66 comprises zinc oxide, silicon oxynitrides or silicon nitride. In another embodiment, the third film 66 comprises zinc oxide. In another embodiment, the third film 66 comprises aluminum zinc oxide. In another embodiment, the third film 66 comprises indium zinc oxide. In another embodiment, the third film 66 comprises gallium zinc oxide. In another embodiment, the third film 66 comprises indium tin oxide. In another embodiment, the third film 66 comprises vanadium zinc oxide. In some embodiments, such as the ones shown in FIGS. 8a and 8c, the fourth dielectric layer 60 comprises a first film 62, a second film 64, and a third film 66. In some embodiments, such as FIG. 8a, the fourth dielectric layer 60 only has a first film 62, a second film 64, and a third film 66.

In one non-limiting embodiment, the first and third films 62, 66 of the fourth dielectric layer 60 can each have a thickness in the range of about 50 Å to 200 Å, e.g., 75 Å to 150 Å, e.g., 100 Å. The second film 78 can have a thickness in the range of 250 Å to 900 Å, e.g., 275 Å to 800 Å, e.g., 300 Å to 775 Å, e.g., 350 Å to 710 Å.

In embodiments where the fourth dielectric layer 60 is the top most or uppermost dielectric layer, the fourth dielectric layer can have a thickness in the range of less than or equal to 1,000 Å, such as less than or equal to 600 Å, such as between 200 Å to 600 Å, 250 Å to 550 Å, such as 300 Å to 500 Å, such as 325 Å to 475 Å, or such as 360 Å to 390 Å. In embodiments where the fourth dielectric layer 60 is the top most dielectric layer, both the first dielectric layer 20 and fourth dielectric layer 60 can be thinner than the second dielectric layer 32 and third dielectric layer 46.

Figure 8D:
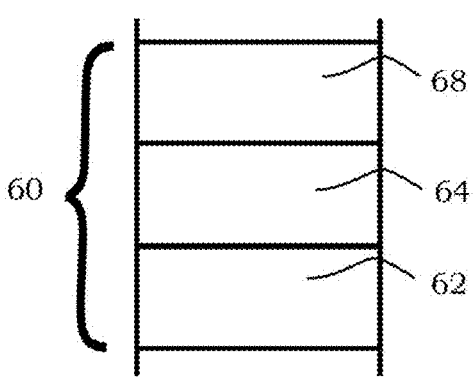

A fourth seed film 68 may be adjacent to or in direct contact with the fourth metallic layer 70 and between the fourth dielectric layer 60 and the fourth metallic layer 70. The fourth seed film 68 is a film comprised of at least one of the following: aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, alloys thereof, oxides thereof, sub-oxides thereof, nitrides thereof, and sub-nitrides thereof. In one embodiment the fourth seed film 68 comprises aluminum zinc, vanadium zinc, zinc, silver zinc, metals thereof, alloys thereof, oxides thereof, or sub-oxides thereof. In another embodiment, the fourth seed film 68 comprises gallium zinc, indium zinc, indium tin, metals thereof, alloys thereof, oxides thereof, nitrides thereof, sub-nitrides thereof, or sub-oxides thereof. The compositions of the seed film can be found in previously presented Table 1. In another embodiment, the fourth seed film 68 comprises $V_x Zn_{1-x}$ oxide. In another embodiment, the fourth seed film 68 comprises $Al_x Zn_{1-x}$ oxide. In another embodiment, the fourth seed film 68 comprises $Ga_x Zn_{1-x}$ oxide. In another embodiment, the fourth seed film 68 comprises $In_x Zn_{1-x}$ oxide. In another embodiment, the fourth seed film 68 comprises $Sn_x In_{1-x}$ oxide. In another embodiment, the fourth seed film 68 comprises Ag deposited in an oxygen/argon gas environment. In another embodiment, the fourth seed film 68 comprises $Al_x Ag_{1-x}$. In some embodiments, such as FIGS. 8c and 8d, the fourth dielectric layer 60 comprises a first film 62, a second film 64, and a fourth seed film 68. In some embodiments, such as FIG. 8d, the fourth dielectric layer 60 only has a first film 62, a second film 64, and a fourth seed film 68. In some embodiments, such as FIG. 8c, the fourth dielectric layer 60 comprises a first film 62, a second film 64, a third film 66, and a fourth seed film 68. The fourth seed film can have a total thickness in the range of 0.5 nm to 10 nm, preferably 0.75 nm to 8 nm, more preferably 0.9 nm to 6 nm.

Figure 4A:
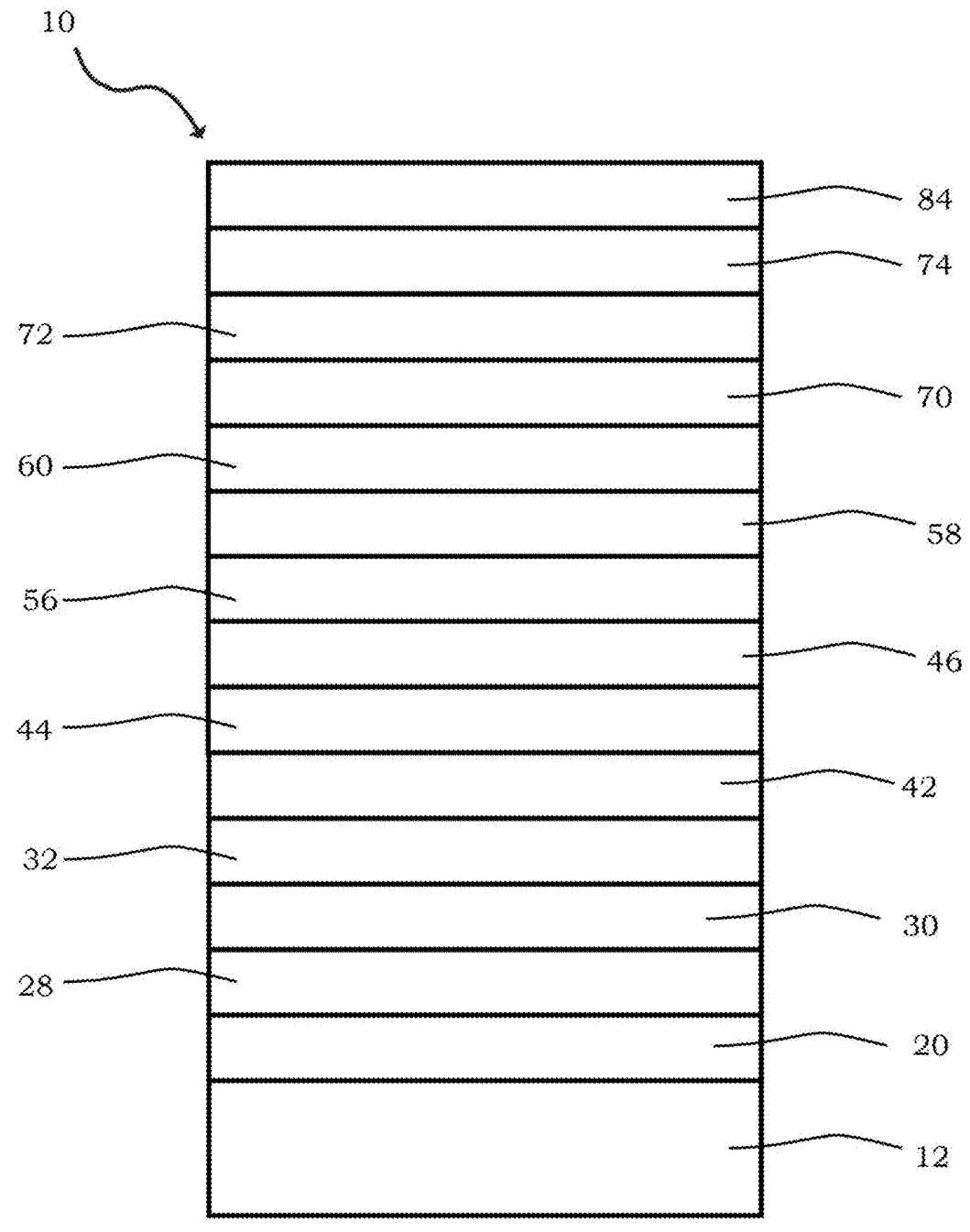
FIG. 4a is a cross-sectional view (not to scale) of a non-limiting coating according to the invention.
Figure 4B:
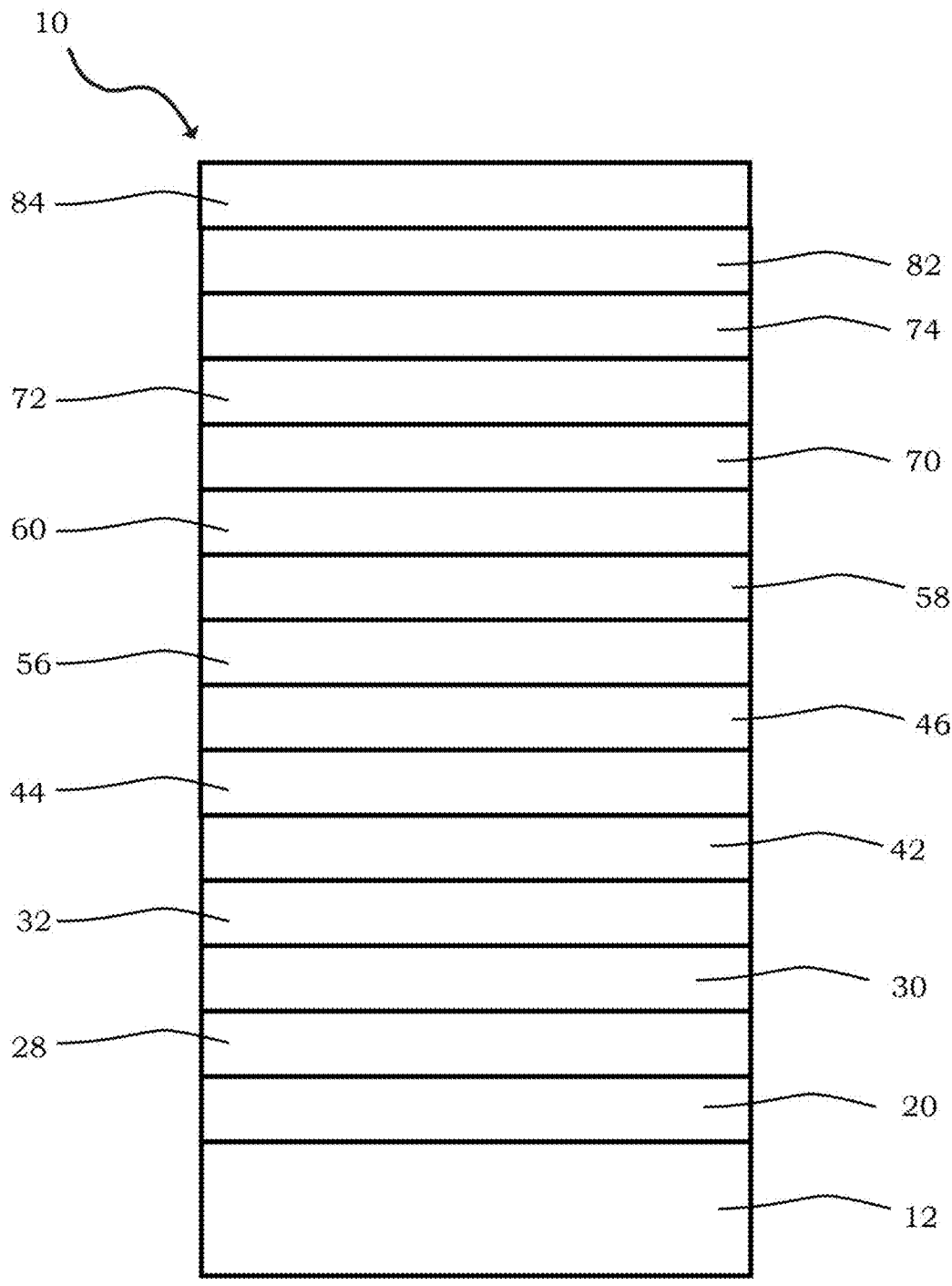
FIG. 4b is a cross-sectional view (not to scale) of a non-limiting coating according to the invention.

Another exemplary non-limiting coating 10 suitable for the invention is shown in FIGS. 4a and 4b. The coating 10 can further include a fourth metallic layer 70 deposited over or in direct contact with at least a portion of the fourth dielectric layer 60. The fourth metallic layer 70 can be of any of the materials discussed above with respect to the first, second, or third metallic layers. In another non-limiting embodiment, the fourth metallic layer 70 includes aluminum doped silver. In one non-limiting embodiment, the third metallic layer 70 includes silver and/or copper. The fourth metallic layer 70 can have a thickness in the range of 50 Å to 175 Å, preferably 75 Å to 150 Å, more preferably 80 Å to 120 Å, most preferably 90 Å to 110 Å. In one non-limiting aspect of the invention, the first metallic layer 28 and fourth metallic layer 70 have thicknesses that are within 20% of each other, such as within 15%, such as within 5% to 10% of each other.

In one non-limiting embodiment, the coated article comprises only the first, second, third, and fourth metallic layers 28, 42, 56, 70. There are no additional metallic layers in the coated article. The metallic layers may include only silver or only silver and copper; or more than 80 wt. % silver or silver and copper. Each metallic layer has a thickness. The sum of the thickness of all of the metallic layers is at least 30 nm and at most 60 nm, such as at least 35 and at most 47 nm. In one non-limiting embodiment, the total combined thickness of the metallic layers is no more than 50 nanometers, such as no more than 47 nm, such as no more than 43 nanometers. In another non-limiting embodiment, the total combined thickness of the metallic layers is at least 30 nm, at least 32 nm, at least 34 nm, at least 35 nm, at least 38 nm or at least 40 nm.

A fourth primer layer 72 can be deposited over or in direct contact with at least a portion of the fourth metallic layer 70. The fourth primer layer 72 can be any of the primer materials described above with respect to the first, second, or third primer layers 30, 44, 58 and in previously presented Table 2. Examples of materials suitable for the primer layer include titanium, cobalt, silicon, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized. At least a portion of the primer layer is a nitride or an oxide. If silver zinc, zinc, silver zinc oxide, aluminum zinc oxide, indium zinc oxide, gallium zinc oxide, or vanadium zinc oxide is used as the first primer layer 30, it would preferentially oxidize before oxidation of the underlying silver layer.

In one embodiment, the fourth primer layer 72 comprises zinc. In another embodiment, the fourth primer layer 72 comprises $Ag_xZn_{1-x}$ oxide. In another embodiment, the fourth primer layer 72 comprises $Ag_xZn_{1-x}$. In another embodiment, the fourth primer layer 72 is $Al_xZn_{1-x}$ oxide. In another embodiment, the fourth primer layer 72 comprises $In_xZn_{1-x}$ oxide. In another embodiment, the fourth primer layer 72 comprises $Ga_xZn_{1-x}$ oxide. In another embodiment, the fourth primer layer 72 comprises $V_xZn_{1-x}$ oxide. In another embodiment, the fourth primer layer 72 comprises $Al_xTi_{1-x}$ oxide. In another embodiment, the fourth primer layer 72 comprises $Al_xNb_{1-x}$ oxide. In another embodiment, the fourth primer layer 72 comprises $Al_xNb_{1-x}$ nitride. In another embodiment, the fourth primer layer 72 comprises $W_xNb_{1-x}$ nitride. In another embodiment, the fourth primer layer 72 comprises $W_xTi_{1-x}$ oxide. In another embodiment, the fourth primer layer 72 comprises $Ti_xTa_{1-x}$ oxide. In another embodiment, the fourth primer layer 72 comprises $Ti_xNb_{1-x}$ oxide. In another embodiment, the fourth primer layer 72 comprises $Ti_xNb_{1-x}$ nitride. In another embodiment, the fourth primer layer 72 comprises $Nb_xZr_{1-x}$ oxide. In another embodiment, the fourth primer layer 72 comprises $Ta_xW_{1-x}$ oxide. In another embodiment, the fourth primer layer 72 comprises $W_xNb_{1-x}$ oxide. In another embodiment, the fourth primer layer 72 comprises $Zn_xTi_{1-x}$ oxide. The fourth primer layer 72 has a thickness in the range of 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å. A fifth dielectric layer 74 can be deposited over or in direct contact with the fourth metallic layer 70 or (if present) the fourth primer layer 72. The fifth dielectric layer 74 can be comprised of one or more metal oxide or metal alloy oxide-containing layers, such as those discussed above with respect to the first, second, third, or fourth dielectric layers 20, 32, 46, 60. In one non-limiting embodiment, the fifth dielectric layer 74 comprises a first film 76 deposited over or in direct contact with the fourth metallic layer 70 or the fourth primer layer 72. The first film 76 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the first film 76 comprises zinc oxide or zinc stannate. In another embodiment, the first film 76 comprises aluminum zinc oxide. In another embodiment, the first film 76 comprises indium zinc oxide. In another embodiment, the first film 76 comprises gallium zinc oxide. In another embodiment, the first film 76 comprises indium tin oxide. In another embodiment, the first film 76 comprises vanadium zinc oxide.

Figure 9A:
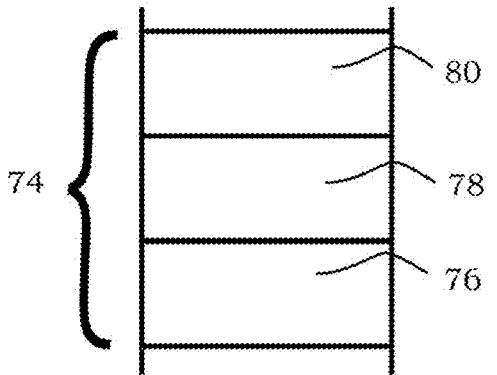
FIGS. 9*a-b* are cross-sectional views (not to scale) of non-limiting fifth dielectric layer embodiments according to the invention.
Figure 9B:
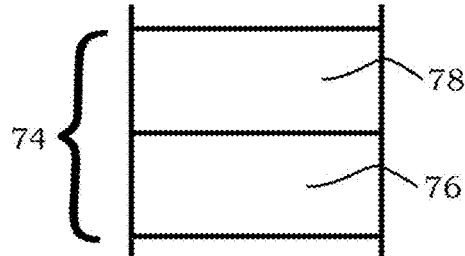

The fifth dielectric layer 74 can comprise a second film 78 deposited over or in direct contact with at least a portion of the first film 76. In one embodiment, the second film 78 comprises an oxide, a nitride, an oxynitride or a mixture therefore of a metal selected from the group consisting of titanium, hafnium, zirconium, niobium, zinc, bismuth, lead, indium, tin, silicon, aluminum, gallium, vanadium, and mixtures thereof. In one embodiment, the second film 76 comprises zinc stannate, silicon nitride or silicon oxynitride. In some embodiments, such as FIG. 9b, the first film 76 and second film 78 are the only films of the fifth dielectric layer 74.

The fifth dielectric layer 86 can comprise an optional third film 80 deposited over the second film 76. The third film 80 comprises an oxide, a nitride, an oxynitride or a mixture thereof of a metal selected from the group consisting of titanium, hafnium, zirconium, niobium, zinc, bismuth, lead, indium, tin, silicon, aluminum, gallium, vanadium, and mixtures thereof. In one embodiment, the third film 80 comprises zinc oxide, silicon oxynitrides or silicon nitride. In another embodiment, the third film 80 comprises silicon nitride. In another embodiment, the third film 80 comprises zinc oxide. In another embodiment, the third film 80 comprises aluminum zinc oxide. In another embodiment, third film 80 comprises indium zinc oxide. In another embodiment, the third film 80 comprises gallium zinc oxide. In another embodiment, the third film 80 comprises indium tin oxide. In another embodiment, the third film 80 comprises vanadium zinc oxide. In some embodiments, such as FIG. 9a, the fifth dielectric layer 74 comprises a first film 76, a second film 78, and a third film 80.

The fifth dielectric layer 74 can have a thickness in the range of less than or equal to 1,000 Å, such as less than or equal to 800 Å, such as between 200 Å to 700 Å, 275 Å to 600 Å, such as 300 Å to 500 Å, such as 325 Å to 475 Å, or such as 350 Å to 460 Å.

In embodiments where the article comprises a fifth dielectric layer 74, the fourth dielectric layer 60 can have a thickness in the range of less than or equal to 1,400 Å, such as less than or equal to 1,200 Å, such as between 400 Å to 1,200 Å, 500 Å to 1,000 Å, such as 600 Å to 800 Å, such as 675 Å to 725 Å, or such as 690 Å to 710 Å. In embodiments where the fifth dielectric layer 74 is the top most dielectric layer, both the first dielectric layer 20 and fifth dielectric layer 74 can be thinner than the second dielectric layer 32, third dielectric layer 46, and fourth dielectric layer 60.

The coating 10 can include an outermost protective layer 84, which, for example in the non-limiting embodiment shown in FIGS. 1a-4b, is deposited over the uppermost dielectric layer, to assist in protecting the underlying layers, such as the metallic layers, from mechanical and chemical attack during processing. In one non-limiting embodiment, the protective layer 84 can be deposited over the second dielectric layer 32, third dielectric layer 46, fourth dielectric layer 60, or the fifth dielectric layer 74. In another non-limiting embodiment, the protective layer 84 can be disposed over and optionally in direct contact with the metallic layer 32, 56, or 70; or the primer layer 44, 58, or 72. The protective layer 84 can be an oxygen barrier coating layer to prevent or reduce the passage of ambient oxygen into the underlying layers of the coating 10, such as during heating or bending. The protective layer 84 can be of any desired material or mixture of materials. In one exemplary embodiment, the protective layer 84 can include a layer having one or more metal oxide or nitride materials, such as but not limited to oxides and/or nitrides of aluminum, silicon, or mixtures thereof. For example, the protective coating 84 can be a single coating layer comprising in the range of 0 wt. % to 100 wt. % alumina and/or 100 wt. % to 0 wt. % silica, such as 5 wt. % to 95 wt. % alumina 45 and 95 wt. % to 5 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 70 wt. % alumina and 50 wt. % to 30 wt. % silica, such as 35 wt. % to 100 wt. % alumina and 65 wt. % to 0 wt. % silica, e.g., 70 wt. % to 90 wt. % alumina and 30 wt. % to 10 wt. % silica, e.g., 75 wt. % to 85 wt. % alumina and 25 wt. % to 15 wt. % of silica, e.g., 88 wt. % alumina and 12 wt. % silica, e.g., 65 wt. % to 75 wt. % alumina and 35 wt. % to 25 wt. % silica, e.g., 70 wt. % alumina and 30 wt. % silica, e.g., 60 wt. % to less than 75 wt. % alumina and greater than 25 wt. % to 40 wt. % silica. Other materials, such as aluminum, chromium, hafnium, yttrium, nickel, boron, phosphorous, titanium, zirconium, and/or oxides thereof, can also be present, such as to adjust the refractive index of the protective layer 84. In one non-limiting embodiment, the refractive index of the protective layer 84 can be in the range of 1 to 3, such as 1 to 2, such as 1.4 to 2, such as 1.4 to 1.8.

In one non-limiting embodiment, the protective layer 84 is a combination silica and alumina coating. The protective coating 84 can be sputtered from two cathodes (e.g., one silicon and one aluminum) or from a single cathode containing both silicon and aluminum. This silicon/aluminum oxide protective layer 84 can be written as $Si_xAl_{1-x}O_{(1.5+x)/2}$, where x can vary from greater than 0 to less than 1.

In another non-limiting embodiment, the protective layer 80, 92 comprises a combination of titania and alumina.

In one non-limiting embodiment, the protective layer 84 may be comprised of silicon nitride ($Si_3N_4$), silicon oxynitride (SiON), silicon aluminum nitride (SiAlN), silicon aluminum oxynitride (SiAlON), a mixture thereof, and/or an alloy thereof, and which may provide increased durability to the metallic functional layer 28, 42, 56, or 70. The protective layer 84 may be formed of silicon nitride deposited with other materials having superior electrical conductivity to improve sputtering of the silicon. For example, during deposition, the silicon cathode can include a small amount (e.g., up to 20 wt. %, up to 15 wt. %, up to 10 wt. %, or up to 5 wt. %) of aluminum to improve sputtering. In which case, the resultant silicon nitride protective layer would include a small percentage of aluminum, e.g., up to 15 wt. % aluminum, e.g., up to 10 wt. % aluminum, e.g., up to 5 wt. % aluminum. A coating layer deposited from a silicon cathode having up to 10 wt. % aluminum (added to enhance the conductivity of the cathode) is referred to herein as "a silicon nitride" layer, even though a small amount of aluminum may be present. The small amount of aluminum in the cathode (e.g., less than or equal to 15 wt. %, such as less than or equal to 10 wt. %, such as less than or equal to 5 wt. %) is believed to form aluminum nitride in the predominantly silicon nitride protective layer 84. The protective layer 84 may be formed in a nitrogen atmosphere; however, it is to be understood that other gasses, such as oxygen, may be present in the atmosphere during the deposition of the protective layer 84.

The protective layer can be of any desired thickness. Protective layer 84 can have a thickness in the range of 10 Å to 800 Å, such as 100 Å to 800 Å, such as 100 Å to 600 Å, such as 350 Å to 550 Å. In one non-limiting embodiment, the protective coating 84 is a silicon/aluminum oxide coating ($Si_xAl_{1-x}O_{(1.5+x)/2}$) having a thickness in the range of 50 Å to 50,000 Å, such as 50 Å to 10,000 Å, such as 100 Å to 1,000 Å, e.g., 100 Å to 500 Å, such as 100 Å to 400 Å, such as 350 Å to 400 Å, such as 380 Å. The protective layer 84 is the outermost layer of the coated article. Further, the protective layer 84 can be of non-uniform thickness. By "non-uniform thickness" is meant that the thickness of the protective layer 84 can vary over a given unit area, e.g., the protective layer 84 can have high and low spots or areas.

In another non-limiting embodiment, the protective coating 84 can be a multilayer coating comprising a first film and a second film formed over the first film. The first film can comprise alumina, silica, titania, zirconia, tin oxide, or mixtures thereof. In one specific non-limiting embodiment, the first film can comprise alumina or a mixture or alloy comprising alumina and silica. For example, the first film can comprise a silica/alumina mixture having greater than 5 wt. % alumina, such as greater than 10 wt. % alumina, such as greater than 15 wt. % alumina, such as greater than 30 wt. % alumina, such as greater than 40 wt. % alumina, such as 50 wt. % to 70 wt. % alumina, such as in the range of 60 wt. % to 100 wt. % alumina and 40 wt. % to 0 wt. % silica, e.g. 60 wt. % alumina and 40 wt. % silica. In another example, the first layer can comprise zinc stannate. In another example, the first film can comprise zirconia. In one non-limiting embodiment, the first film can have a thickness in the range of greater than 0 Å to 1 micron, such as 100 Å to 250 Å, such as 101 A to 250 Å, such as 150 Å to 200 Å, such as 160 Å.

The second film of the protective layer 84 may comprise, for example, a metal oxide or metal nitride. The second film can be titania, alumina, silica, zirconia, tin oxide, a mixture thereof, or an alloy thereof. For example, the second film may include a mixture of titania and alumina; a mixture of titania and silica; or zirconia. An example of the second film can comprise a titania/alumina mixture having 40-60 wt. % alumina, and 60-40 wt. % titania; 45-55 wt. % alumina, and 55-45 wt. % titania; 48-52 wt. % alumina, and 52-48 wt. % titania; 49-51 wt. % alumina, and 51-49 wt. % titania; or 50 wt. % alumina, and 50 wt. % titania. An example of the second film may include titanium aluminum oxide (TiAlO). Another example of the second film is a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 90 wt. % silica and 10 wt. % to 20 wt. % alumina, e.g., 85 wt. % silica and 15 wt. % alumina. In one non-limiting embodiment, the second film can have a thickness in the range of greater than 0 Å to 2 microns, such as 50 Å to 5,000 Å, such as 50 Å to 2,000 Å, such as 100 Å to 1,000 Å, such as 200 Å to 500 Å, such as 220 Å to 350 Å, such as 220 Å. Non-limiting examples of suitable protective layers are described, for example, in U.S. patents application Ser. Nos. 10/007,382; 10/133,805; 10/397,001; 10/422,094; 10/422,095; and 10/422,096.

In non-limiting examples, the protective layer 84 may include an additional third film formed over the second film. This third film can be any of the materials used to form the first film or the second film. The third film, for example, can comprise alumina, silica, titania, zirconia, tin oxide, or mixtures thereof. For example, the third film can comprise a mixture of silica and alumina. In another example, the third film comprises zirconia.

In between the top dielectric layer and the protective layer 84, and over at least a portion of or in direct contact with the top dielectric layer, may be a stress layer 82. The stress layer 82 is added underneath the protective layer 84 to reduce the sheet resistance of the coating. The stress layer 82 may have a thickness between 0.5-30 nm, preferably 1-25 nm, more preferably 1-20 nm, or most preferably 1-18 nm. In certain embodiments, the stress layer 82 can comprise silicon, cobalt, titanium, niobium, zirconium, tantalum, oxygen, and/or titanium. In one embodiment, the stress layer 82 comprises silicon cobalt. In one embodiment, the stress layer 82 comprises $Ti_xNb_{1-x}$ suboxide or oxide, wherein x is within the range of 1-100 wt % (BH and AH). In another embodiment, the stress layer 82 comprises $Nb_xZr_{1-x}$ suboxide or oxide, wherein x is within the range of 1-12 wt % AH, preferably 1-11 wt % AH, more preferably 1-11 wt % AH, and most preferably 1-10 wt % AH. In another embodiment, the stress layer 82 comprises $Ti_xTa_{1-x}$ suboxide or oxide, wherein x is within the range of 1-100 wt % AH, preferably 1-20 wt % AH or 30-100 wt % AH, more preferably 1-10 wt % AH or 500 wt % AH, and most preferably 1-4 wt % AH or 60-100 wt % AH. In another embodiment, the stress layer 82 comprises $Si_xCo_{1-x}$ suboxide or oxide, wherein x is within the range of 10-90 wt % AH, preferably 15-90 wt % AH, more preferably 18-90 wt % AH, and most preferably 20-90 wt % AH.

In the non-limiting embodiment illustrated in FIGS. 10 and 11, the bus bar assembly 120 includes a first or bottom bus bar 104 and a second or top bus bar 106 formed on the inner surface 16 of the outer ply 12 and separated by a bus bar to bus bar distance D. The bus bars 104, 106 are in electrical contact with the coating 10. The bus bar assembly 120 also includes a first conductive lead or strip 116 connected to the first bus bar 104 and a second conductive lead or strip 118 connected to the second bus bar 106. Each of the leads 116, 118 is connected to the power source 122. The bus bars 104, 106 and/or the conductive strips 116, 118 can be formed of conductive metal foil or strips (such as but not limited to copper foil or tinned copper foil), or can be formed by conductive coatings (such as ceramic coatings), or combinations thereof. In one non-limiting embodiment of the invention, bus bars 104 and 106 can be positioned at least partially on, or completely on, the decorative band 102 (as shown in FIG. 11).

The power source 122 can be any conventional power source. However, in one non-limiting embodiment, the power source 122 is a conventional vehicle alternator configured to supply in the range of 13 volts to 15 volts, e.g., approximately 14 volts.

Figure 12:
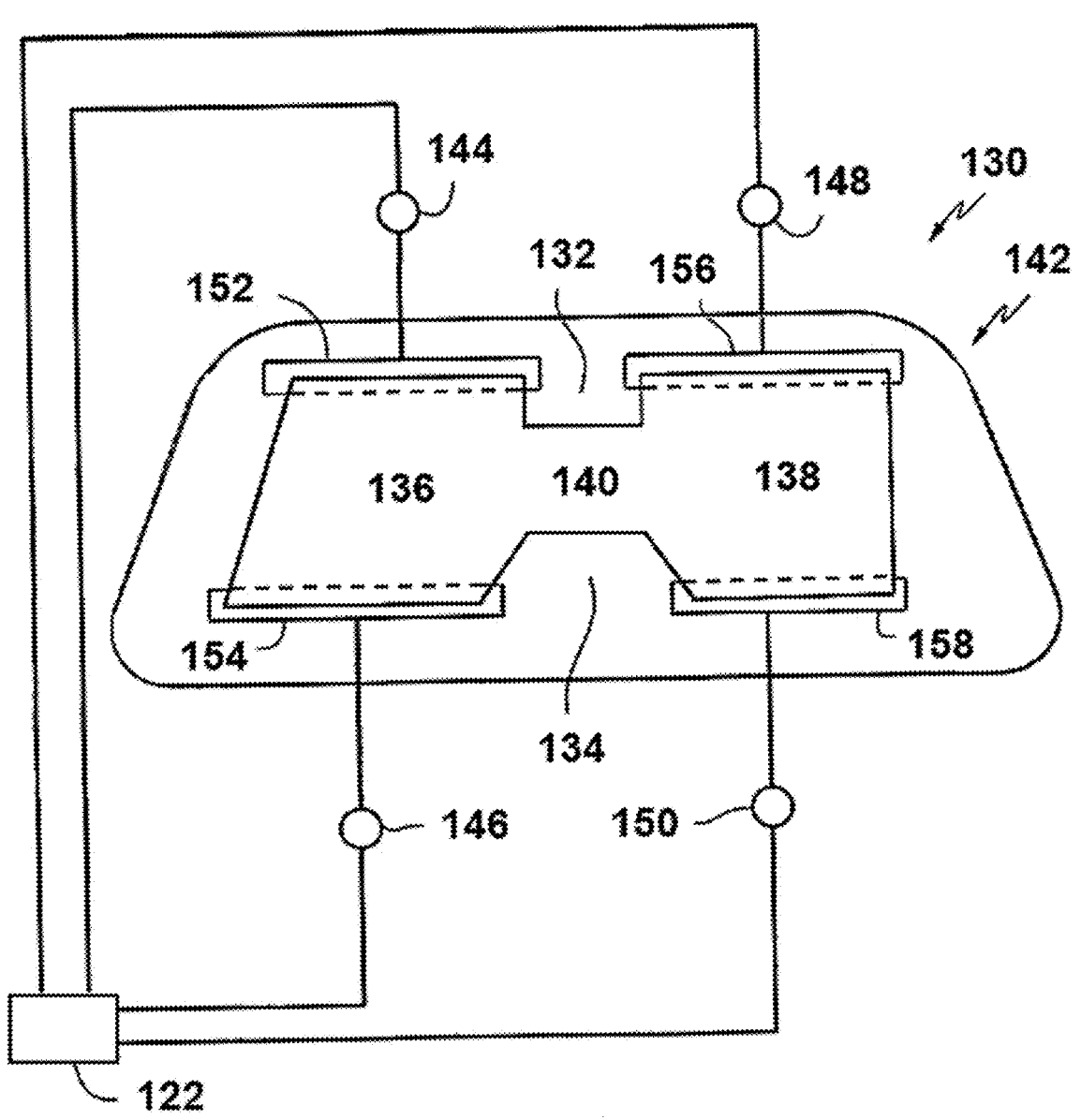
FIG. 12 is a schematic view (not to scale) of another windshield incorporating features of the invention.

A further transparency 130 incorporating features of the present invention is shown in FIG. 12. The construction of transparency 130 is similar to the transparency 100 but the coating 10 includes one or more "cut-out" areas, such as cut-outs 132 and 134. The cut outs 132 and 134 divide the coating 10 into a first major portion 136, a second major portion 138, and a central portion 140. The bus bar assembly

142 in this non-limiting embodiment is a quad-feed assembly, i.e., has four connectors 144, 146, 148, and 150 connected to four bus bars 152, 154, 156, and 158, respectively. Bus bars 152 and 154 provide power primarily to the first major portion 136 and bus bars 156 and 158 provide power primarily to the second major region 138.

In one non-limiting embodiment of the invention, the coating 30 is configured or dimensioned to provide a power density of 2 to 10 watts per decimeter (W/dm²) at a bus bar to bus bar distance D (see FIG. 10) in the range of 24 inches to 30 inches (60 cm to 75 cm), such as 4 to 8 W/dm², such as 5 to 6 W/dm², when the coating is in electrical contact with a conventional vehicle alternator, such as a conventional alternator producing 80 amps and 14 volts. It is believed that such a power density is sufficient to melt ice found in contact with outer surface 14 of the substrate 12. For vision panels (such as a windshield) in the United States, the transparency should also have a visible light transmittance of greater than or equal to 70%, such as greater than or equal to 71%. As will be appreciated by one skilled in the art, several different competing factors need to be balanced to provide a coating having sufficient conductivity and also sufficient transmittance. For example, as the distance D between the bus bars increases (i.e., the transparency becomes wider from top to bottom), the bus bar to bus bar resistance increases. As the bus bar to bus bar resistance increases, the power density decreases. In order to maintain the power density as the bus bar to bus bar distance is increased, the resistivity of the coating must decrease. One way of decreasing the resistivity is by increasing the thickness of one or more of the silver layers and/or by increasing the number of silver layers. In one non-limiting practice of the invention, the thickness and/or number of silver layers is configured to give a total resistivity for the coating of 0.6 to 1.5 ohms per square ($\Omega/\square$), such as 0.6 to 1.0 ohms per square (Q/D), such as 0.6 to 0.9 ohms per square ($\Omega/\square$). In one non-limiting practice of the invention, the thickness and/or number of silver layers is configured to give a total resistivity for the coating not more than 0.850 ohms per square ($\Omega/\square$), such as not more than 0.800 ohms per square ($\Omega/\square$), such as not more than 0.695 ohms per square ($\Omega/\square$). However, as will also be appreciated by one skilled in the art, as the number or thickness of the silver layers increases, the visible light transmittance decreases. For forward vision areas of a vehicle, such as a windshield, the thickness and/or number of silver layers should not be increased to the point where visible light transmittance of the vision area falls below about 70%.

In one non-limiting practice of the invention, the coating provides a visible light reflectance of not more than 25%. For example, not more than 20%, such as not more than 10%, such as not more than 8%.

In one non-limiting practice of the invention, the coating 30 provides an exterior reflected a* at an 8 degree angle (Rg8a*) in the range of 0 to −10. For example, in the range of −1 to −8, preferably −1.2 to −7.0, more preferably −1.5 to −6.8, most preferably −1.7 to −6.5.

In one non-limiting practice of the invention, the coating 30 provides an exterior reflected b* at an 8 degree angle (Rg8b*) in the range of 2 to −8. For example, in the range of 2.5 to −8.0, preferably 2.0 to −7.5, more preferably 1.8 to −7.3, most preferably 1.5 to −7.0.

An embodiment of the invention is a vehicle transparency that has only three metal layers that are sandwiched between dielectric layers. Each metal layer has a thickness. The combined thickness of all three metal layers is between 30 nm and 60 nm; preferably between 32 nm and 47 nm; more preferably between 34 nm and 45 nm; most preferably between 35 nm and 43 nm. This vehicle transparency can have the coating according as shown in Table 3.

TABLE 3

| Layer | Exemplary Material | Thickness (nm unless otherwise indicated) |
|---|---|---|
| Substrate | Glass | 1 mm-10 mm; preferably 1 mm-5 mm; more preferably 1.5 mm-2.5 mm; most preferably 1.8 mm-2.3 mm |
| $1^{st}$ Dielectric Layer | $1^{st}$ film: ZnO, AlZnO, GaZnO, InZnO, InSnO, and/or VZnO; $2^{nd}$ film: $Zn_2SnO_4$ | 30-60; preferably 40-55; more preferably 45-50; most preferably 46.5-48 |
| $1^{st}$ Seed Film | VZnO, AlZnO, GaZnO, InZnO, SnInO, Ag, and/or Al doped Ag | 0.5-10 nm; preferably 0.75-8; more preferably 0.9-6 |
| $1^{st}$ Metallic Layer | Ag, Cu, and/or Al doped Ag | 5-20; preferably 7.5-17.5; more preferably 10-15; most preferably 11-14 |
| $1^{st}$ Primer Layer | Ti, TiAl, Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| $2^{nd}$ Dielectric Layer | $1^{st}$ film: ZnO, AlZnO, GaZnO, InZnO, InSnO, and/or VZnO; $2^{nd}$ film: $Zn_2SnO_4$; $3^{rd}$ film: ZnO, AlZnO, GaZnO, InZnO, InSnO, and/or VZnO | 40-110; preferably 50-100; more preferably 60-90; most preferably 72-80 |
| $2^{nd}$ Seed Film | VZnO, AlZnO, GaZnO, InZnO, SnInO, Ag, and/or Al doped Ag | 0.5-10 nm; preferably 0.75-8; more preferably 0.9-6 |
| $2^{nd}$ Metallic Layer | Ag, Cu, and/or Al doped Ag | 5-20; preferably 7.5-17.5; more preferably 10-15; most preferably 12.5-14.5 |
| $2^{nd}$ Primer Layer | Ti, TiAl, Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| $3^{rd}$ Dielectric Layer | $1^{st}$ film: ZnO, AlZnO, GaZnO, InZnO, InSnO, and/or VZnO; $2^{nd}$ film: $Zn_2SnO_4$; $3^{rd}$ film: ZnO, AlZnO, GaZnO, InZnO, InSnO, and/or VZnO | 40-110; preferably 50-100; more preferably 60-90; most preferably 70-82.5 |
| $3^{rd}$ Metallic Layer | Ag and/or Cu | 5-20; preferably 7.5-17.5; more preferably 10-15; most preferably 11-14.5 |
| $3^{rd}$ Seed Film | VZnO, AlZnO, GaZnO, InZnO, SnInO, Ag, and/or Al doped Ag | 0.5-10 nm; preferably 0.75-8; more preferably 0.9-6 |
| $3^{rd}$ Primer Layer | Ti, TiAl, Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| $4^{th}$ Dielectric Layer | $1^{st}$ film: ZnO, $Zn_2SnO_4$, AlZnO, GaZnO, InZnO, InSnO, and/or VZnO; $2^{nd}$ film: SiON and/or $Zn_2SnO_4$ $3^{rd}$ film: $Si_3N_4$, AlZnO, GaZnO, InZnO, InSnO, and/or VZnO | 25-60; preferably 30-50; more preferably 32.5-45; most preferably 35-40 |
| Optional Stress Layer | TiNb sub-oxide or oxide, NbZr sub-oxide or oxide, TiTa sub-oxide or oxide, and/or SiCo sub-oxide or oxide | 0.5-30; preferably 1-25; more preferably 10-60; most preferably 1-18 |
| Optional Protective Coat | SiAlO, TiAlO, SiAlN or SiAlON | 1-80; preferably 10-80; more preferably 10-60; most preferably 35-55 |
| Total Metal Layer Thickness ($1^{st}$, $2^{nd}$, and $3^{rd}$ metallic layer) | Cu, Ag, and/or Al doped Ag | 38-60; preferably 38-50; more preferably 38-45; most preferably 38-42 |

An embodiment of the invention is a vehicle transparency that has only four metal layers that are sandwiched between dielectric layers. Each metal layer has a thickness. The combined thickness of all four metal layers is between 30 nm and 60 nm; preferably between 35 nm and 50 nm; more preferably between 39 nm and 48 nm; most preferably between 40 nm and 47 nm. This vehicle transparency can have the coating according as shown in Table 4.

TABLE 4

| Layer | Exemplary Material | Thickness (nm unless otherwise indicated) |
|---|---|---|
| Substrate | Glass | 1 mm-10 mm; preferably 1 mm-5 mm; more preferably 1.5 mm-2.5 mm; most preferably 1.8 mm-2.3 mm |
| $1^{st}$ Dielectric Layer | $1^{st}$ film: ZnO, AlZnO, GaZnO, InZnO, InSnO, and/or VZnO; $2^{nd}$ film: $Zn_2SnO_4$ | 30-60; preferably 40-55; more preferably 40-50; most preferably 42-47 |
| $1^{st}$ Seed Film | VZnO, AlZnO, GaZnO, InZnO, SnInO, Ag, and/or Al doped Ag | 0.5-10 nm; preferably 0.75-8; more preferably 0.9-6 |
| $1^{st}$ Metallic Layer | Cu, Ag, and/or Al doped Ag | 5-20; preferably 7.5-17.5; more preferably 8-15; most preferably 9-11 |
| $1^{st}$ Primer Layer | Ti, TiAl, Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| $2^{nd}$ Dielectric Layer | $1^{st}$ film: ZnO, AlZnO, GaZnO, InZnO, InSnO, and/or VZnO; $2^{nd}$ film: $Zn_2SnO_4$; $3^{rd}$ film: ZnO, AlZnO, GaZnO, InZnO, InSnO, and/or VZnO | 40-110; preferably 50-100; more preferably 60-90; most preferably 78-85 |
| $2^{nd}$ Seed Film | VZnO, AlZnO, GaZnO, InZnO, SnInO, Ag, and/or Al doped Ag | 0.5-10 nm; preferably 0.75-8; more preferably 0.9-6 |
| $2^{nd}$ Metallic Layer | Cu, Ag and/or Al doped Ag | 5-20; preferably 7.5-17.5; more preferably 10-15; most preferably 11-13.5 |
| $2^{nd}$ Primer Layer | Ti, TiAl, Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| $3^{rd}$ Dielectric Layer | $1^{st}$ film: ZnO, AlZnO, GaZnO, InZnO, InSnO, and/or VZnO; $2^{nd}$ film: $Zn_2SnO_4$; $3^{rd}$ film: ZnO, AlZnO, GaZnO, InZnO, InSnO, and/or VZnO | 40-110; preferably 50-100; more preferably 60-90; most preferably 70-82.5 |
| $3^{rd}$ Seed Film | VZnO, AlZnO, GaZnO, InZnO, SnInO, Ag, and/or Al doped Ag | 0.5-10 nm; preferably 0.75-8; more preferably 0.9-6 |
| $3^{rd}$ Metallic Layer | Cu, Ag and/or Al doped Ag | 5-20; preferably 7.5-17.5; more preferably 10-15; most preferably 11-13.5 |
| $3^{rd}$ Primer Layer | Ti, TiAl, Zn, AgZn, AgZnO, AlZnO, InZnO, GaZnO, and/or VZnO | 0.5-5; preferably 1-2.5; more preferably 1.5-2.5 |
| $4^{th}$ Dielectric Layer | $1^{st}$ film: ZnO, AlZnO, GaZnO, InZnO, InSnO, and/or VZnO; $2^{nd}$ film: $Zn_2SnO_4$; $3^{rd}$ film: ZnO, AlZnO, GaZnO, InZnO, InSnO, and/or VZnO | 40-110; preferably 50-100; more preferably 60-90; most preferably 67.5-75 |
| $4^{th}$ Seed Film | VZnO, AlZnO, GaZnO, InZnO, SnInO, Ag, and/or Al doped Ag | 0.5-10 nm; preferably 0.75-8; more preferably 0.9-6 |
| $4^{th}$ Metallic Layer | Cu, Ag, and/or Al doped Ag | 5-20; preferably 7-17; more preferably 8-12; most preferably 9-11 |

TABLE 4-continued

| Layer | Exemplary Material | Thickness (nm unless otherwise indicated) |
|---|---|---|
| $4^{th}$ Primer | Ti, TiAl, Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| $5^{th}$ Dielectric Layer | $1^{st}$ film: ZnO, $Zn_2SnO_4$, AlZnO, GaZnO, InZnO, InSnO, and/or VZnO; $2^{nd}$ film: SiON and/or $Zn_2SnO_4$ $3^{rd}$ film: $Si_3N_4$, AlZnO, GaZnO, InZnO, InSnO, and/or VZnO | 20-70; preferably 30-60; more preferably 35-55; most preferably 42.5-47.5 |
| Optional Stress Layer | TiNb sub-oxide or oxide, NbZr sub-oxide or oxide, TiTa sub-oxide or oxide, and/or SiCo sub-oxide or oxide | 0.5-30; preferably 1-25; more preferably 10-60; most preferably 1-18 |
| Optional Protective Coat | SiAlO, TiAlO, SiAlN or SiAlON | 1-80; preferably 10-80; more preferably 10-60; most preferably 35-45 |
| Total Metal Layer Thickness | Cu, Ag, and/or Al doped Ag | 38-60; preferably 40-50; more preferably 41-48; most preferably 43-46 |

Figure 13:
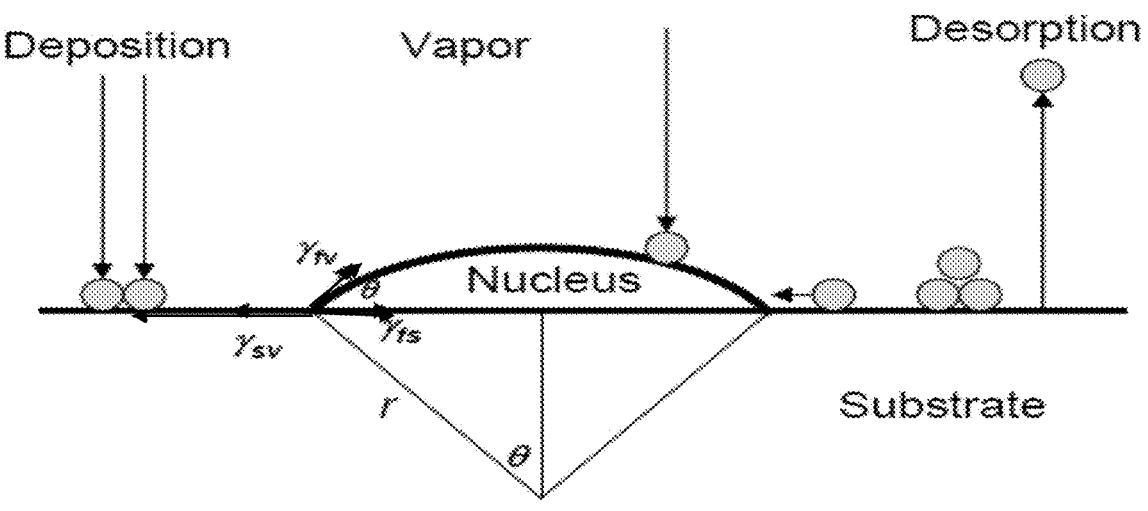
FIG. 13 is an illustration showing the initial nucleation of film growth on a surface.
Figure 14A:
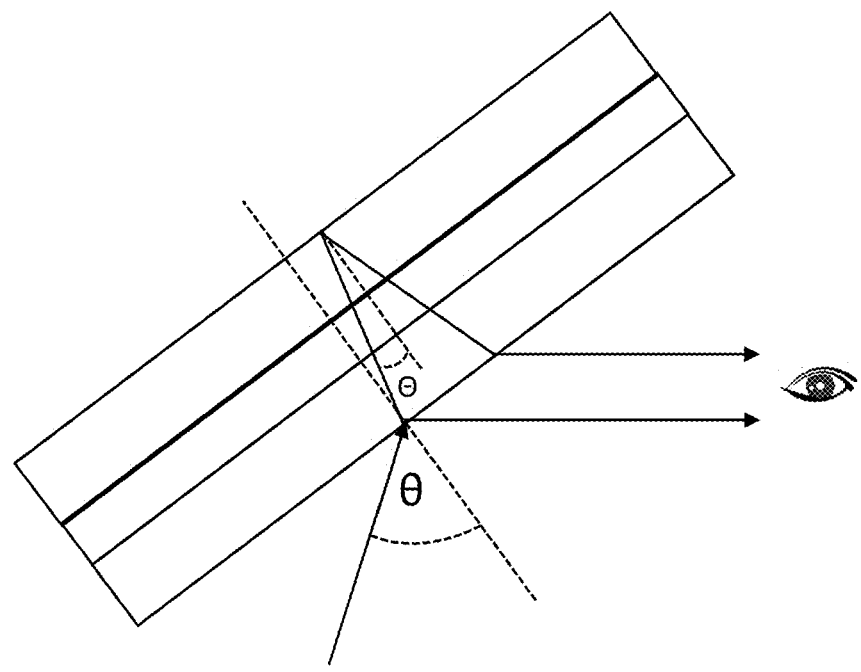
FIGS. 14A and 14B are illustrations of a windshield showing ghosting effects created when a heads-up display is used.
Figure 14B:
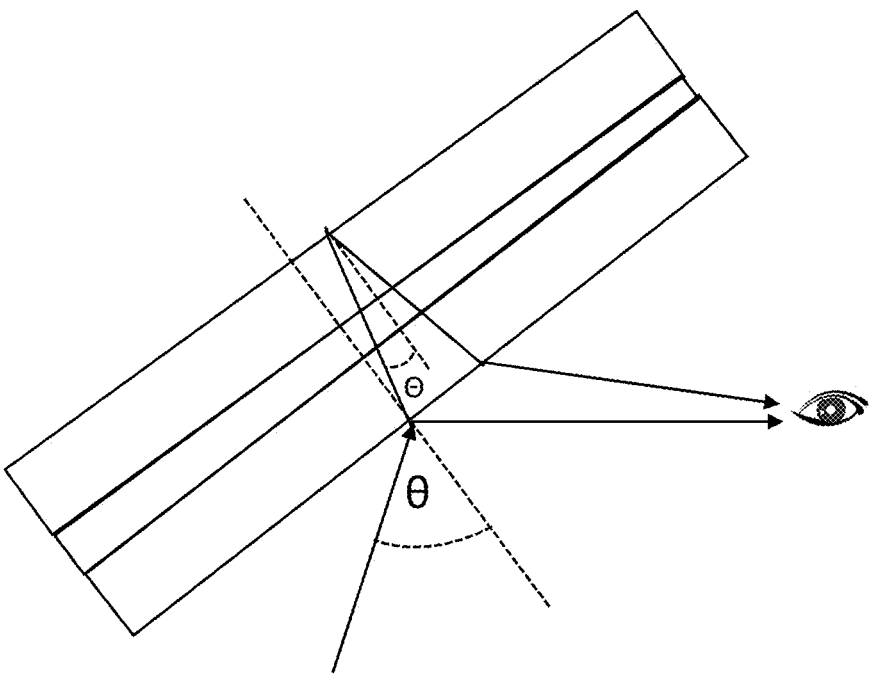
Figure 15:
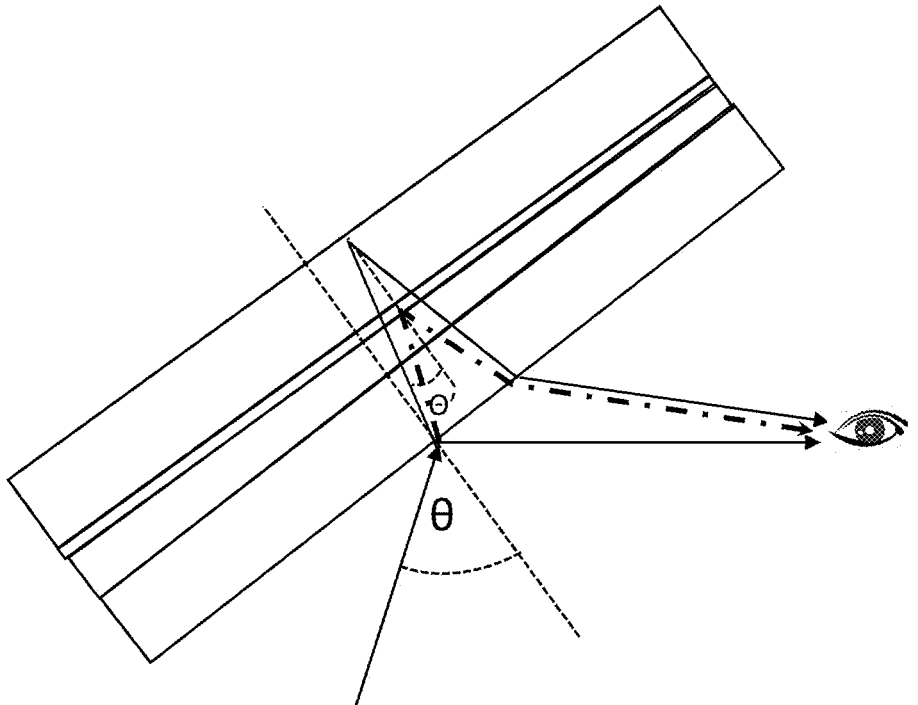
FIG. 15 is an illustration of a windshield with the coating positioned to reduce ghosting in heads-up displays.
Figure 24:
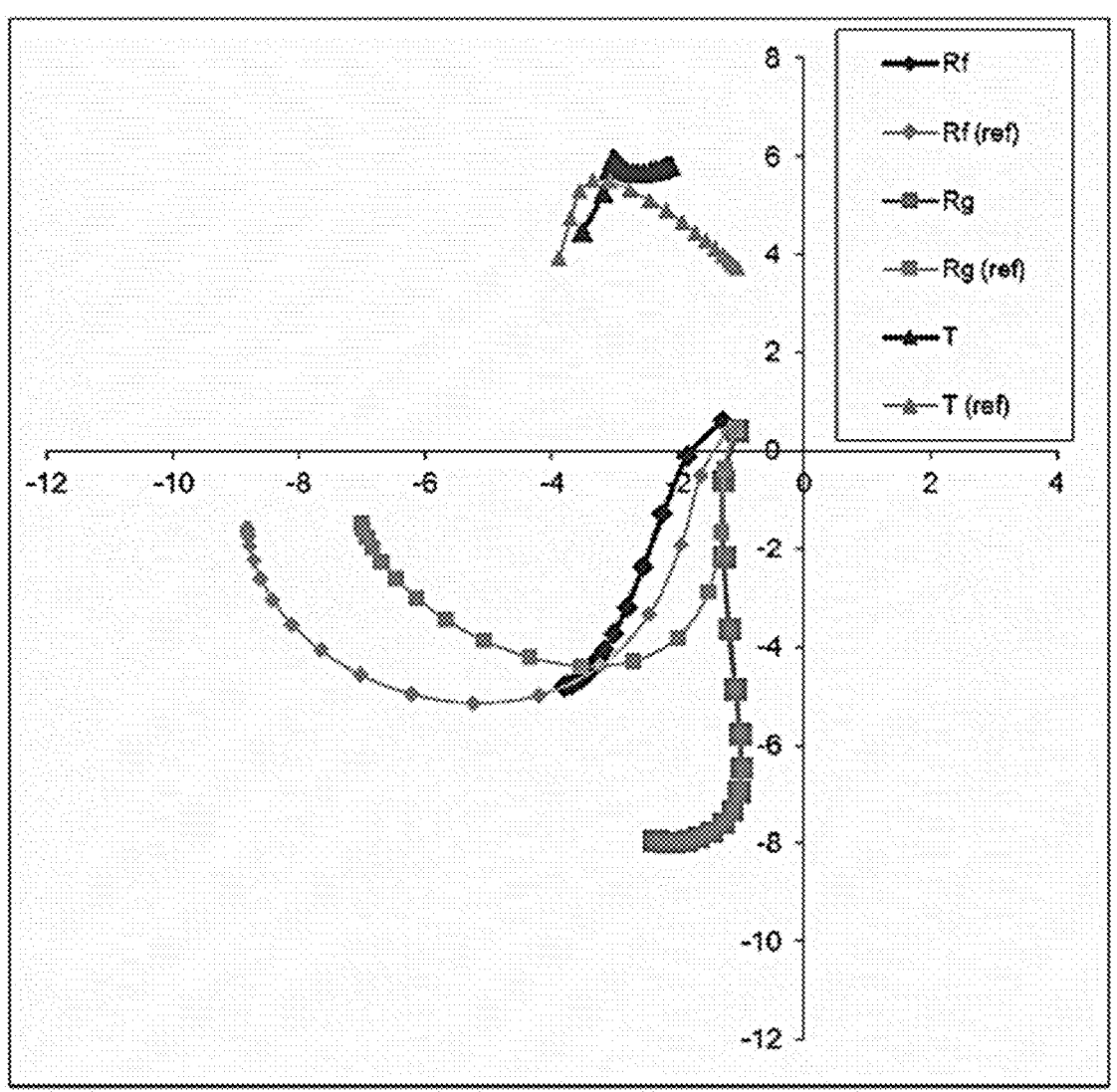
FIG. 24 is a color chart of the exemplary coating from FIG. 23.

FIG. 13 shows an illustration of the initial nucleation of film growth on a surface. Formation of a nucleus leads to a change in the Gibbs free-energy of the system, including volume and surface Gibbs free-energy. In order to grow a 2D layer, the growth surface needs to have high surface energy (i.e., high surface tension) for two-dimensional growth and the change in Gibbs free-energy needs to be large enough to create a denser film. Therefore, the materials on which the silver is grown (i.e., seed film) and the materials under which the silver is covered (i.e., primer layers) need to have high Gibbs free-energy in order to favor dense, two-dimensional silver growth and to avoid silver agglomeration. Some of the elements that have high cohesive energy and high Gibbs free-energy compared to silver are shown below in Table 5. These elements are some of the materials that have the potential to decrease silver agglomeration when used as either a seed film or a primer layer.

TABLE 5

| Metal | Cohesive energy (kJ/mol) @ 293k | Max. metal Solubility in Ag (at %) | Gibbs Free Energy of metal oxide @ 293k |
|---|---|---|---|
| Ag | 284 | — | −5.6 (Ag2O) |
| Ti | 468 | 5 | −939.7 (TiO2) |
| Nb | 730 | 0 | −883.1 (Nb2O5) |
| W | 859 | 0 | −764 (WO3) |
| Zr | 603 | | −1039.8 (ZrO2) |
| Ni | 428 | 0.3 | −211.7 (NiO) |
| Cr | 395 | | −1053 (Cr2O3) |

The purpose of this invention is to try to reduce the sheet resistance of a coated article, while still maintain a light transmittance of at least 70%. In order to do this various materials that are thought to result in the previously mentioned properties were tested as replacements for the standard materials known in the art for the primer layers, metallic layers, seed films, and stress layer.

In another embodiment, the invention is a coating useful for a heads-up display (HUD) in a windshield. As shown in FIGS. 10, 11, 12, 14A, 14B, and 15, a windshield comprises a first ply and a second ply. The first ply is the exterior or outer ply of the windshield. The second ply is the interior ply of the windshield. In between the two plies is an interlayer. The interlayer can be any standard interlayer used in the industry. One example of such an interlayer is a polyvinyl butyral (PVB) interlayer. Preferably, the interlayer has a wedge shape wherein one side of the interlayer is thicker than another side. The first ply has a No. 1 surface, and a No. 2 surface. The No. 1 surface is the surface that faces the exterior of the vehicle when installed. The No. 2 surface faces the second ply. The second ply has a No. 3 surface and a No. 4 surface. The No. 3 surface faces the first ply, and the No. 4 surface faces the interior of the vehicle when the windshield is installed in a vehicle. A coating may be positioned on the No. 2 surface or the No. 3 surface, preferably on the No. 2 surface. Non-limiting examples of coatings useful for a HUD in a windshield is provided in FIGS. 16-22.

For a HUD, the coating can be a triple metal coating or a quadruple metal coating. In the embodiment where the coating is a triple metal coating, the coating has a first dielectric layer positioned over at least a portion of the substrate. A first metal layer is positioned over at least a portion of the first dielectric layer. Optionally, a primer is positioned over at least a portion of the first metal layer. A second dielectric layer is positioned over at least a portion of the first metal layer or the optional first primer. A second metal layer is positioned over at least a portion of the second dielectric layer. An optional second primer is positioned over at least a portion of the second metal layer. A third dielectric layer is positioned over at least a portion of the second metal layer of the optional second primer. A third metal layer is positioned over the third dielectric layer. An optional third primer layer over the third metal layer. A fourth dielectric layer over the third metal layer or the optional third primer layer. An overcoat over the fourth dielectric layer. The thickness of each layer are shown in Table 6, below. In the event the primer layer comprises aluminum and zinc, the total thickness of the metallic layers for the triple metal coating is in the range of 10 nm to 65 nm, preferably 15 nm to 55 nm, more preferably 20 nm to 45 nm, most preferably 25 nm to 36 nm. Non-limiting examples of triple-metal coatings are provided in FIGS. 16-20 and 22.

TABLE 6

| Layer | Thickness (nm unless otherwise indicated) |
|---|---|
| Substrate | 1 mm-10 mm;<br>preferably 1 mm-5 mm;<br>more preferably 1.5 mm-2.5 mm;<br>most preferably 1.8 mm-2.3 mm |
| 1$^{st}$ Dielectric Layer | 10-50;<br>preferably 12-45;<br>more preferably 15-42;<br>most preferably 18-40 |
| 1$^{st}$ Metallic Layer | 5-20;<br>preferably 5-17.5;<br>more preferably 7-15;<br>most preferably 8-10.5 |
| 1$^{st}$ Primer Layer | 0.5-5;<br>preferably 1-2.5;<br>more preferably 1.5-2.5 |
| 2$^{nd}$ Dielectric Layer | 40-110;<br>preferably 50-100;<br>more preferably 55-80;<br>most preferably 67-76 |
| 2$^{nd}$ Metallic Layer | 5-20;<br>preferably 5-15;<br>more preferably 7.5-12.5;<br>most preferably 8.5-11.5 |
| 2$^{nd}$ Primer Layer | 0.5-5;<br>preferably 1-2.5;<br>more preferably 1.5-2.5 |
| 3$^{rd}$ Dielectric Layer | 40-110;<br>preferably 50-100;<br>more preferably 65-80;<br>most preferably 71-75 |
| 3$^{rd}$ Metallic Layer | 1-20;<br>preferably 5-20;<br>more preferably 7.5-15;<br>most preferably 7.5-10.5 |
| 3$^{rd}$ Primer Layer | 0.5-5;<br>preferably 1-2.5;<br>more preferably 1.5-2.5 |
| 4$^{th}$ Dielectric Layer | 10-50;<br>preferably 15-40;<br>more preferably 20-35;<br>most preferably 27-31 |
| Optional Protective Coat | 15-120;<br>preferably 25-110;<br>more preferably 30-100;<br>most preferably 20-90 |
| Total Metal Layer Thickness | 10-60;<br>preferably 15-50;<br>more preferably 20-40;<br>most preferably 25-31 |

In the embodiment where the coating for a HUD comprises a quadruple metal coating, the coating has additional layers over the fourth dielectric layer. Namely, a fourth metal layer is positioned over the dielectric layer. An optional fourth primer layer is positioned over the fourth metal layer. A fifth dielectric layer is positioned over the fourth metal layer, or the optional fourth primer layer. An optional overcoat is positioned over the fifth dielectric layer. The thickness of each layer are show in Table 7, below. In the event the primer layer comprises aluminum and zinc, the total thickness of the metallic layers for the quadruple metal coating 34 is in the range of 10 nm to 65 nm, preferably 20 nm to 60 nm, most preferably 40 nm to 55 nm, most preferably 35 nm to 45 nm.

Non-limiting examples of a coating having four metal layers is provided in FIG. 21.

TABLE 7

| Layer | Thickness (nm unless otherwise indicated) |
|---|---|
| Substrate | 1 mm-10 mm;<br>preferably 1 mm-5 mm;<br>more preferably 1.5 mm-2.5 mm;<br>most preferably 1.8 mm-2.3 mm |
| 1$^{st}$ Dielectric Layer | 20-55;<br>preferably 25-50;<br>more preferably 30-45;<br>most preferably 35-40 |
| 1$^{st}$ Metallic Layer | 2-20;<br>preferably 6-18;<br>more preferably 9-12;<br>most preferably 9.5-10 |
| 1$^{st}$ Primer Layer | 0.5-5;<br>preferably 1-2.5;<br>more preferably 1.5-2.5 |
| 2$^{nd}$ Dielectric Layer | 60-100;<br>preferably 65-95;<br>more preferably 70-90;<br>most preferably 74-80 |
| 2$^{nd}$ Metallic Layer | 2-20;<br>preferably 6-18;<br>more preferably 8-15;<br>most preferably 9-12 |
| 2$^{nd}$ Primer Layer | 0.5-5;<br>preferably 1-2.5;<br>more preferably 1.5-2.5 |
| 3$^{rd}$ Dielectric Layer | 55-90;<br>preferably 60-85;<br>more preferably 68-80;<br>most preferably 70-75 |
| 3$^{rd}$ Metallic Layer | 2-20;<br>preferably 6-18;<br>more preferably 8-15;<br>most preferably 9-12 |
| 3$^{rd}$ Primer Layer | 0.5-5;<br>preferably 1-2.5;<br>more preferably 1.5-2.5 |
| 4$^{th}$ Dielectric Layer | 45-80;<br>preferably 50-75;<br>more preferably 55-70;<br>most preferably 60-65 |
| 4$^{th}$ Metallic Layer | 2-20;<br>preferably 4-15;<br>more preferably 6-11;<br>most preferably 7-10. |
| 4$^{th}$ Primer Layer | 0.5-5;<br>preferably 1-2.5;<br>more preferably 1.5-2.5 |
| 5$^{th}$ Dielectric Layer | 10-45;<br>preferably 15-40;<br>more preferably 20-35 nm;<br>most preferably 23-28 nm |
| Optional Protective Coat | 15-120;<br>preferably 25-110;<br>more preferably 30-100;<br>most preferably 20-90 |
| Total Metal Layer Thickness | 10-60;<br>preferably 15-50;<br>more preferably 30-45;<br>most preferably 35-40 |

In some non-limiting embodiments of the coating for the HUD, the coating further comprises a light absorber. The light absorber is selected from the group consisting of tint glass, PVB, an absorbing layer, or combinations thereof. In the embodiments described above, an additional absorbing layer may be positioned over the fourth dielectric layer or the fifth dielectric layer, such that the absorbing layer would be positioned between the fourth dielectric layer or the fifth dielectric layer and the optional overcoat, or would be the outermost layer in the coating. Non-limiting examples of such embodiments are provided in FIGS. 19 and 20. The absorbing layer is selected from the group consisting of Ge, $GeO_x$, $NbN_x$, $NbN_xO_y$, $Si_aAl_b$, $Si_aAl_bO_x$, $Si_aCo_b$, $Si_aCo_bO_x$, $Si_aCo_bCu_c$, $Si_aCo_bCu_cO_x$, $Si_aCr_b$, $Si_aCr_bO_x$, $Si_aNi_b$, $SiNiO_x$, $SiO_x$, $SnN_x$, $SnO_x$, $SnO_xN_y$, $TiN_x$, $Ti_aNb_bN_x$, $Ti_aNb_bO_x$, $Ti_aNb_bO_xN_y$, $TiO_xN_y$, $WO_x$, $WO_2$, ZnO:Co, ZnO:Fe, ZnO:Mn, ZnO:Ni, ZnO:V, ZnO:Cr, $Zn_aSn_b$, $Zn_aSn_bO_x$, or any combination thereof. In a non-limiting embodiment, the light absorbing compound can be silicon cobalt oxide. The absorbing layer can have a thickness of 1 nm to 40 nm, preferably 5 nm to 30 nm, more preferably 10 nm to 25 nm, most preferably 15 nm to 20 nm. Alternatively, the absorbing layer can comprise a subcritical metal film. The metal in the subcritical metal layer can be silver, gold, alloys thereof, mixtures thereof, or combination thereof. In a non-limiting embodiment, the subcritical film comprises silver. The subcritical metal film can have a thickness of 0.5 nm to 20 nm, preferably 1 nm to 10 nm, or more preferably 1.5 nm to 3.5 nm. The term "subcritical thickness" means a thickness below the critical thickness such that the coating material forms isolated, non-connected regions of the coating material. The term "islanded" means that the coating material is not a continuous layer but, rather, that the material is deposited to form isolated regions or islands. An additional dielectric layer can be formed over at least a portion of the subcritical metal film. The additional dielectric layer formed over at least a portion of the subcritical metal film comprises a total thickness in the range of 25 nm to 33 nm, preferably 26 nm to 32 nm, more preferably 27 nm to 31 nm, most preferably 28 nm to 30 nm and can comprises any of the material discussed above with respect to the first, second, third, fourth, and fifth dielectric layers.

In one non-limiting embodiment of the coating for HUD, the coating provides a visible light reflectance of not more than 25%. For example, not more than 20%, such as no more than 10%, such as not more than 8%. In one non-limiting practice of the invention, the coating provides an exterior (ext) reflected a* at an 8 degree angle (°) (Rg8a*) in the range of 1 to −2. For example, in the range of 1 to −1, preferably −0.5 to 0.5, more preferably −0.5 to 0, most preferably 0. In one non-limiting embodiment, the coating provides an exterior reflected b* at 8° (Rg8b*) in the range of 1 to −2. For example, in the range of 1 to −1, preferably −0.5 to 0.5, more preferably −0.5 to 0, most preferably 0.

In another embodiment, the invention is directed to a coated substrate having a RgL* of at least 42, preferably at least 45, more preferably at least 46, most preferably at least 50. In another embodiment, the RgL* value is at least 35 and no more than 55. In another embodiment, the RgL* is at least 42. In another embodiment, the RgL* is no more than 52. In this embodiment, there are two metal layers. The embodiment has a substrate, and a coating over the substrate. The coating has a first dielectric layer positioned over at least a portion of the substrate. A first metal layer is positioned over at least a portion of the first dielectric layer. Optionally, a primer is positioned over at least a portion of the first metal layer. A second dielectric layer is positioned over at least a portion of the first metal layer or the optional first primer. A second metal layer is positioned over at least a portion of the second dielectric layer. An optional second primer is positioned over at least a portion of the second metal layer. A third dielectric layer is positioned over at least a portion of the second metal layer of the optional second primer. An overcoat over the fourth dielectric layer. The thickness of each layer are shown in Table 8, below, and results can be found in FIG. 20.

36

TABLE 8

| Layer | Thickness (nm unless otherwise indicated) |
| --- | --- |
| Substrate | 1 mm-10 mm;<br>preferably 1 mm-5 mm;<br>more preferably 1.5 mm-2.5 mm;<br>most preferably 1.8 mm-2.3 mm |
| 1$^{st}$ Dielectric Layer | 10-55;<br>preferably 20-53;<br>more preferably 25-50;<br>most preferably 29-48 |
| 1$^{st}$ Metallic Layer | 5-20;<br>preferably 7.5-15.0;<br>more preferably 9-14;<br>most preferably 9.7-13.3 |
| 1$^{st}$ Primer Layer | 0.5-5;<br>preferably 1-2.5;<br>more preferably 1.5-2.5 |
| 2$^{nd}$ Dielectric Layer | 50-150;<br>preferably 75-125;<br>more preferably 90-110;<br>most preferably 93-100 |
| 2$^{nd}$ Metallic Layer | 5-20;<br>preferably 5-15;<br>more preferably 7.5-12.5;<br>most preferably 7.5-10.3 |
| 2$^{nd}$ Primer Layer | 0.5-5;<br>preferably 1-2.5;<br>more preferably 1.5-2.5 |
| 3$^{rd}$ Dielectric Layer | 25-75;<br>preferably 25-50;<br>more preferably 30-45;<br>most preferably 36-41 |
| Optional Protective Coat | 20-120;<br>preferably 25-110;<br>more preferably 30-100;<br>most preferably 35-90 |
| Total Metal Layer Thickness | 10-30;<br>preferably 12-25;<br>more preferably 15-22;<br>most preferably 16-18 |

This invention also includes the method of creating these various embodiments of coated articles. This includes providing a substrate; apply a coating over the substrate; wherein the coating comprises a first dielectric layer applied over at least a portion of the substrate, an optional first seed film applied over at least a portion of the first dielectric layer, a first metallic layer applied over at least a portion of the first dielectric layer or optional first seed film, a first primer layer applied over at least a portion of the first metallic layer, and a second dielectric layer applied over at least a portion of the first primer layer. The coating provided in the above method may also optional comprise a second seed film applied over at least a portion of the second dielectric layer, a second metallic layer applied over at least a portion of the second dielectric layer or second seed film, a second primer layer applied over at least a portion of the second metallic layer, a third dielectric layer applied over at least a portion of the second primer layer, a third seed film applied over at least a portion of the third dielectric layer, a third metallic layer applied over at least a portion of the third dielectric layer or third seed film, a third primer layer applied over at least a portion of the third metallic layer, a fourth dielectric layer applied over at least a portion of the third primer layer, a fourth seed film applied over at least a portion of the fourth dielectric layer, a fourth metallic layer applied over at least a portion of the fourth dielectric layer or fourth seed film, a fourth primer layer applied over at least a portion of the fourth metallic layer, and/or a fifth dielectric layer applied over at least a portion of the fourth primer layer. The coating of the above method may optionally also comprise a protective layer over at least a portion of the topmost dielectric layer and/or a stress layer applied over at least a portion of the topmost dielectric layer and between the topmost dielectric layer and the protective layer.

This invention also includes the method of creating these various embodiments of coated articles. This includes providing a substrate; apply a coating over the substrate; heating the substrate comprising the coating; and bending the substrate comprising the coating into a desired shape; wherein the coating comprises a first dielectric layer applied over at least a portion of the substrate, an optional first seed film applied over at least a portion of the first dielectric layer, a first metallic layer applied over at least a portion of the first dielectric layer or optional first seed film, a first primer layer applied over at least a portion of the first metallic layer, and a second dielectric layer applied over at least a portion of the first primer layer. The coating provided in the above method may also optional comprise a second seed film applied over at least a portion of the second dielectric layer, a second metallic layer applied over at least a portion of the second dielectric layer or second seed film, a second primer layer applied over at least a portion of the second metallic layer, a third dielectric layer applied over at least a portion of the second primer layer, a third seed film applied over at least a portion of the third dielectric layer, a third metallic layer applied over at least a portion of the third dielectric layer or third seed film, a third primer layer applied over at least a portion of the third metallic layer, a fourth dielectric layer applied over at least a portion of the third primer layer, a fourth seed film applied over at least a portion of the fourth dielectric layer, a fourth metallic layer applied over at least a portion of the fourth dielectric layer or fourth seed film, a fourth primer layer applied over at least a portion of the fourth metallic layer, and/or a fifth dielectric layer applied over at least a portion of the fourth primer layer. The coating of the above method may optionally also comprise a protective layer over at least a portion of the topmost dielectric layer and/or a stress layer applied over at least a portion of the topmost dielectric layer and between the topmost dielectric layer and the protective layer.

The invention is further described in the following numbered clauses

Clause 1. A coated article including a substrate; a first dielectric layer over at least a portion of the substrate; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; a second primer layer over at least a portion of the second metallic layer; a third dielectric layer over at least a portion of the second primer layer; a third metallic layer over at least a portion of the third dielectric layer; a third primer layer over at least a portion of the third metallic layer; and a fourth dielectric layer over at least a portion of the third primer layer; wherein a total combined thickness of the metallic layers is at least 30 nanometers, and no more than 60 nanometers.

Clause 2. The coated article according to clause 1 wherein the first metallic layer is selected from the group consisting of silver, copper, gold, aluminum, mixtures thereof, and alloys thereof; the second metallic layer is selected from the group consisting of silver, copper, gold, aluminum, mixtures thereof, and alloys thereof; and/or the third metallic layer is selected from the group consisting of silver, copper, gold, aluminum, mixtures thereof, and alloys thereof.

Clause 3. The coated article according to clause 1, wherein the first metallic layer comprises silver, the second metallic layer comprises silver and the third metallic layer comprises silver.

Clause 4. The coated article according to any of the preceding clauses, wherein the first metallic layer has a thickness of at least 90 Å and at most 140 Å, the second metallic layer has a thickness of at least 110 Å and at most 140 Å; and/or the third metallic layer has a thickness of at least 90 Å and at most 150 Å.

Clause 5. The coated article according to any of the preceding clauses, wherein the first metallic layer has a first metallic layer thickness, and the third metallic layer has a third metallic layer thickness, and wherein the first metallic layer thickness is at least 10% thicker or thinner than the third metallic layer thickness.

Clause 6. The coated article according to any of the preceding clauses, wherein the first metallic layer has a first metallic layer thickness and the second metallic layer has a second metallic layer thickness, and wherein the first metallic layer thickness is thinner than the second metallic layer thickness.

Clause 7. The coated article according to any of the preceding clauses, wherein the third metallic layer has a third metallic layer thickness and the second metallic layer has a second metallic layer thickness, and wherein the third metallic layer thickness is thinner than the second metallic layer thickness.

Clause 8. The coated article according to any of the preceding clauses, further including: a fourth metallic layer over at least a portion of the fourth dielectric layer; a fourth primer layer over at least a portion of the fourth metallic layer; and a fifth dielectric layer over at least a portion of the fourth primer layer.

Clause 9. The coated article according to clause 8 wherein the first metallic layer is selected from the group consisting of silver, copper, gold, palladium, aluminum, mixtures thereof, or alloys thereof; the second metallic layer is selected from the group consisting of silver, copper, gold, palladium, aluminum, mixtures thereof, or alloys thereof; the third metallic layer is selected from the group consisting of silver, copper, gold, palladium, aluminum, mixtures thereof, or alloys thereof; and/or the fourth metallic layer is selected from the group consisting of silver, copper, gold, palladium, aluminum, mixtures thereof, or alloys thereof.

Clause 10. The coated article according to clause 8 or 9, wherein the first metallic layer comprises silver, the second metallic layer comprises silver, the third metallic layer comprises silver, and the fourth metallic layer comprises silver.

Clause 11. The coated article according to any of clauses 8-10, wherein the first metallic layer has a thickness of at least 90 Å and at most 100 Å, the second metallic layer has a thickness of at least 110 Å and at most 130 Å; the third metallic layer has a thickness of at least 110 Å and at most 130 Å; and the fourth metallic layer has a thickness of at least 90 Å and at most 110 Å.

Clause 12. The coated article according any of clauses 8-11, wherein the first metallic layer has a first metallic layer thickness, and the fourth metallic layer has a fourth metallic layer thickness, and wherein the first metallic layer thickness is 10% thicker or thinner than the fourth metallic layer thickness.

Clause 13. The coated article according to any of clauses 8-12, wherein the second metallic layer has a second metallic layer thickness, and the third metallic layer has a third metallic layer thickness, and wherein the second metallic layer thickness is 10% thicker or thinner than the third metallic layer thickness.

Clause 14. The coated article according to any of clauses 8-13, wherein the first metallic layer has a first metallic layer thickness and the second metallic layer has a second metallic layer thickness, and wherein the first metallic layer thickness is thinner than the second metallic layer thickness.

Clause 15. The coated article according to any of clauses 8-14, wherein the fourth metallic layer has a fourth metallic layer thickness and the third metallic layer has a third metallic layer thickness, and wherein the fourth metallic layer thickness is thinner than the third metallic layer thickness.

Clause 16. The coated article according to any of the preceding clauses, wherein the total combined thickness of all of the metallic layers is no more than 47 nm; and/or at least 35 nm.

Clause 17. The coated article according to clause 16, wherein the total combined thickness of all of the metallic layers is no more than 43 nanometers, and/or at least 35 nanometers.

Clause 18. The coated article according to clause 1, wherein at least one of the metallic layers comprises at least one of silver, copper, gold, palladium, aluminum, mixtures thereof, or alloys thereof.

Clause 19. The coated article according to any of the preceding clauses, wherein the first dielectric layer comprises a zinc stannate film, and a zinc oxide film over at least a portion of the zinc stannate film.

Clause 20. The coated article according to any of the preceding clauses, wherein the second dielectric layer and/or the third dielectric layer comprise a first zinc oxide film, an optional zinc stannate film over at least a portion of the first zinc oxide film, and a second film or over at least a portion of the zinc stannate film, wherein the second film comprises zinc oxide, silicon nitride, silicon oxynitrides, or a combination thereof.

Clause 21. The coated article according to any of the preceding clauses, wherein the fourth dielectric layer comprises a zinc oxide film, and a zinc stannate layer film at least a portion of the zinc oxide film.

Clause 22. The coated article according to any of the preceding clauses, wherein at least one dielectric layer comprises a silicon nitride film.

Clause 23. The coated article according to any of the preceding clauses, further comprising an outermost protective coating comprising a protective layer, wherein the protective layer comprises at least one of $Si_3N_4$, SiAlN, SiAlON, SiAlO, titania, alumina, silica, zirconia, alloys thereof, or mixtures thereof.

Clause 24. The coated article according to clause 23, wherein the outermost protective layer comprises $Si_3N_4$, SiAlO, SIAlN, SiAlON, or mixtures thereof.

Clause 25. The coated article according to clause 23, wherein the outermost protective layer comprises titania.

Clause 26. The coated article according to any of the preceding clauses, wherein at least one of the first primer layer, the second primer layer, and/or the third primer layer is selected from titanium, cobalt, silicon, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized.

Clause 27. The coated article according to clause 26, wherein at least one of the first primer layer, the second primer layer, and/or the third primer layer comprises titanium or a nickel-chromium alloy, and wherein the primer is deposited as a metal and subsequently oxidized.

Clause 28. The coated article according to clause 26, wherein at least one of the first primer layer, the second primer layer, and/or the third primer layer is a metal oxide comprising a metal selected from titanium, cobalt, silicon, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized.

Clause 29. The article according to clause 28, wherein at least one of the first primer layer, the second primer layer, and/or the third primer layer is a metal oxide comprising a metal comprising titanium, titanium-aluminum alloy, nickel, or a nickel-chromium alloy.

Clause 30. The coated article according to any of the preceding clauses, wherein the coated article has a visible light transmittance of at least 70%.

Clause 31. A coated article comprising: a substrate; a first dielectric layer over at least a portion of the substrate; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; a second primer layer over at least a portion of the second metallic layer; a third dielectric layer over at least a portion of the second primer layer; a third metallic layer over at least a portion of the third dielectric layer; a third primer layer over at least a portion of the third metallic layer; and a fourth dielectric layer over at least a portion of the third primer layer; wherein the article has a sheet resistance of not more than 0.85 Ω/□.

Clause 32. The coated article according to clause 31, wherein the sheet resistance is not more than 0.8 Ω/□.

Clause 33. The coated article according to clause 31 or 32, wherein the sheet resistance is not more 0.7 Ω/□.

Clause 34. The coated article according to any of clauses 31-33, wherein the coated article has a visible light transmittance of at least 70%.

Clause 35. The coated article according to any of clauses 31-34, wherein at least one of the metallic layers comprises at least one of silver, copper, gold, palladium, aluminum, mixtures thereof, or alloys thereof.

Clause 36. The coated article according to any of clauses 31-35, wherein at least one of the dielectric layers comprises at least one of a zinc stannate film, a zinc oxide film, a silicon nitride film, or mixtures thereof.

Clause 37. The coated article according to any of clauses 31-36, wherein at least one of the primer layers is selected from titanium, cobalt, silicon, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized.

Clause 38. The coated article according to any of the preceding clauses, wherein the first primer layer comprises titanium, aluminum, nickel or chromium, and wherein the primer is deposited as a metal and subsequently oxidized.

Clause 39. The article according to any of the preceding clauses, wherein the second primer layer comprises titanium, aluminum, nickel or chromium, and wherein the primer is deposited as a metal and subsequently oxidized.

Clause 40. The article according to any of the preceding clauses, wherein the third primer layer comprises titanium, aluminum, nickel or chromium, and wherein the primer is deposited as a metal and subsequently oxidized.

Clause 41. A coated article comprising: a substrate; a first dielectric layer over at least a portion of the substrate; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; and a second primer layer over at least a portion of the second metallic layer, wherein a total combined thickness of the metallic layers is at least 30 nanometers, and no more than 60 nanometers.

Clause 42. The coated article according to clause 41 wherein the first metallic layer is selected from the group consisting of silver, copper, gold, aluminum, mixtures thereof, or alloys thereof; and the second metallic layer is selected from the group consisting of silver, copper, gold, aluminum, mixtures thereof, or alloys thereof.

Clause 43. The coated article according to clause 41 or 42, wherein the first metallic layer comprises silver and the second metallic layer comprises silver.

Clause 44. The coated article according to any of clauses 41-43, wherein the first metallic layer has a thickness of at least 90 nm and at most 140 nm and the second metallic layer has a thickness of at least 110 nm and at most 140 nm.

Clause 45. The coated article according to clause any of clauses 41-44, wherein the first metallic layer has a first metallic layer thickness, and the second metallic layer has a second metallic layer thickness, and wherein the first metallic layer thickness is 10% thicker or thinner than the second metallic layer thickness.

Clause 46. The coated article according to any of clauses 41-45, wherein the first metallic layer has a first metallic layer thickness and the second metallic layer has a second metallic layer thickness, and wherein the first metallic layer thickness is thinner than the second metallic layer thickness.

Clause 47. The coated article according to any of clauses 41-46, further including: a third metallic layer over at least a portion of the third dielectric layer, a third primer layer over at least a portion of the third metallic layer, and a fourth dielectric layer over at least a portion of the third primer layer.

Clause 48. The coated article according to clause 47, wherein the first metallic layer is selected from the group consisting of silver, copper, gold, palladium, aluminum, mixtures thereof, or alloys thereof; the second metallic layer is selected from the group consisting of silver, copper, gold, palladium, aluminum, mixtures thereof, or alloys thereof; and the third metallic layer is selected from the group consisting of silver, copper, gold, palladium, aluminum, mixtures thereof, or alloys thereof.

Clause 49. The coated article according to clause 47 or 48, wherein the first metallic layer comprises silver, the second metallic layer comprises silver and the third metallic layer comprises silver.

Clause 50. The coated article according to any of clauses 47-49, wherein the first metallic layer has a thickness of at least 110 Å and at most 140 Å, the second metallic layer has a thickness of at least 130 Å and at most 140 Å; and the third metallic layer has a thickness of at least 110 Å and at most 150 Å.

Clause 51. The coated article according to any of clauses 47-50, wherein the first metallic layer has a first metallic layer thickness, and the third metallic layer has a third metallic layer thickness, and wherein the first metallic layer thickness is 10% thicker or thinner than the third metallic layer thickness.

Clause 52. The coated article according to any of clauses 47-51, wherein the first metallic layer has a first metallic layer thickness and the second metallic layer has a second metallic layer thickness, and wherein the first metallic layer thickness is thinner than the second metallic layer thickness.

Clause 53. The coated article according any of clauses 47-52, wherein the third metallic layer has a third metallic layer thickness and the second metallic layer has a second metallic layer thickness, and wherein the third metallic layer thickness is thinner than the second metallic layer thickness.

Clause 54. The coated article according to any of clauses 47-53, further including: a fourth metallic layer over at least a portion of the fourth dielectric layer; a fourth primer layer over at least a portion of the fourth metallic layer; and a fifth dielectric layer over at least a portion of the fourth primer layer.

Clause 55. The coated article according to clause 54, wherein the first metallic layer is selected from the group consisting of silver, copper, gold, palladium, aluminum, mixtures thereof, or alloys thereof; the second metallic layer is selected from the group consisting of silver, copper, gold, palladium, aluminum, mixtures thereof, or alloys thereof; the third metallic layer is selected from the group consisting of silver, copper, gold, aluminum, mixtures thereof, or alloys thereof; and the fourth metallic layer is selected from the group consisting of silver, copper, gold, palladium, aluminum, mixtures thereof, or alloys thereof.

Clause 56. The coated article according to clause 54 or 55, wherein the first metallic layer comprises silver, the second metallic layer comprises silver, the third metallic layer comprises silver, and the fourth metallic layer comprises silver.

Clause 57. The coated article according to any of clauses 54-56, wherein the first metallic layer has a thickness of at least 90 Å and at most 100 Å, the second metallic layer has a thickness of at least 110 Å and at most 130 Å; the third metallic layer has a thickness of at least 110 Å and at most 130 Å; and the fourth metallic layer has a thickness of at least 90 Å and at most 110 Å.

Clause 58. The coated article according to any of clauses 54-57, wherein the first metallic layer has a first metallic layer thickness, and the fourth metallic layer has a fourth metallic layer thickness, and wherein the first metallic layer thickness is 10% thicker or thinner than the fourth metallic layer thickness.

Clause 59. The coated article according to any of clauses 54-58, wherein the fourth metallic layer has a fourth metallic layer thickness and the third metallic layer has a third metallic layer thickness, and wherein the fourth metallic layer thickness is thinner than the third metallic layer thickness.

Clause 60. The coated article according to any of clauses 41-59, wherein the coated article has a visible light transmittance of at least 70%.

Clause 61. The coated article according to clause 41, wherein at least one of the metallic layers comprises at least one of silver, copper, gold, palladium, aluminum, mixtures thereof, or alloys thereof.

Clause 62. The coated article according to any of clauses 41-61, wherein at least one of the dielectric layers comprises at least one of a zinc stannate layer, a zinc oxide layer, a silicon nitride layer, or mixtures thereof.

Clause 63. The coated article according to any of clauses 41-62, further comprising an outermost protective coating comprising a protective layer, wherein the protective layer comprises at least one of $Si_3N_4$, SiAlN, SiAlON, titania, alumina, silica, zirconia, alloys thereof, or mixtures thereof.

Clause 64. The coated article according to any of clauses 41-63, wherein at least one the primer layers is selected from titanium, cobalt, silicon, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized.

Clause 65. A coated article comprising: a first substrate comprising a first surface and a second surface; a second substrate over at least a portion of the first substrate, comprising a third surface and a fourth surface, wherein the second surface is disposed facing the third surface, and wherein the second and third surfaces are separated by an interlayer; and a functional coating disposed over either the second or the third surface, the functional comprising: a first dielectric layer over at least a portion of the surface; a first metallic layer over at least a portion of the first dielectric layer; a first primer layer over at least a portion of the first metallic layer; a second dielectric layer over at least a portion of the first primer layer; a second metallic layer over at least a portion of the second dielectric layer; a second primer layer over at least a portion of the second metallic layer; a third dielectric layer over at least a portion of the second primer layer; a third metallic layer over at least a portion of the third dielectric layer; a third primer layer over at least a portion of the third metallic layer; and a fourth dielectric layer over at least a portion of the third primer layer; wherein the coated substrate has a visible light reflectance of not more than 10%.

Clause 66. The coated article according to clause 65, wherein the coating further comprises: a fourth metallic layer over at least a portion of the fourth dielectric layer; a fourth primer layer over at least a portion of the fourth metallic layer; and a fifth dielectric layer over at least a portion of the fourth primer layer.

Clause 67. The coated article according to clause 65 or 66, wherein the coated substrate has a visible light reflectance of not more than 8%.

Clause 68. The coated article according to any of clauses 65-67, wherein the coated article has a visible light transmittance of at least 70%.

Clause 69. The coated article according to any of clauses 65-68, wherein at least one of the metallic layers comprises at least one of silver, copper, gold, aluminum, mixtures thereof, or alloys thereof.

Clause 70. The coated article according to any of clauses 65-69, wherein at least one of the dielectric layers comprises at least one of a zinc stannate layer, a zinc oxide layer, a silicon nitride layer, or mixtures thereof.

Clause 71. The coated article according to any of clauses 65-70, further comprising an outermost protective coating comprising a protective layer, wherein the protective layer comprises at least one of $Si_3N_4$, SiAlN, SiAlON, titania, alumina, silica, zirconia, alloys thereof, or mixtures thereof.

Clause 72. The coated article according to any of clauses 65-71, wherein at least one of the primer layers is selected from titanium, cobalt, silicon, zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, and alloys thereof, where the primer is deposited as a metal and may be subsequently oxidized.

The following Examples illustrate various embodiments of the invention. However, it is to be understood that the invention is not limited to these specific embodiments.

EXAMPLES

Example 1

As mentioned previously, the sheet resistance of the coating can be reduced by using new materials for individual layers. It is expected that the sheet resistance will also decrease with the addition of new layers all together. In Table 9, $Ti_{78}Nb_{22}$ was integrated into the stack as a replacement for the Ti primer layer. Ag with oxygen deposition was also included as a seed film under the silver metallic layer. The substrate is a clear glass substrate. ZT stands for zinc tin, also known as zinc stannate. Zn 90 is tin-doped zinc oxide deposited from a cathode with 10 wt. % tin and 90 wt. % zinc in the presence of oxygen (i.e., ZnO 90/10). Ag means silver. PPO is the protective layer or coating discussed above. Before integrating these layers, each layer had been optimized to get lowest sheet resistance. In following tables list the best samples at different combinations.

TABLE 9

| samples | AgOx seed layer and Ti78Nb22 metal primer structure | Sheet resistance AH ($\Omega/\square$) |
|---|---|---|
| baseline, Ti primer | glass/ZT/Zn90/Ag/Ti/Zn90/ZT/ppo | 5.32 |
| Ti78Nb22 primer | glass/ZT/Zn90/Ag/Ti78Nb22/Zn90/ZT/ppo | 3.87 |
| Baseline with AgOx inserted | glass/ZT/Zn90/AgOx/Ag/Ti/Zn90/ZT/ppo | 4.52 |

TABLE 9-continued

| samples | AgOx seed layer and Ti78Nb22 metal primer structure | Sheet resistance AH ($\Omega/\square$) |
|---|---|---|
| with both AgOX seed and Ti78Nb22 primer | glass/ZT/Zn90/AgOx/Ag/Ti78Nb22/Zn90/ZT/ppo | 3.25 |

Additional coating stacks were also test that inserted $Ti_{78}Nb_{22}O_x$ under the protective layer as the stress layer discussed previously. Three total layers changed from the baseline to the final coating stack. Values for its sheet resistance can be seen in Table 10.

The addition of a stress layer under the protective layer may result in further decrease in sheet resistance of the coating stack. Various additional materials were tested for use as the stress layer. Some of those materials are shown in

TABLE 10

| samples | AgOx seed layer, Ti78Nb22 metal primer and Ti78Nb22Ox under ppo structure | Sheet resistance AH ($\Omega/\square$) |
|---|---|---|
| baseline, Ti primer | glass/ZT/Zn90/Ag/Ti/Zn90/ZT/ppo | 4.65 |
| Ti78Nb22 primer, Ti78Nb22Ox inserted | glass/ZT/Zn90/Ag/Ti78Nb22/Zn90/ZT/Ti78Nb22Ox/ppo | 4.12 |
| AgOx, Ti78Nb22 primer, TiNb22Ox underppo | glass/ZT/Zn90/AgOx/Ag/Ti78Nb22/Zn90/ZT/Ti78Nb22Ox/ppo | 3.07 |

Table 11 replaces the Ti primer layer or the Ti78Nb22 primer layer with Ti3Nb97Nx or titanium niobium nitride.

Table 14 and show the decrease in sheet resistance of the inclusion of these materials as the stress layer.

TABLE 11

| samples | structure | Rs, AH ($\Omega/\square$) | $\Delta$Rs/Rs (%) |
|---|---|---|---|
| Baseline Ti primer | single silver (glass/ZT/Zn90/Ag/Ti/Zn90ZT/PPO) | 4.97 | |
| Ti3Nb97 nitride primer | single silver (glass/ZT/Zn90/Ag/Ti3Nb97Nx/Zn90ZT/PPO) | 3.71 | −25.3 |
| Ti3Nb97 oxide under ppo | single silver (glass/ZT/Zn90/Ag/Ti/Zn90/ZT/Ti3Nb97Ox/PPO) | 4.18 | −15.8 |
| AgOx seed + Ti3Nb97 nitride primer | single silver (glass/ZT/Zn90/AgOx/Ag/TiNb97Nx/Zn90ZT/PPO) | 3.34 | −32.7 |

Table 12 shows coating stack experiments with aluminum zinc primer and aluminum zinc oxide above and below the silver layer as part of the dielectric layer. Sheet resistance is decreased from 3.75 to 3.21$\Omega/\square$ for single silver stack.

TABLE 12

| Primer [nm] | bot-AZO (nm) | Ag (nm) | top-AZO (nm) | Rs BH | Rs AH |
|---|---|---|---|---|---|
| Baseline | — | 11.20 | | 7.24 | 3.75 |
| 4.1 | — | 11.20 | | 7.08 | 3.32 |
| 6.1 | 5 | 11.20 | 5 | 7.87 | 3.21 |

Table 13 shows coating stack experiments with aluminum zinc primer and aluminum zinc oxide above and below the silver layer. Sheet resistance is decreased from 1 to 0.73$\Omega/\square$ for triple silver stack with AZ primers and Ag oxygen deposition seed film between Ag and $Zn_{90}Sn_{10}O$.

TABLE 13

| Structure | Rs (BH) ($\Omega/\square$) | Rs (AH) ($\Omega/\square$) | Haze level | LTA (laminated) |
|---|---|---|---|---|
| Baseline | 1.44 | 1.00 | 10 | 68.74 |
| AZ primers | 1.58 | 0.81 | 10 | 75.6 |
| AZ primers, 0.5 nm AgOx seed under each silver layer | 1.65 | 0.78 | 8 | 70.53 |
| AZ primers, 1.0 nm AgOx seed under each silver layer | 1.48 | 0.74 | 8 | 70.31 |
| AZ primers, 1.5 nm AgOx seed under each silver layer | 1.58 | 0.73 | 7 | 70.17 |

TABLE 14

| Stress Layer | Thickness (nm) | % O2 | $\Delta$Rs/Rs AH (Max %) |
|---|---|---|---|
| TiNbOx (suboxide) | ~14 on Ti side | 20 | −27% |
| ZrNbOx (suboxide) | ~5 on Nb side | 10 | −23% |
| TaTiOx (suboxide) | ~5 on Nb side | 10 | −21% |

Experiments were conducted in which the films of the dielectric layers that surround the metallic layers are replaced with VZnO (vanadium zinc oxide). The top film of the dielectric layer directly below the metallic layer was replaced and the bottom film of the dielectric layer directly above the metallic layer was replaced. These were paired with both Ti primer layers and zinc metal primer layers. The results of these experiments are shown in Table 15 below.

TABLE 15

| | Primer | wt % [V] | Bottom dielectric layer | Top dielectric layer | Rs (Ω/□) | LTA (%) |
|---|---|---|---|---|---|---|
| Baseline | Ti | 0 | Zn90 | Zn90 | 5.67 | 83.4 |
| ZnO | Ti | 0 | ZnO | ZnO | 4.58 | 82.7 |
| VZnO | Ti | 0.45 | VZnO | VZnO | 4.52 | 83 |
| Zn90 | Zn | 0 | Zn90 | Zn90 | 3.62 | 86.5 |
| ZnO | Zn | 0 | ZnO | ZnO | 3.12 | 82.4 |
| VZnO | Zn | 0.45 | VZnO | VZnO | 3.14 | 89.1 |

Example 2

Tables 16 and 17 show exemplary coatings of the invention. The reported thicknesses are geometric thicknesses in angstroms (Å). The substrate is a clear glass substrate with a thickness of 2.1 mm. ZS means zinc stannate deposited from a cathode having 52 wt. % zinc and 48 wt. % tin in the presence of oxygen. TZO means tin doped zinc oxide deposited from a cathode with 10 wt. % tin and 90 wt. % zinc in the presence of oxygen (i.e., ZnO 90/10). Ag means silver. $TiO_x$ means a titanium primer layer deposited as a metal and oxidized during processing.

TABLE 16

| | Sample | | | |
|---|---|---|---|---|
| Glass | 1 | 2 | 3 | 4 |
| ZS/TZO | 472 | 471 | 480 | 472 |
| Ag | 121 | 137 | 139 | 113 |
| Ti | 20-40 | 20-40 | 20-40 | 20-40 |
| TZO/ZS/TZO | 725 | 777 | 795 | 724 |
| Ag | 133 | 139 | 131 | 132 |
| Ti | 20-40 | 20-40 | 20-40 | 20-40 |
| TZO/ZS/TZO | 789 | 761 | 717 | 815 |
| Ag | 142 | 129 | 117 | 141 |
| Ti | 20-40 | 20-40 | 20-40 | 20-40 |

TABLE 16-continued

| | Sample | | | |
|---|---|---|---|---|
| Glass | 1 | 2 | 3 | 4 |
| TZO/ZS | 366 | 379 | 364 | 389 |
| $Si_{60}Al_{40}Ox$ | 200 | 160 | 200 | 200 |
| $Si_{85}Al_{15}Ox$ | 350 | 220 | 350 | 300 |

TABLE 17

| | Sample | | | | |
|---|---|---|---|---|---|
| Glass | 5 | 6 | 7 | 8 | 9 |
| ZS/TZO | 463 | 458 | 459 | 436 | 423 |
| Ag | 97 | 98 | 98 | 98 | 96 |
| Ti | 20-40 | 20-40 | 20-40 | 20-40 | 20-40 |
| TZO/ZS/TZO | 846 | 825 | 820 | 807 | 795 |
| Ag | 128 | 128 | 129 | 123 | 119 |
| Ti | 20-40 | 20-40 | 20-40 | 20-40 | 20-40 |
| TZO/ZS/TZO | 758 | 755 | 752 | 733 | 736 |
| Ag | 119 | 123 | 124 | 122 | 127 |
| Ti | 20-40 | 20-40 | 20-40 | 20-40 | 20-40 |
| TZO/ZS/TZO | 701 | 699 | 695 | 702 | 698 |
| Ag | 105 | 105 | 105 | 107 | 93 |
| Ti | 20-40 | 20-40 | 20-40 | 20-40 | 20-40 |
| TZO/ZS | 448 | 454 | 353 | 451 | 435 |
| $Si_{40}Al_{60}Ox$ | 160 | 160 | 160 | 160 | 160 |
| $Si_{85}Al_{15}Ox$ | 220 | 220 | 220 | 220 | 220 |

Tables 18-22 show spectral properties for the Samples of Tables 16 and 17.

TABLE 18

| Sample | LTA | Ta* | Tb* | Rg8 SOS | Rf8 SOS | Rg60 SOS | Rf60 SOS | T solar | R1 solar | R2 solar | Rs | Solar factor |
|---|---|---|---|---|---|---|---|---|---|---|---|---|
| 1 | 70.34 | −1.28 | 2.72 | 1.99 | 1.74 | 1.39 | 1.61 | 31.03 | 41.85 | 43.88 | 0.808 | 0.364 |
| 2 | 70.82 | −2.49 | 3.45 | 2.81 | 3.02 | 1.52 | 1.30 | 30.99 | 41.32 | 44.58 | 0.789 | 0.362 |
| 3 | 71.21 | −1.11 | 4.10 | 1.65 | 1.77 | 1.77 | 1.25 | 31.66 | 40.30 | 44.21 | 0.831 | 0.368 |
| 4 | 71.52 | −1.55 | 4.45 | 2.44 | 2.07 | 1.37 | 1.60 | 32.03 | 44.21 | 43.19 | 0.831 | 0.372 |

TABLE 19

| Sample | Rg8L* | Rg8a* | Rg8b* | Rg45L* | Rg45a* | Rg45b* | Rg60L* | Rg60a* | Rg60b* |
|---|---|---|---|---|---|---|---|---|---|
| 1 | 41.02 | −6.35 | 0.51 | 42.03 | −4.24 | 3.35 | 49.28 | −0.88 | 4.03 |
| 2 | 40.60 | −2.20 | −4.20 | 41.89 | −1.99 | 1.49 | 49.30 | 0.59 | 3.01 |
| 3 | 42.49 | −8.07 | −3.17 | 42.91 | −4.90 | −1.99 | 49.79 | −1.17 | −0.21 |
| 4 | 41.09 | −4.04 | −4.92 | 41.78 | −3.77 | −0.82 | 48.98 | −1.19 | 1.34 |

TABLE 20

| Sample | Rf8L* | Rf8a* | Rf8b* | Rf45L* | Rf45a* | Rf45b* | Rf60L* | Rf60a* | Rf60b* |
|---|---|---|---|---|---|---|---|---|---|
| 1 | 42.71 | -8.55 | 1.50 | 43.46 | -5.88 | 2.82 | 50.32 | -1.72 | 3.13 |
| 2 | 40.56 | -2.46 | -1.86 | 41.96 | -3.36 | 4.18 | 49.37 | -0.89 | 5.08 |
| 3 | 41.68 | -7.14 | 0.20 | 42.42 | -5.61 | 2.40 | 49.49 | -2.47 | 3.52 |
| 4 | 42.87 | -6.86 | -3.53 | 43.24 | -5.66 | -1.30 | 50.00 | -2.07 | 0.29 |

TABLE 21

| Sample | LTA | TL* | Ta* | Tb* | Rg8 SOS | Rg60 SOS | T solar | R1 solar | R2 solar | Rs |
|---|---|---|---|---|---|---|---|---|---|---|
| 5 | 71.20 | 87.45 | -2.26 | 4.94 | 2.31 | 1.10 | 33.66 | 35.41 | 38.04 | 0.704 |
| 6 | 71.28 | 87.57 | -2.69 | 4.64 | 2.30 | 1.01 | 33.24 | 35.81 | 38.43 | 0.694 |
| 7 | 71.24 | 87.56 | -2.82 | 4.65 | 2.17 | 0.98 | 32.99 | 36.01 | 38.70 | 0.690 |
| 8 | 71.06 | 87.42 | -2.18 | 4.21 | 1.71 | 1.01 | 33.14 | 35.89 | 38.38 | 0.699 |
| 9 | 71.34 | 87.67 | -2.74 | 3.88 | 2.18 | 0.84 | 33.66 | 35.13 | 37.96 | 0.731 |

TABLE 22

| Sample | Rg8L* | Rg8a* | Rg8b* | Rf8L* | Rf8a* | Rf8b* |
|---|---|---|---|---|---|---|
| 5 | 36.64 | -4.54 | -6.97 | 36.13 | -4.17 | -3.62 |
| 6 | 35.34 | -2.88 | -6.30 | 35.06 | -2.77 | -3.49 |
| 7 | 35.04 | -2.58 | -6.39 | 34.75 | -2.51 | -3.38 |
| 8 | 35.67 | -6.43 | -2.03 | 35.46 | -6.08 | -0.45 |
| 9 | 35.01 | -1.74 | -1.37 | 34.78 | -3.00 | -1.05 |

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A coated article comprising:

a substrate;

a first dielectric layer over at least a portion of the substrate;

a first metallic layer comprising silver over at least a portion of the first dielectric layer, wherein the first metallic layer has a thickness of at least 90 Å and at most 140 Å;

a first primer layer comprising titanium over at least a portion of the first metallic layer;

a second dielectric layer over at least a portion of the first primer layer, wherein the second dielectric layer comprises a zinc stannate film;

a second metallic layer comprising silver over at least a portion of the second dielectric layer, wherein the second metallic layer has a thickness of at least 100 Å and at most 150 Å;

a second primer layer comprising titanium over at least a portion of the second metallic layer;

a third dielectric layer over at least a portion of the second primer layer, wherein the third dielectric layer comprises a zinc stannate film;

a third metallic layer comprising silver over at least a portion of the third dielectric layer, wherein the third metallic layer has a thickness of at least 90 Å and at most 150 Å;

a third primer layer comprising titanium over at least a portion of the third metallic layer; and a fourth dielectric layer over at least a portion of the third primer layer, wherein the fourth dielectric layer comprises a zinc stannate film;

wherein the coated article consists of three silver metallic layers;

wherein a total combined thickness of the three silver metallic layers is at least 38 nanometers, and no more than 42 nanometers; and wherein the coated article having three silver metallic layers has a sheet resistance of not more than 0.85Ω/□ and a visible light transmittance of at least 70%.

2. The coated article according to claim 1, further comprising an outermost protective coating.

3. The coated article according to claim 1, wherein each titanium primer is deposited as a metal and subsequently oxidized.

4. The coated article according to claim 1, wherein the sheet resistance is not more 0.7 Ω/□.

5. The coated article according to claim 1, wherein the coated article has a visible light transmittance above 70.5%.

6. The coated article of claim 1, wherein the first dielectric layer comprises a zinc stannate film over at least the portion of the substrate, and a second film comprising zinc oxide over at least a portion of the zinc stannate film.

7. The coated article of claim 1, wherein the second dielectric layer comprises a first zinc oxide film, the zinc stannate film over at least a portion of the first zinc oxide film, and a second film or over at least a portion of the zinc stannate film, wherein the second film comprises zinc oxide, silicon nitride, silicon oxynitrides, or a combination thereof.

8. The coated article of claim 1, wherein the third dielectric layer comprises a first zinc oxide film, the zinc stannate film over at least a portion of the first zinc oxide film, and a second film or over at least a portion of the zinc stannate film, wherein the second film comprises zinc oxide, silicon nitride, silicon oxynitrides, or a combination thereof.

9. The coated article of claim 1, wherein the fourth dielectric layer comprises a second film comprising zinc oxide over at least a portion of the zinc stannate film.

10. A coated article comprising:

a first substrate comprising a first surface and a second surface;

a second substrate over at least a portion of the first substrate, comprising a third surface and a fourth surface, wherein the second surface is disposed facing the third surface, and wherein the second and third surfaces are separated by an interlayer; and a functional coating deposited over either the second or the third surface, the functional coating comprising:

a first dielectric layer over at least a portion of the surface;

a first metallic layer comprising silver over at least a portion of the first dielectric layer, wherein the first metallic layer has a thickness of at least 90 Å and at most 140 Å;

a first primer layer comprising titanium over at least a portion of the first metallic layer;

a second dielectric layer over at least a portion of the first primer layer, wherein the second dielectric layer comprises a zinc stannate film;

a second metallic layer comprising silver over at least a portion of the second dielectric layer, wherein the second metallic layer has a thickness of at least 100 Å and at most 150 Å;

a second primer layer comprising titanium over at least a portion of the second metallic layer;

a third dielectric layer over at least a portion of the second primer layer, wherein the third dielectric layer comprises a zinc stannate film;

a third metallic layer comprising silver over at least a portion of the third dielectric layer, wherein the third metallic layer has a thickness of at least 90 Å and at most 150 Å;

a third primer layer comprising titanium over at least a portion of the third metallic layer; and a fourth dielectric layer over at least a portion of the third primer layer, wherein the fourth dielectric layer comprises a zinc stannate film;

wherein the coated article consists of three silver metallic layers;

wherein a total combined thickness of the three silver metallic layers is at least 38 nanometers, and no more than 42 nanometers; and wherein the coated article having three silver metallic layers has a sheet resistance of not more than $0.85\Omega/\square$ and a visible light transmittance of at least 70%.

11. The coated article according to claim 10, wherein the coated article has a visible light reflectance of not more than 20%.

12. The coated article according to claim 10, further comprising an outermost protective coating.

13. The coated article according to claim 10, wherein each titanium primer is deposited as a metal and subsequently oxidized.

* * * * *